(12) United States Patent
Ferrara et al.

(10) Patent No.: US 12,161,001 B2
(45) Date of Patent: Dec. 3, 2024

(54) LIGHT DETECTING ELEMENT

(71) Applicant: SUMITOMO CHEMICAL COMPANY, LIMITED, Tokyo (JP)

(72) Inventors: Giovanni Ferrara, Tsukuba (JP); Takahiro Seike, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 818 days.

(21) Appl. No.: 17/264,227

(22) PCT Filed: Jul. 26, 2019

(86) PCT No.: PCT/JP2019/029402
§ 371 (c)(1),
(2) Date: Jan. 28, 2021

(87) PCT Pub. No.: WO2020/026974
PCT Pub. Date: Feb. 6, 2020

(65) Prior Publication Data
US 2021/0305523 A1  Sep. 30, 2021

(30) Foreign Application Priority Data
Aug. 1, 2018 (JP) ................................. 2018-145298

(51) Int. Cl.
*H10K 30/30* (2023.01)
*C01B 32/156* (2017.01)
(Continued)

(52) U.S. Cl.
CPC ........... *H10K 30/30* (2023.02); *C01B 32/156* (2017.08); *G06V 40/1318* (2022.01);
(Continued)

(58) Field of Classification Search
CPC ...... H10K 30/30; H10K 39/32; H10K 85/215; C01B 32/156; C01P 2006/40
See application file for complete search history.

(56) References Cited

U.S. PATENT DOCUMENTS 9,484,537 B2 * 11/2016 Liang .................... H10K 71/30
2010/0089452 A1 * 4/2010 Suzuki ................. H10K 30/211
136/263
(Continued)

FOREIGN PATENT DOCUMENTS

JP      2012-015390 A    1/2012
WO     WO-2017/115646 A1  7/2017
(Continued)

OTHER PUBLICATIONS

Machine Translation of WO-2017126401-A1 (Year: 2017).*
(Continued)

*Primary Examiner* — Yara B Green
*Assistant Examiner* — Fakeha Sehar
(74) *Attorney, Agent, or Firm* — Foley & Lardner LLP

(57) ABSTRACT

This light detecting element has a reduced dark current and improved external quantum efficiency. The light detecting element includes a positive electrode, a negative electrode, and an active layer that is provided between said positive electrode and said negative electrode, and that contains a p-type semiconductor material and an n-type semiconductor material. The thickness of the active layer is at least 800 nm. The value obtained by subtracting the absolute value of the LUMO of the n-type semiconductor material from the work function of the surface in contact with the negative electrode side surface of the active layer is 0.0 to 0.5 eV. The absolute value of the LUMO of the n-type semiconductor material is 2.0 to 10.0 eV.

14 Claims, 24 Drawing Sheets

(51) Int. Cl.
*G06V 40/13* (2022.01)
*H10K 39/32* (2023.01)
*H10K 85/20* (2023.01)

(52) U.S. Cl.
CPC .......... *H10K 39/32* (2023.02); *C01P 2006/40* (2013.01); *H10K 85/215* (2023.02)

(56) References Cited

U.S. PATENT DOCUMENTS

| | | | | |
|---|---|---|---|---|
| 2013/0255780 A1* | 10/2013 | Iwanaga | ................ | H10K 30/30 252/500 |
| 2013/0291944 A1* | 11/2013 | Takagi | ................... | C08K 3/045 252/500 |
| 2014/0202517 A1 | 7/2014 | Kippelen et al. | | |

FOREIGN PATENT DOCUMENTS

| WO | WO-2017126401 A1 * | 7/2017 | ........... C08G 61/126 |
|---|---|---|---|
| WO | WO-2018/131638 A1 | 7/2018 | |

OTHER PUBLICATIONS

Japanese Office Action dated Mar. 8, 2022 issued in corresponding Japanese Patent Application No. JP2018-145298.

Ng. T. N. et al. "Flexible image sensor array with bulk heterojunction organic photodiode," Applied Physics Letters, May 28, 2008, vol. 92, pp. 213303-1-213303-3.

International Searching Authority, "International Search Report," issued in connection with International Patent Application No. PCT/JP2019/029402, dated Oct. 8, 2019.

International Searching Authority, "Written Opinion," issued in connection with International Patent Application No. PCT/JP2019/029402, dated Oct. 8, 2019.

Keivanidis et al., "The Dependence of Device Dark Current on the Active-Layer Morphology of Solution-Processed Organic Photodetectors," Advanced Functional Materials, vol. 20, Issue 22, 2010, pp. 3895-3903.

Ng et al., "Flexible image sensor array with bulk heterojunction organic photodiode," Applied Physics Letters, vol. 92, Issue 21, 2008, pp. 213303-1 to 213303-3.

Chochos et al., "Rational design on n-type organic materials for high performance organic photovoltaics", RSC Advances, vol. 3, Jan. 17, 2013, pp. 7160-7181.

Feng et al., "n-Type Organic and Polymeric Semiconductors Based on Bithiophene Imide Derivatives", Accounts of Chemical Research, vol. 54, Oct. 7, 2021, pp. 3804-3817.

Griggs et al., "n-Type organic semiconducting polymers: stability limitations, design considerations and applications", Journal of Materials Chemistry C, vol. 9, Jun. 10, 2021, pp. 8099-8128.

Nielsen et al., "Non-Fullerene Electron Acceptors for Use in Organic Solar Cells", Accounts of Chemical Research, vol. 48, Oct. 27, 2015, pp. 2803-2812.

* cited by examiner

Film thickness of active layer (nm)

-o- EQE_Examples 1 to 7 and 48, Comparative Example 1

-●- Jd_Examples 1 to 7 and 48, Comparative Example 1

LIGHT DETECTING ELEMENT

CROSS-REFERENCE TO RELATED APPLICATIONS

The present application claims priority under 37 U.S.C. § 371 to International Patent Application No. PCT/JP2019/029402, filed Jul. 26, 2019, which claims priority to and the benefit of Japanese Patent Application No. 2018-145298, filed on Aug. 1, 2018. The contents of these applications are hereby incorporated by reference in their entireties.

TECHNICAL FIELD

The present invention relates to a photoelectric conversion element, particularly a light detecting element, an image sensor, and a fingerprint authenticating device.

BACKGROUND ART

The photoelectric conversion element has been attracting attention as a very useful device from the viewpoint of energy saving and reduction of carbon dioxide emissions, for example.

The photoelectric conversion element includes at least a pair of electrodes including a positive electrode and a negative electrode, and an active layer provided between the pair of electrodes. In the photoelectric conversion element, one of the electrodes is made of a transparent or translucent material, and light is incident on the active layer from the transparent or translucent electrode side. The energy (hv) of light incident on the active layer generates electric charges (holes and electrons) in the active layer, the generated holes move toward the positive electrode, and the electrons move toward the negative electrode. Then, the electric charges that have reached the positive electrode and the negative electrode are taken out of the photoelectric conversion element via the electrodes.

Among the photoelectric conversion elements, particularly, a light detecting element has been used in an image sensor, various biometric authentication devices, and the like, and requires high detection sensitivity characteristics depending on the application, and thus various studies have been conducted in recent years.

In a case where the photoelectric conversion element is used as a light detecting element, in order to obtain the high detection sensitivity characteristics as a light detecting element, it is required to reduce a dark current (current generated in absence of light) and improve the external quantum efficiency (EQE).

It has been reported that the dark current can be reduced by increasing a thickness (film thickness) of an active layer in the light detecting element (Non-Patent Document 1).

PRIOR ART DOCUMENTS

Non-Patent Document

Non-Patent Document 1: Adv. Funct. Mater. 2010, 20, 3895-3903

SUMMARY OF THE INVENTION

Problems to be Solved by the Invention

In order to obtain high detection sensitivity characteristics, there is a demand for a light detecting element having a reduced dark current and improved external quantum efficiency. However, in the related art, when the thickness of the active layer of the light detecting element is increased, the external quantum efficiency tends to decrease. Therefore, there has been a problem in that it is difficult to obtain a light detecting element having excellent characteristics of both dark current and external quantum efficiency.

Means for Solving the Problems

As a result of diligent research to solve the above problems, the present inventors have found that a value obtained by subtracting the absolute value of the lowest unoccupied molecular orbital (LUMO) of an n-type semiconductor in an active layer from a work function (WF) of the surface of a light detecting element in contact with a negative electrode side surface of an active layer is set as a predetermined range, high external quantum efficiency can be maintained even if a thickness of an active layer is increased, and have completed the present invention. That is, the present invention provides the following [1] to [14].

[1] A light detecting element including a positive electrode, a negative electrode, and an active layer provided between the positive electrode and the negative electrode and containing a p-type semiconductor material and an n-type semiconductor material,
wherein a thickness of the active layer is 800 nm or more, and
a value obtained by subtracting an absolute value of LUMO of the n-type semiconductor material from a work function of a surface of the active layer in contact with a negative electrode side surface is 0.0 to 0.5 eV.

[2] The light detecting element according to [1], wherein the n-type semiconductor material has an absolute value of LUMO of 2.0 to 10.0 eV.

[3] The light detecting element according to [1] or [2], wherein the n-type semiconductor material is a fullerene derivative.

[4] The light detecting element according to [3], wherein the fullerene derivative is C60PCBM, bisC60PCBM, C70IPH, or C70PCBM.

[5] The light detecting element according to any one of [1] to [4], wherein the work function of the surface of the active layer in contact with the negative electrode side surface is 2.0 to 10.0 eV.

[6] The light detecting element according to any one of [1] to [5], wherein an electron transport layer is included between the negative electrode and the active layer, and the surface of the active layer in contact with the negative electrode side surface is a surface of the electron transport layer.

[7] The light detecting element according to [6], wherein the electron transport layer contains a metal oxide, a metal hydroxide, or a metal alkoxide.

[8] The light detecting element according to [7], wherein the electron transport layer contains the metal oxide containing zinc or titanium, the metal hydroxide containing zinc or titanium, or the metal alkoxide containing zinc or titanium.

[9] The light detecting element according to [6], wherein the electron transport layer contains a compound having an alkylene structure.

[10] The light detecting element according to [9], wherein the compound having an alkylene structure is polyalkyleneimine or a derivative thereof.

[11] The light detecting element according to [10], wherein the polyalkyleneimine or the derivative thereof is polyethyleneimine or a derivative thereof.

[12] The light detecting element according to any one of [1] to [5], wherein the negative electrode and the active layer are in direct contact with each other, and the surface of the active layer in contact with the negative electrode side surface is a surface of the negative electrode.

[13] An image sensor including the light detecting element according to any one of [1] to [12].

[14] A fingerprint authenticating device including a fingerprint detector including the light detecting element according to any one of [1] to [12].

Effect of the Invention

According to the present invention, it is possible to provide a light detecting element having a reduced dark current and improved external quantum efficiency.

MODE FOR CARRYING OUT THE INVENTION

Figure 1:
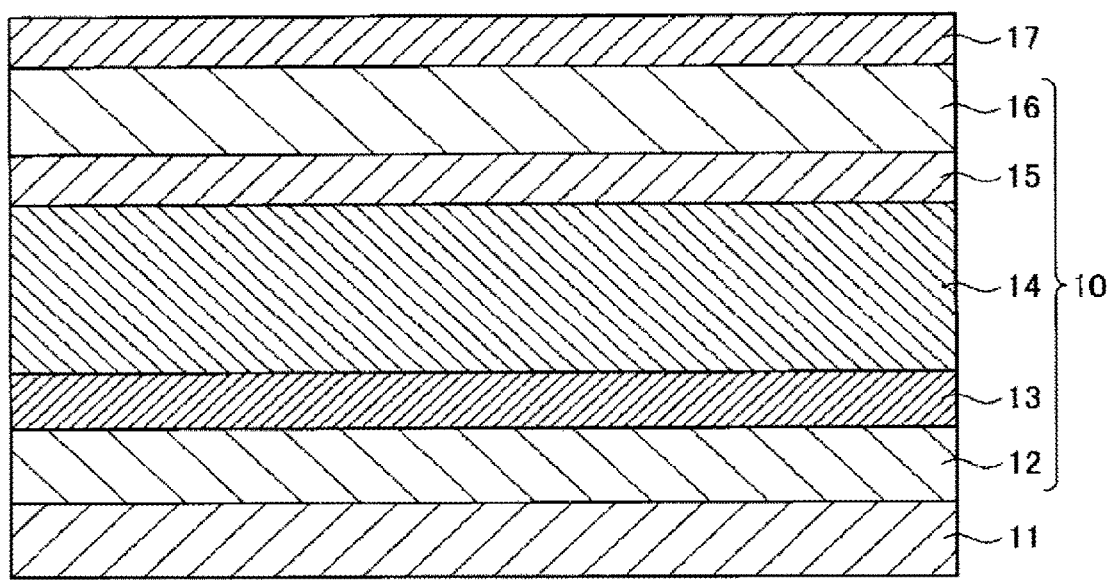
FIG. 1 is a diagram schematically illustrating a photoelectric conversion element (light detecting element).

Hereinafter, a photoelectric conversion element according to an embodiment of the present invention will be described with reference to the drawings. Note that the drawings merely outline the shapes, sizes, and arrangements of components to the extent that the invention can be understood. The present invention is not limited to the following description, and each component can be appropriately modified without departing from the gist of the present invention. Further, in the configuration according to the embodiment of the present invention, it is not always produced or used in the arrangement illustrated in the drawings. In each of the drawings described below, the same components may be given the same sign and the description thereof may be omitted.

Here, first, terms commonly used in the following description will be described.

The "polymer compound" means a polymer having a molecular weight distribution and having a polystyrene-equivalent number average molecular weight of $1\times10^3$ or more and $1\times10^8$ or less. Constituent units contained in the polymer compound are 100 mol % in total.

The "constituent unit" means a unit existing in one or more in a polymer compound.

A "hydrogen atom" may be a light hydrogen atom or a deuterium atom.

A "halogen atom" includes a fluorine atom, a chlorine atom, a bromine atom, and an iodine atom.

The meaning of "may have a substituent" includes a case where all the hydrogen atoms constituting the compound or group are unsubstituted, and a case where some or all of one or more hydrogen atoms are substituted by the substituent.

Unless otherwise specified, the "alkyl group" may be linear, branched, or cyclic. The number of carbon atoms of the linear alkyl group is usually 1 to 50, preferably 1 to 30, and more preferably 1 to 20 without including the number of carbon atoms of the substituent. The number of carbon atoms of a branched or cyclic alkyl group is usually 3 to 50, preferably 3 to 30, and more preferably 4 to 20 without including the number of carbon atoms of the substituent.

The alkyl group may have a substituent. Specific examples of the alkyl group include an alkyl group such as a methyl group, an ethyl group, an n-propyl group, an isopropyl group, an n-butyl group, an isobutyl group, a tert-butyl group, an n-pentyl group, an isoamyl group, a 2-ethylbutyl group, an n-hexyl group, a cyclohexyl group, an n-heptyl group, a cyclohexylmethyl group, a cyclohexylethyl group, an n-octyl group, a 2-ethylhexyl group, a 3-n-propylheptyl group, an adamantyl group, an n-decyl group, a 3,7-dimethyloctyl group, a 2-ethyloctyl group, a 2-n-hexyl-decyl group, an n-dodecyl group, a tetradecyl group, a hexadecyl group, an octadecyl group, and an eicosyl group; and an alkyl group having a substituent such as a trifluoromethyl group, a pentafluoroethyl group, a perfluorobutyl group, a perfluorohexyl group, a perfluorooctyl group, a 3-phenylpropyl group, a 3-(4-methylphenyl) propyl group, a 3-(3,5-di-n-hexylphenyl) propyl group, and a 6-ethyloxyhexyl group.

An "aryl group" means a remaining atomic group obtained by removing one hydrogen atom directly bonded to a carbon atom constituting a ring from an aromatic hydrocarbon which may have a substituent.

The aryl group may have a substituent. Specific examples of the aryl group include a phenyl group, a 1-naphthyl group, a 2-naphthyl group, a 1-anthrasenyl group, a 2-anthrasenyl group, a 9-anthrasenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and a group having a substituent such as an alkyl group, an alkoxy group, an aryl group, and a fluorine atom.

An "alkoxy group" may be linear, branched, or cyclic. The number of carbon atoms of the linear alkoxy group is usually 1 to 40 and preferably 1 to 10 without including the number of carbon atoms of the substituent. The number of carbon atoms of the branched or cyclic alkoxy group is usually 3 to 40 and preferably 4 to 10 without including the number of carbon atoms of the substituent.

The alkoxy group may have a substituent. Specific examples of the alkoxy group include a methoxy group, an ethoxy group, an n-propyloxy group, an isopropyloxy group, an n-butyloxy group, an isobutyloxy group, a tert-butyloxy group, an n-pentyloxy group, an n-hexyloxy group, a cyclohexyloxy group, an n-heptyloxy group, an n-octyloxy group, a 2-ethylhexyloxy group, an n-nonyloxy group, an n-decyloxy group, a 3,7-dimethyloctyloxy group, and a lauryloxy group.

The number of carbon atoms of the "aryloxy group" is usually 6 to 60 and preferably 6 to 48 without including the number of carbon atoms of the substituent.

The aryloxy group may have a substituent. Specific examples of the aryloxy group include a phenoxy group, a 1-naphthyloxy group, a 2-naphthyloxy group, a 1-anthrasenyloxy group, a 9-anthrasenyloxy group, a 1-pyrenyloxy group, and a group having a substituent such as an alkyl group, an alkoxy group, and a fluorine atom.

An "alkylthio group" may be linear, branched, or cyclic. The number of carbon atoms of the linear alkylthio group is usually 1 to 40 and preferably 1 to 10 without including the number of carbon atoms of the substituent. The number of carbon atoms of the branched and cyclic alkylthio groups is usually 3 to 40 and preferably 4 to 10 without including the number of carbon atoms of the substituent.

The alkylthio group may have a substituent. Specific examples of the alkylthio group include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, and a trifluoromethylthio group.

The number of carbon atoms of an "arylthio group" is usually 6 to 60 and preferably 6 to 48 without including the number of carbon atoms of the substituent.

The arylthio group may have a substituent. Examples of the arylthio group include a phenylthio group and a C1 to C12 alkyloxyphenylthio group (here, "C1 to C12" indicates that the group to be described immediately after that has 1 to 12 carbon atoms. The same applies to the following.), a C1 to C12 alkylphenylthio group, a 1-naphthylthio group, a 2-naphthylthio group, and a pentafluorophenylthio group.

A "p-valent heterocyclic group" (p represents an integer of 1 or more) means a remaining atomic group excluding p hydrogen atoms among the hydrogen atoms directly bonded to a carbon atom or a hetero atom constituting a ring from a heterocyclic compound that may have a substituent. Among the p-valent heterocyclic groups, a "p-valent aromatic heterocyclic group" is preferable. The "p-valent aromatic heterocyclic group" means a remaining atomic group excluding p hydrogen atoms among the hydrogen atoms directly bonded to a carbon atom or a hetero atom constituting a ring from an aromatic heterocyclic compound that may have a substituent.

Examples of the substituent that the heterocyclic compound may have include a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acidimide group, a substituted oxycarbonyl group, an alkenyl group, an alkynyl group, a cyano group, and a nitro group.

Examples of the aromatic heterocyclic compound include a compound in which an aromatic ring is fused to the heterocycle even if the heterocycle itself does not exhibit aromaticity in addition to the compound in which the heterocycle itself exhibits aromaticity.

Among the aromatic heterocyclic compounds, specific examples of the compound in which the heterocycle itself exhibits aromaticity include oxadiazole, thiadiazole, thiazole, oxazol, thiophene, pyrrole, phosphole, furan, pyridine, pyrazine, pyrimidine, triazine, pyridazine, quinoline, isoquinolin, carbazole, and dibenzophosphol.

Among the aromatic heterocyclic compounds, specific examples of compounds in which the aromatic heterocycle itself does not exhibit aromaticity and the aromatic ring is fused to the heterocycle include phenoxazine, phenothiazine, dibenzoborol, dibenzosiror, and benzopyran.

The number of carbon atoms of the monovalent heterocyclic group is usually 2 to 60 and preferably 4 to 20 without including the number of carbon atoms of the substituent.

The monovalent heterocyclic group may have a substituent, and specific examples of the monovalent heterocyclic group include a thienyl group, a pyrrolyl group, a furyl group, a pyridyl group, a piperidyl group, a quinolyl group, an isoquinolyl group, a pyrimidinyl group, a triazinyl group, and a group having a substituent such as an alkyl group and an alkoxy group.

The "substituted amino group" means an amino group having a substituent. Examples of substituents that an amino group has include an alkyl group, an aryl group, and a monovalent heterocyclic group. As the substituent, an alkyl group, an aryl group, or a monovalent heterocyclic group is preferable. The number of carbon atoms of the substituted amino group is usually 2 to 30.

Examples of the substituted amino group include a dialkylamino group such as a dimethylamino group and a diethylamino group, a diarylamino group such as a diphenylamino group, a bis(4-methylphenyl) amino group, a bis(4-tert-butylphenyl) amino group, and a bis(3,5-di-tert-butylphenyl) amino group.

The "acyl group" usually has about 2 to 20 carbon atoms, and preferably 2 to 18 carbon atoms. Specific examples of the acyl group include an acetyl group, a propionyl group, a butyryl group, an isobutyryl group, a pivaloyl group, a benzoyl group, a trifluoroacetyl group, and a pentafluorobenzoyl group.

The "imine residue" means a remaining atomic group obtained by removing one hydrogen atom directly bonded to a carbon atom or a nitrogen atom forming a carbon atom-nitrogen atom double bond from an imine compound. The "imine compound" means an organic compound having a carbon atom-nitrogen atom double bond in a molecule. Examples of the imine compound include aldimine, ketimine, and a compound in which the hydrogen atom bonded to the nitrogen atom constituting the carbon atom-nitrogen atom double bond in aldimine is replaced with an alkyl group or the like.

The imine residue usually has about 2 to 20 carbon atoms, and preferably 2 to 18 carbon atoms. Examples of the imine residue include groups represented by the following structural formulas.

[Chem. 1]

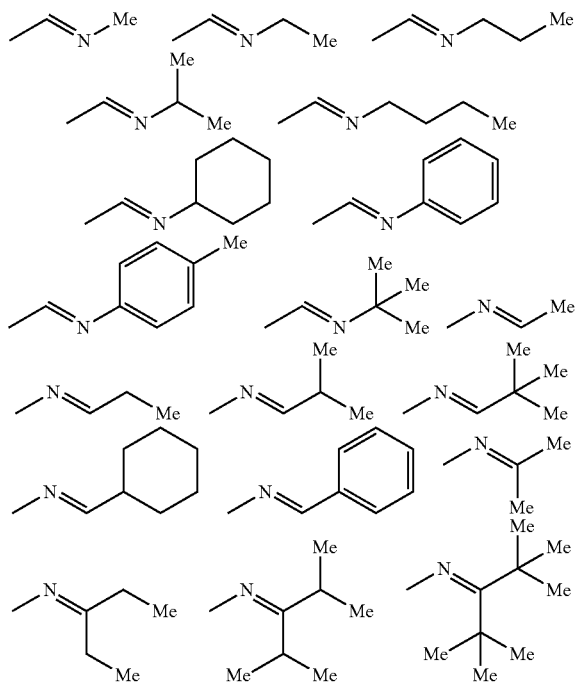

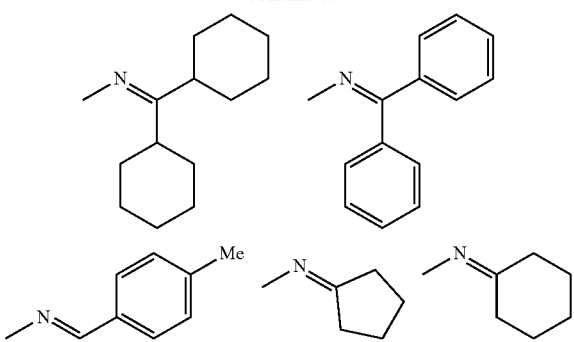

The "amide group" means a remaining atomic group obtained by removing one hydrogen atom bonded to a nitrogen atom from the amide. The number of carbon atoms of the amide group is usually about 1 to 20 and preferably 1 to 18. Specific examples of the amide group include a formamide group, an acetamido group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group, and a dipentafluorobenzamide group.

The "acidimide group" means a remaining atomic group obtained by removing one hydrogen atom bonded to a nitrogen atom from the acidimide. The number of carbon atoms of the acidimide group is usually about 4 to 20. Specific examples of the acidimide group include a group represented by the following structural formulas.

[Chem. 2]

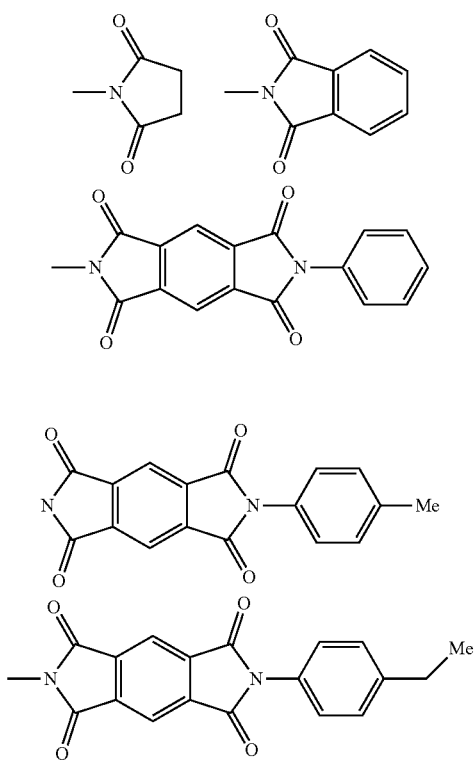

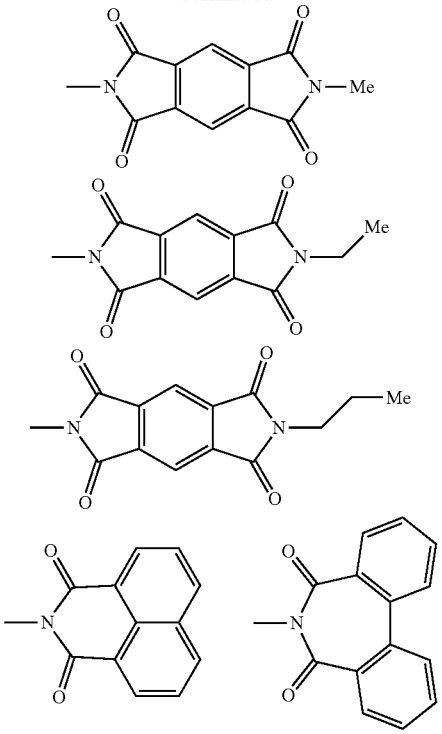

The "substituted oxycarbonyl group" means a group represented by R'—O—(C=O)—.

Here, R' represents an alkyl group, an aryl group, an arylalkyl group, or a monovalent heterocyclic group.

The substituted oxycarbonyl group usually has about 2 to 60 carbon atoms and preferably 2 to 48 carbon atoms.

Specific examples of the substituted oxycarbonyl group include a methoxycarbonyl group, an ethoxycarbonyl group, a propoxycarbonyl group, an isopropoxycarbonyl group, a butoxycarbonyl group, an isobutoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

The "alkenyl group" may be linear, branched, or cyclic. The number of carbon atoms of the linear alkenyl group is usually 2 to 30 and preferably 3 to 20 without including the number of carbon atoms of the substituent. The number of carbon atoms of the branched or cyclic alkenyl group is usually 3 to 30 and preferably 4 to 20 without including the number of carbon atoms of the substituent.

The alkenyl group may have a substituent. Specific examples of the alkenyl group include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and a group having a substituent such as an alkyl group and an alkoxy group.

The "alkynyl group" may be linear, branched, or cyclic. The number of carbon atoms of the linear alkenyl group is usually 2 to 20 and preferably 3 to 20 without including the number of carbon atoms of the substituent. The number of carbon atoms of the branched or cyclic alkenyl group is usually 4 to 30 and preferably 4 to 20 without including the number of carbon atoms of the substituent.

The alkynyl group may have a substituent. Specific examples of the alkynyl group include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and a group having a substituent such as an alkyl group and an alkoxy group.

[1. Light Detecting Element]

A light detecting element (photoelectric conversion element) according to the present embodiment includes a positive electrode, a negative electrode, and an active layer provided between the positive electrode and the negative electrode and containing a p-type semiconductor material and an n-type semiconductor material, in which a thickness of the active layer is 800 nm or more, and a value obtained by subtracting an absolute value of LUMO of the n-type semiconductor material from a work function of a surface of the active layer in contact with a negative electrode side surface is 0.0 to 0.5 eV.

Here, "LUMO" (Lowest Unoccupied Molecular Orbital) means the lowest empty orbital.

The LUMO level of n-type semiconductor materials can be estimated from cyclic voltammetry (CV) measurement values. The CV measurement for evaluating the LUMO level can be performed, for example, according to the method described in Advanced Materials, Vol. 18, 2006, pp. 789-794.

<Configuration Example of Photoelectric Conversion Element (Light Detecting Element)>

Hereinafter, a photoelectric conversion element (light detecting element) according to an embodiment of the present invention will be described with reference to the drawings. Note that the drawings merely outline the shapes, sizes, and arrangements of components to the extent that the invention can be understood. The present invention is not limited to the following description, and each component can be appropriately modified without departing from the gist of the present invention. Further, in the configuration according to the embodiment of the present invention, it is not always produced or used in the arrangement illustrated in the drawings. In each of the drawings described below, the same components may be given the same sign and the description thereof may be omitted.

With reference to FIG. 1, a configuration example of the photoelectric conversion element (light detecting element) according to the present embodiment will be described. Here, a configuration example of a photoelectric conversion element (light detecting element) having a so-called reverse laminated structure will be described.

The light detecting element according to the embodiment of the present invention may or may not include an electron transport layer. The light detecting element according to the embodiment of the present invention of the case of including the electron transport layer may have, for example, a configuration schematically illustrated in FIG. 1. In FIG. 1, the light detecting element 10 of the present embodiment is provided on, for example, a support substrate 11. The light detecting element 10 includes a negative electrode 12 provided in contact with the support substrate 11, an electron transport layer 13 provided in contact with the negative electrode 12, an active layer 14 provided in contact with the electron transport layer 13, a hole transport layer 15 provided in contact with the active layer 14, and a positive electrode 16 provided in contact with the hole transport layer 15. In this configuration example, a sealing substrate 17 provided in contact with the positive electrode is further provided. The light detecting element according to the embodiment of the present invention of the case of not including the electron transport layer may have a configuration in which the electron transport layer 13 does not exist and the negative electrode 12 and the active layer 14 are in contact with each other, for example, in FIG. 1.

Hereinafter, the components that can be contained in the light detecting element of the present embodiment will be specifically described.

(Substrate)

The light detecting element is usually formed on a substrate (support substrate or sealing substrate). A pair of electrodes, usually formed of a negative electrode and a positive electrode, are formed on this substrate. A material of the substrate is not particularly limited as long as it is a material that does not chemically change when forming a layer containing, particularly, an organic compound.

Examples of the material of the substrate include glass, plastic, a polymer film, and silicon. In a case of an opaque substrate, it is preferable that an electrode (that is, the electrode on the side far from the opaque substrate) on the side opposite to the electrode provided on the opaque substrate side is a transparent or translucent electrode.

(Electrode)

The light detecting element includes a pair of electrodes, a positive electrode and a negative electrode. At least one of the positive electrode and the negative electrode is preferably a transparent or translucent electrode in order to allow light to enter.

Examples of the material of the transparent or translucent electrode include a conductive metal oxide film and a translucent metal thin film. Specific examples of the electrode material include conductive materials such as indium oxide, zinc oxide, tin oxide, and indium tin oxide (ITO), indium zinc oxide (IZO), and NESA, which are composites thereof, and gold, platinum, silver, and copper. As a transparent or translucent electrode material, ITO, IZO, and tin oxide are preferable. Further, as the electrode, a transparent conductive film using an organic compound such as polyaniline and a derivative thereof, or polythiophene and a derivative thereof as a material may be used. The transparent or translucent electrode may be a positive electrode or a negative electrode.

If one of the pair of electrodes is transparent or translucent, the other electrode may be an electrode having low light transmittance. Examples of the material of the electrode having low light transmittance include metal and a conductive polymer. Specific examples of material of the electrode having low light transmittance include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, and alloys of two or more of these, or alloys of one or more of these metals with one or more metals selected from the group consisting of gold, silver, platinum, copper, manganese, titanium, cobalt, nickel, tungsten, and tin, graphite, a graphite interlayer compound, polyaniline and a derivative thereof, and polythiophene and a derivative thereof. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

As a method for forming an electrode, any suitable forming method known in the related art can be used. Examples of the method for forming an electrode include a vacuum deposition method, a sputtering method, an ion plating method, a coating method such as a slit coating method and a spin coating method, and a plating method.
(Negative Electrode)

The negative electrode may be usually formed on a substrate (for example, a support or sealing substrate, preferably a support substrate). The negative electrode may be a transparent or translucent electrode, or an electrode having low light transmittance. In a case where the light detecting element needs to be light transmissive, the negative electrode is preferably a transparent or translucent electrode. In a case where the negative electrode is a transparent or translucent electrode, the material of the negative electrode includes the above-described material of the transparent or translucent electrode. In a case where the negative electrode is an electrode having low light transmittance, examples of the material of the negative electrode include the above-described material of the electrode having low light transmittance.

Examples of the method for forming a negative electrode include the above-described method for forming an electrode.

A thickness of the negative electrode is not particularly limited, and may be, for example, 1000 to 1 nm, and in a case of extracting the energy of light as electrical energy, since sufficiently low electrical resistance is required, the thickness of the negative electrode may be preferably 500 to 100 nm, and particularly, in a case of being used for a photodetector, since it requires higher transmittance than electrical resistance, the thickness of the negative electrode may be more preferably 200 to 5 nm.

After the negative electrode is formed, the negative electrode on the substrate may or may not be surface-treated in order to set the work function of the surface of the active layer in contact with the surface on the negative electrode side to an appropriate value. In a case where the light detecting element includes an electron transport layer described later, after the negative electrode is formed, the negative electrode on the substrate may or may not be surface-treated, and is preferably surface-treated. In the case where the light detecting element does not include the electron transport layer described later (for example, in a case where the negative electrode and the active layer described below are in direct contact), after the negative electrode is formed, the negative electrode on the substrate may or may not be surface-treated, and it is preferable not to be surface-treated. As the surface treatment, any suitable surface treatment known in the related art, for example, a physical treatment such as a corona discharge treatment, an oxygen plasma treatment, and an ultraviolet ozone treatment, and a chemical treatment such as a cleaning treatment using water or an organic solvent and an acid cleaning treatment can be used with respect to the structure.
(Positive Electrode)

As the material and method for forming the positive electrode, those described above for the electrode may be employed.
(Active Layer)

The active layer contains a p-type semiconductor material (electron-donating compound) and an n-type semiconductor material (electron-accepting compound) (details of suitable p-type semiconductor material and n-type semiconductor material will be described later). Whether it is the p-type semiconductor material or the n-type semiconductor material can be relatively determined from a HOMO energy level or a LUMO energy level of the selected compound.

In the present embodiment, the thickness of the active layer is preferably thicker from the viewpoint of reducing the dark current. Further, unlike the technique in the related art in which the external quantum efficiency tends to decrease as the active layer becomes thicker, the present embodiment has a feature that the external quantum efficiency does not decrease even if the active layer becomes thicker. Therefore, the thickness of the active layer is preferably thicker from the viewpoint of obtaining high sensitivity characteristics due to a low dark current and high external quantum efficiency. The thickness of the active layer is 800 nm or more, preferably 800 nm or more and 10000 nm or less, and more preferably 800 nm or more and 3500 nm or less in order to obtain a smooth film after the coating film is dried.

Here, the "external quantum efficiency (EQE)" specifically refers to a value indicating a number of electrons, by a ratio (%), which can be taken out of the light detecting element, among the electrons generated for the number of photons with which the light detecting element is irradiated.

The external quantum efficiency (EQE) of the light detecting element can be evaluated, for example, by the following method.

With a voltage (for example, −2 V) applied to the light detecting element, a spectral sensitivity measuring device is used to irradiate the light detecting element with light of a specific wavelength (for example, light at a wavelength of 850 nm which is the maximum absorption wavelength of a polymer compound P-1, the number of photons: $1.0 \times 10^{16}$), and the current value of the generated current is measured, and a measurement value of EQE can be obtained by the following equation.

$$\text{Equation} EQE(\%) = (S \times 1240/\lambda) \times 100$$

S: Light receiving sensitivity (A/W), λ: Wavelength (nm)

The active layer can preferably be formed by a coating method. Details of the p-type semiconductor material and the n-type semiconductor material that can be contained in the active layer and the method for forming the active layer will be described later.
(Electron Transport Layer)

The light detecting element of the present embodiment may include an electron transport layer as an intermediate layer, which is a component for improving the characteristics, between the negative electrode and the active layer as illustrated in FIG. 1, or may not include the electron transport layer. In the case where the light detecting element of the present embodiment does not include the electron transport layer, the negative electrode and the active layer may be in direct contact with each other.

The electron transport layer contains an electron transport material. Examples of the electron transport material include any suitable material that contributes to the movement of electrons in the layer constituting the light detecting element, and any suitable material that adjusts (for example, decrease or increase, preferably decrease) the work function. Examples of the electron transport material include a metal compound and a compound having an alkylene structure.

Examples of the metal compound include metal oxide, metal hydroxide, and metal alkoxide. The metal compound may be preferably metal oxide, metal hydroxide, or metal alkoxide containing divalent or higher valent metal, and more preferably metal oxide, metal hydroxide, or metal alkoxide containing zinc or titanium. Examples of the metal alkoxide include metal methoxide, metal ethoxide, metal propoxide, metal isopropoxide, metal n-butoxide, metal sec-butoxide, metal isobutoxide, and metal tert-butoxide.

Examples of the metal oxide include zinc oxide, gallium-doped zinc oxide, aluminum-doped zinc oxide, titanium oxide, and niobium oxide. As the metal oxide, a metal oxide containing zinc is preferable, and zinc oxide is particularly preferable.

Examples of the metal hydroxide include zinc hydroxide, titanium hydroxide, and niobium hydroxide. As the metal hydroxide, metal hydroxide containing zinc or titanium is preferable, and titanium hydroxide is particularly preferable.

As the metal alkoxide, metal alkoxide containing titanium is preferable, and among them, titanium (IV) isopropoxide is preferable.

Examples of the compound having an alkylene structure include polyalkyleneimine and a derivative thereof. Examples of polyalkyleneimine and a derivative thereof include alkyleneimine having 2 to 8 carbon atoms such as ethyleneimine, propyleneimine, butyleneimine, dimethyl-ethyleneimine, pentyleneimine, hexyleneimine, heptylene-imine, and octyleneimine, particularly, polymers obtained by polymerizing one or two or more of alkyleneimines having 2 to 4 carbon atoms by a common method, and a polymers that are chemically modified by reacting them with various compounds. As the polyalkyleneimine and a deriva-tive thereof, polyethyleneimine ethoxylate (PEIE: ethoxy-lated polyethyleneimine) containing polyethyleneimine (PEI) and polyalkyleneimine as a main chain, and ethylene oxide which is a modified product added to nitrogen atoms in the main chain is preferable.

The electron transport material may be formed by a vacuum film forming method, or by being applied on a negative electrode on a substrate in the form of a liquid (coating liquid for forming an electron transport layer). The coating liquid for forming an electron transport layer may be a solution, an emulsion (emulsion liquid), a suspension (suspension), or a dispersion liquid. In the coating liquid for forming an electron transport layer, the electron transport material may be fine particles or nanoparticles. Examples of a medium (hereinafter, collectively referred to as "solvent") for dissolving, emulsifying, suspending, dispersing, or dilut-ing the electron transport material include a hydrocarbon solvent such as toluene, xylene, mesitylene, tetraline, deca-lin, bicyclohexyl, n-butylbenzene, sec-butylbenzene, and tert-butylbenzene; a halogenated saturated hydrocarbon sol-vent such as carbon tetrachloride, chloroform, dichloromethane, dichloroethane, chlorobutane, bromobutane, chloropentane, bromopentane, chlorohexane, bromohexane, chlorocyclohexane, and bromocyclohexane; a halogenated aromatic hydrocarbon solvent such as chlorobenzene, dichlorobenzene, and trichlorobenzene; an ether solvent such as tetrahydrofuran and tetrahydropyran; water; and alcohol. Specific examples of the alcohol include methanol, ethanol, isopropanol, butanol, 1-pentanol, 2-pentanol, 3-pentanol, ethylene glycol, propylene glycol, butoxyetha-nol, and methoxybutanol. The coating liquid may contain one kind of solvent alone, may contain two or more kinds of solvents, and may contain two or more kinds of the above-described solvents.

Any suitable coating method can be used as the coating method of the coating liquid for forming an electron trans-port layer.

As the coating method, a slit coating method, a knife coater method, a spin coating method, a micro gravure coating method, a gravure coating method, a bar coating method, an ink jet printing method, a nozzle coating method, or a capillary coating method is preferable, and the slit coating method, the knife coater method, the spin coating method, the capillary coat method, or the bar coat method is more preferable, and the slit coat method, the knife coater method, or the spin coating method is further preferable.

After the coating liquid for forming an electron transport layer is applied, the electron transport layer can be formed by removing (drying) the solvent from the coating film of the coating liquid for forming an electron transport layer. Any suitable method can be used as a method for removing the solvent from the coating film of the coating liquid, that is, a method for removing and solidifying the solvent from the coating film. Examples of the method for removing the solvent include a method for direct heating using a hot plate (for example, heating at 40° C. to 300° C. for 1 to 60 minutes), and a drying method such as a hot air drying method, an infrared heating drying method, a flash lamp annealing drying method, and a vacuum drying method.

The thickness of the electron transport layer can be set to a desired thickness by appropriately adjusting the solid content concentration in the coating liquid for forming an electron transport layer and the conditions for coating and/or removing the solvent.

Specifically, for example, in a case where the coating method is the knife coater method, the thickness of the electron transport layer can be adjusted to an any suitable thickness by adjusting the characteristic conditions of the coating liquid such as the concentration (viscosity of the coating liquid) of the components in the coating liquid to be used, and various implementation conditions in the knife coater method.

For example, in order to adjust the thickness of the electron transport layer in the direction of increasing the thickness, the concentration of the component in the coating liquid is more increased and/or a gap between the substrate and the knife in the knife coater method may be widened so that the coating speed is more increased.

The thickness of the electron transport layer may be, for example, 0.1 to 300 nm, preferably 0.1 to 100 nm, and more preferably 1 to 100 nm.

After the electron transport layer is formed, the electron transport layer may or may not be surface-treated. As the surface treatment, methods for implementing any suitable surface treatment known in the related art, for example, a physical treatment such as a corona discharge treatment, an oxygen plasma treatment, and an ultraviolet ozone treatment, and a chemical treatment such as a cleaning treatment using water or an organic solvent and an acid cleaning treatment can be used with respect to the structure.

In the light detecting element of the present embodiment, the work function of the surface of the active layer in contact with the negative electrode side surface can be appropriately adjusted such that the value obtained by subtracting the absolute value of LUMO of the n-type semiconductor material from the work function of the surface of the active layer in contact with the negative electrode side surface is 0.0 to 0.5 eV.

In the case where the light detecting element includes an electron transport layer, the surface of the active layer in contact with the negative electrode side surface corresponds to the surface of the electron transport layer. In this case, the work function of the surface of the active layer in contact with the negative electrode side surface (that is, the work function of the surface of the electron transport layer) can be adjusted to a desired value by appropriately selecting vari-ous conditions in the formation of the electron transport layer, for example, the type of coating liquid for forming an electron transport layer, the coating method, the method for removing a solvent, the thickness of the electron transport layer, the surface treatment of the negative electrode on the substrate before applying the coating liquid for forming an electron transport layer, and the surface treatment of the electron transport layer after the formation of the electron transport layer.

In the case where the light detecting element does not include the electron transport layer described later (for example, in a case where the negative electrode and the active layer are in direct contact with each other), the surface of the active layer in contact with the negative electrode side surface corresponds to the surface of the negative electrode. In this case, the work function of the surface of the active layer in contact with the negative electrode side surface (that is, the work function of the surface of the negative electrode surface) can be adjusted to a desired value by appropriately selecting various conditions in the formation of the negative electrode, for example, the type of negative electrode material, the method for forming a negative electrode, the thickness of the negative electrode, and the surface treatment.

Examples of the work function of the surface of the active layer in contact with the negative electrode side surface include 2.0 to 10.0 eV, preferably 3.0 to 7.5 eV, and more preferably 4.0 to 5.0 eV.

The work function can be evaluated (measured) using, for example, a known Kelvin probe device in the related art (for example, FAC-2, available from RIKEN KEIKI Co., Ltd.) and gold (WF: 5.1 eV) as a reference sample for calibration.

As illustrated in FIG. 1, the light detecting element of the present embodiment may include a hole transport layer between the positive electrode and the active layer. The hole transport layer has a function of transporting holes from the active layer to the electrode. Since the hole transport layer has a function of blocking the flow of electrons to the electrode, it is sometimes called an electron blocking layer.

The hole transport layer provided in contact with the positive electrode may be particularly referred to as a hole injection layer. The hole transport layer (hole injection layer) provided in contact with the positive electrode has a function of promoting the injection of holes into the positive electrode.

The hole transport layer contains a hole transport material. Examples of the hole transport material include polythiophene and a derivative thereof, an aromatic amine compound, a polymer compound containing a constituent unit having an aromatic amine residue, CuSCN, CuI, NiO, and molybdenum oxide ($MoO_3$).

The intermediate layer can be formed by the same coating method as that for the active layer.

The light detecting element according to the present embodiment is provided on a substrate, and preferably has a so-called reverse laminated structure in which the intermediate layer is an electron transport layer and a hole transport layer, and the negative electrode, the electron transport layer, the active layer, the hole transport layer, and the positive electrode are laminated in this order so as to be in contact with each other.

(Other)

The light detecting element of the present embodiment can be sealed by a sealing member such as a sealing substrate or a sealing material. Examples of the sealing member include a combination of cover glass having a recess and a sealing material.

The sealing member may have a layer structure of one or more layers. Therefore, as an example of the sealing member, a layer structure such as a gas barrier layer and a gas barrier film can be further exemplified.

The layer structure of the sealing member is preferably formed of a material having a property of blocking water (water vapor barrier property) or a property of blocking oxygen (oxygen barrier property). Examples of suitable materials as materials having a layer structure include organic materials such as resins of polyethylene trifluoride, polychlorotrifluoroethylene (PCTFE), polyimide, polycarbonate, polyethylene terephthalate, alicyclic polyolefin, and an ethylene-vinyl alcohol copolymer; and inorganic materials such as silicon oxide, silicon nitride, aluminum oxide, and diamond-like carbon.

According to the present invention, when the thickness of the active layer is set to 800 nm or more, and the value obtained by subtracting the absolute value of LUMO of the n-type semiconductor material from the work function of the surface of the active layer in contact with the negative electrode side surface is set to 0.0 to 0.5 eV, it is possible to realize a light detecting element having a reduced dark current and improved external quantum efficiency.

<Application Example of Light Detecting Element>

The light detecting element according to the embodiment of the present invention described above is suitably applied to a detector provided in various electronic devices such as a workstation, a personal computer, a personal digital assistant, an access control system, a digital camera, and a medical device.

The light detecting element of the present invention can be suitably applied to, for example, an image detector (image sensor) for a solid-state imaging device such as an X-ray imaging device and a CMOS image sensor; a detector that detects a predetermined feature of a part of a living body such as a fingerprint detector, a face detector, a vein detector, and an iris detector; and a detector of an optical biosensor such as a pulse oximeter, which are included in the above-exemplified electronic device.

Hereinafter, among the detectors to which the light detecting element according to the embodiment of the present invention can be suitably applied, configuration examples of the image detector for a solid-state imaging device and the fingerprint detector for a biometric information authentication device (fingerprint authenticating device) will be described with reference to the drawings.

<Image Detector>

Figure 2:
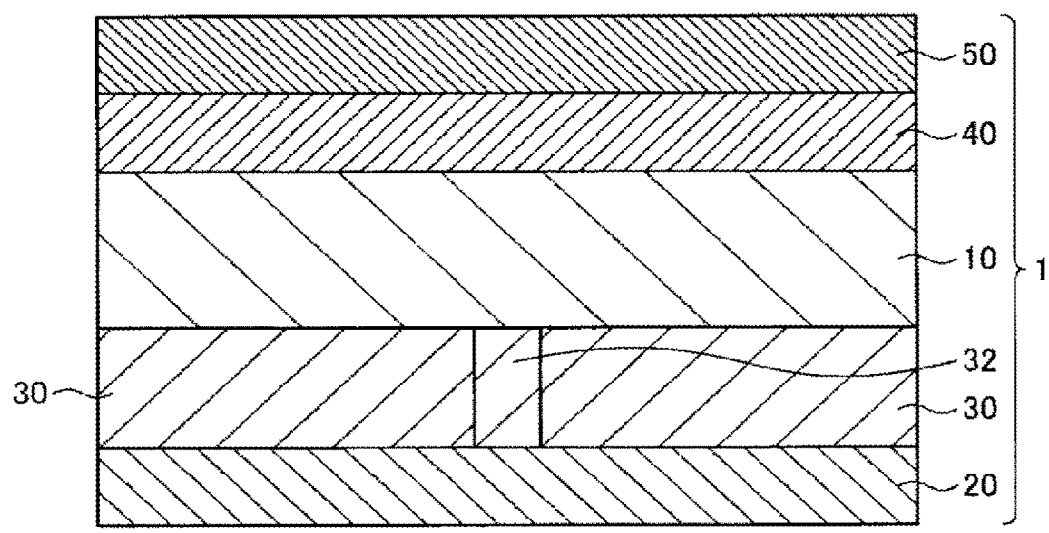
FIG. 2 is a diagram schematically illustrating a configuration example of an image detector.

FIG. 2 is a diagram schematically illustrating a configuration example of an image detector for a solid-state imaging device.

An image detector 1 is provided with a CMOS transistor substrate 20, an interlayer insulating film 30 provided so as to cover the CMOS transistor substrate 20, and a photoelectric conversion element (light detecting element) 10 according to the embodiment of the present invention, provided on the interlayer insulating film 30, an interlayer wiring portion 32 that is provided so as to penetrate the interlayer insulating film 30 and electrically connects the CMOS transistor substrate 20 and the photoelectric conversion element (light detecting element) 10 to each other, a sealing layer 40 provided so as to cover the photoelectric conversion element (light detecting element) 10, and a color filter 50 provided on the sealing layer.

The CMOS transistor substrate 20 includes any suitable configuration known in the related art in an aspect corresponding to the design.

The CMOS transistor substrate 20 includes a transistor, capacitors, and the like formed within the thickness of the substrate, and includes functional elements such as a CMOS transistor circuit (MOS transistor circuit) for realizing various functions.

Examples of the functional element include a floating diffusion, a reset transistor, an output transistor, and a selection transistor.

A signal readout circuit and the like are built in the CMOS transistor substrate 20 by such functional elements and wiring.

The interlayer insulating film 30 can be formed of any suitable insulating material known in the related art such as silicon oxide or an insulating resin. The interlayer wiring portion 32 can be formed of, for example, any suitable conductive material (wiring material) known in the related art such as copper and tungsten. The interlayer wiring portion 32 may be, for example, an in-hole wiring formed at the same time as the formation of the wiring layer, or an embedded plug formed separately from the wiring layer.

The sealing layer 40 can be formed of any suitable materials known in the related art under the conditions that the penetration of harmful substances such as oxygen and water that may functionally deteriorate the photoelectric conversion element (light detecting element) 10 can be prevented or suppressed. The sealing layer 40 may be formed of the sealing substrate 17 described above.

As the color filter 50, for example, a primary color filter which is made of any suitable material known in the related art and which corresponds to the design of the image detector 1 can be used. Further, as the color filter 50, a complementary color filter capable of reducing the thickness as compared with the primary color filter can also be used. Examples of the complementary color filters include color filters that combine three types of (yellow, cyan, and magenta), three types of (yellow, cyan, and transparent), three types of (yellow, transparent, and magenta), and three types of (transparent, cyan, and magenta) can be used. Assuming that these are subject to the ability to generate color image data, any suitable arrangement can be made corresponding to the design of the photoelectric conversion element (light detecting element) 10 and the CMOS transistor substrate 20.

The light received by the photoelectric conversion element (light detecting element) 10 via the color filter 50 is converted into an electric signal according to the amount of light received by the photoelectric conversion element (light detecting element) 10, and is output as a light receiving signal, that is, an electric signal corresponding to an image pickup target, outside the photoelectric conversion element (light detecting element) 10.

Next, the received light signal output from the photoelectric conversion element (light detecting element) 10 is input to the CMOS transistor substrate 20 via the interlayer wiring portion 32, and is read out by the signal readout circuit built in the CMOS transistor substrate 20, and signal processing is performed by a further optional suitable known functional unit in the related art (not shown) so as to generate the image information based on the image target.

<Fingerprint Detector>

Figure 3:
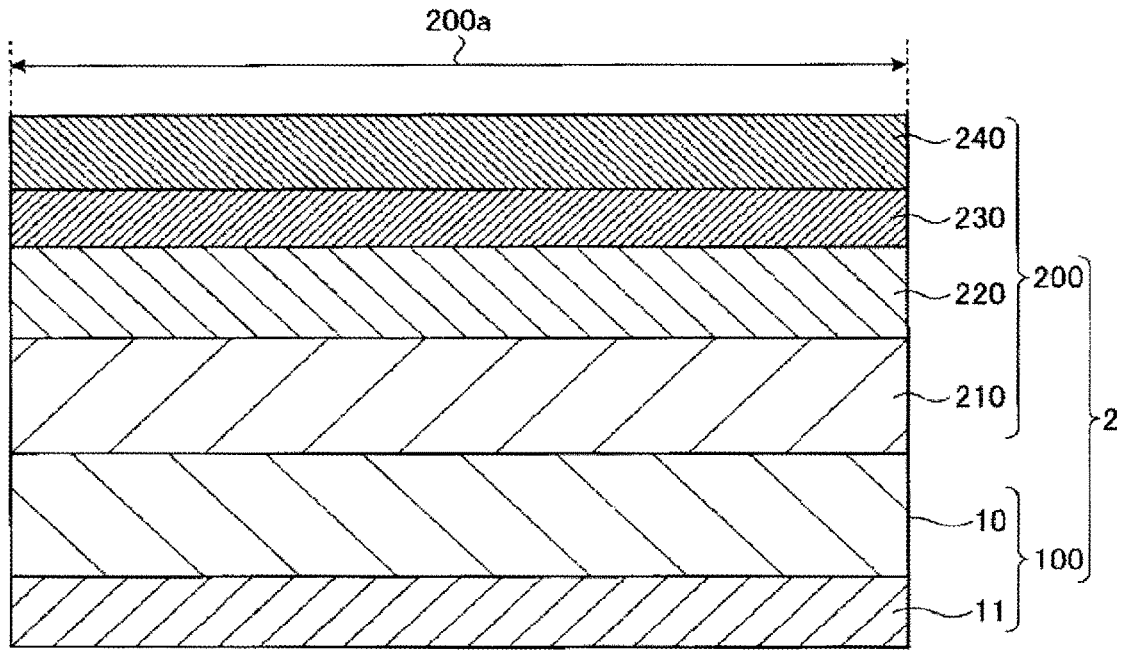
FIG. 3 is a diagram schematically illustrating a configuration example of a fingerprint detector.

FIG. 3 is a diagram schematically illustrating a configuration example of a fingerprint detector integrated with the display device.

The display device 2 of a personal digital assistant is provided with a fingerprint detector 100 including the photoelectric conversion element (light detecting element) 10 according to the embodiment of the present invention as a main component and a display panel unit 200 that is provided on the fingerprint detector 100, and displays a predetermined image.

In this configuration example, the fingerprint detector 100 is provided in a region that substantially coincides with a display region 200a of the display panel unit 200. In other words, the display panel unit 200 is integrally laminated above the fingerprint detector 100.

In a case where the fingerprint detection is performed only in a part region of the display region 200a, the fingerprint detector 100 may be provided corresponding to only the part region of the display region 200a.

The fingerprint detector 100 includes the photoelectric conversion element 10 according to the embodiment of the present invention as a functional unit that performs an essential function. The fingerprint detector 100 can be provided with any suitable member known in the related art, such as a protection film (not shown), a support substrate, a sealing substrate, a sealing member, a barrier film, a bandpass filter, and an infrared cut film in an aspect corresponding to the design of obtaining desired characteristics. For the fingerprint detector 100, the configuration of the image detector as described above can also be adopted.

The photoelectric conversion element 10 may be included in any aspect within the display region 200a. For example, a plurality of photoelectric conversion elements 10 may be arranged in a matrix.

As described above, the photoelectric conversion element 10 is provided on the support substrate 11 or the sealing substrate, and the support substrate 11 is provided with electrodes (positive electrode or negative electrode) in a matrix, for example.

The light received by the photoelectric conversion element 10 is converted into an electric signal according to the amount of light received by the photoelectric conversion element 10, and is output as a light receiving signal, that is, an electric signal corresponding to a captured fingerprint, outside the photoelectric conversion element 10.

In this configuration example, the display panel unit 200 is configured as an organic electroluminescence display panel (organic EL display panel) including a touch sensor panel. The display panel unit 200 may be configured of, for example, instead of the organic EL display panel, a display panel having an any suitable configuration known in the related art, such as a liquid crystal display panel including a light source such as a backlight.

The display panel unit 200 is provided on the fingerprint detector 100 as described above. The display panel unit 200 includes an organic electroluminescence element (organic EL element) 220 as a functional unit that performs an essential function. The display panel unit 200 may be further provided with any suitable substrate (support substrate 210 or sealing substrate 240) known in the related art, such as a glass substrate, a sealing member, a barrier film, a polarizing plate such as a circular polarizing plate, and any suitable member known in the related art, such as a touch sensor panel 230 in an aspect corresponding to the desired characteristics.

In the configuration example described above, the organic EL element 220 is used as a light source for pixels in the display region 200a, and is also used as a light source for capturing a fingerprint in the fingerprint detector 100.

Here, an operation of the fingerprint detector 100 will be briefly described.

When performing fingerprint authentication, the fingerprint detector 100 detects a fingerprint using the light emitted from the organic EL element 220 of the display panel unit 200. Specifically, the light emitted from the organic EL element 220 passes through the component existing between the organic EL element 220 and the photoelectric conversion element 10 of the fingerprint detector 100, and is reflected by skin (finger surface) of the fingertips of the fingers placed so as to be in contact with the surface of the display panel unit 200 within the display region 200a. At least a part of the light reflected by the finger surface passes through the components existing between them and is received by the photoelectric conversion element 10, and is converted into an electric signal corresponding to the amount of light received by the photoelectric conversion element 10. Then, image information about the fingerprint on the finger surface is formed of the converted electric signals.

The personal digital assistant provided with the display device 2 performs fingerprint authentication by comparing the obtained image information with the fingerprint data for fingerprint authentication recorded in advance by any suitable step known in the related art.

[2. Method for Producing Light Detecting Element]

The method for producing the light detecting element of the present embodiment is not particularly limited. The light detecting element can be produced by a forming method suitable for the material selected for forming each component.

Hereinafter, as an embodiment of the present invention, a method for producing a light detecting element provided on a substrate (support substrate) and having a configuration in which a negative electrode, any electron transport layer, an active layer, a hole transport layer, and a positive electrode are in contact with each other in this order will be described.

(Step of Preparing Substrate)

In this step, a support substrate provided with a negative electrode is prepared.

A method of providing the negative electrode on the support substrate is not particularly limited. The negative electrode can be formed, for example, by forming the above-exemplified material on the support substrate made of the materials as described above by a vacuum deposition method, a sputtering method, an ion plating method, a plating method, or the like.

Further, a substrate provided with a thin film formed of the material of the electrode as described above is available from the market, and if necessary, the negative electrode is formed by patterning a conductive thin film, thereby preparing a support substrate provided with the negative electrode.

(Step of Forming Electron Transport Layer)

A method for producing the light detecting element in a case of including the electron transport layer may include a step of forming an electron transport layer provided between the active layer and the negative electrode as an intermediate layer. Examples of the electron transport layer include those containing the above-described electron transport material. Examples of the method for forming the electron transport layer include a vacuum film forming method and a coating method described above. Examples of the material (for example, the coating liquid for forming an electron transport layer) and the conditions used in the method for forming the electron transport layer include those described above.

The method for producing the light detecting element of the present embodiment may further include a step of forming an electron transport layer after the step of preparing a support substrate provided with a negative electrode and before a step of forming an active layer.

(Step of Forming Active Layer)

The active layer, which is a main component of the photoelectric conversion element of the present embodiment, can be produced by a coating method using a coating liquid (ink).

Hereinafter, a step (i) and a step (ii) included in the step of forming the active layer, which is a main component of the photoelectric conversion element of the present invention, will be described.

(Step (i))

As a method for applying a coating liquid to a coating target, any suitable coating method can be used.

As the coating method, a slit coating method, a knife coater method, a spin coating method, a micro gravure coating method, a gravure coating method, a bar coating method, an ink jet printing method, a nozzle coating method, or a capillary coating method is preferable, and the slit coating method, the spin coating method, the capillary coat method, or the bar coat method is more preferable, and the slit coat method or the spin coating method is further preferable.

A coating liquid for forming an active layer is applied to a coating target selected according to the photoelectric conversion element and the producing method thereof. The coating liquid for forming an active layer can be applied to the functional layer of the photoelectric conversion element, in which the active layer can exist, in the step of producing the photoelectric conversion element. Therefore, the coating target of the coating liquid for forming an active layer differs depending on the layer configuration of the photoelectric conversion element to be produced and the order of layer formation. For example, in a case where it has a layer configuration in which the photoelectric conversion element is provided on the substrate, and the positive electrode, the hole transport layer, the active layer, the electron transport layer, and the negative electrode are laminated, and the layer described on the right side is formed first, the coating target of the coating liquid for forming an active layer is the electron transport layer. In addition, in a case where it has a layer configuration in which the photoelectric conversion element is provided on the substrate, and the negative electrode, the electron transport layer, the active layer, the hole transport layer, and the positive electrode are laminated, and the layer described on the right side is formed first, the coating target of the coating liquid for forming an active layer is the hole transport layer.

(Step (ii))

Any suitable method can be used as a method for removing the solvent from the coating film of the coating liquid, that is, a method for removing the solvent and solidifying the coating film. Examples of the method for removing the solvent include a method for direct heating using a hot plate, and a drying method such as a hot air drying method, an infrared heating drying method, a flash lamp annealing drying method, and a vacuum drying method.

The thickness of the active layer can be set to a desired thickness by appropriately adjusting the solid content concentration in the coating liquid and the conditions of the above step (i) and/or step (ii).

Specifically, for example, in a case where the coating method is the knife coater method, the thickness of the active layer can be adjusted to an any suitable thickness by adjusting the characteristic conditions of the coating liquid such as the concentration (viscosity of the coating liquid) of the components in the coating liquid to be used, and various implementation conditions in the knife coater method.

For example, in order to adjust the thickness of the active layer in the direction of increasing the thickness, the concentration of the component in the coating liquid is more increased and/or a gap between the substrate and the knife in the knife coater method may be widened so that the coating speed is more increased.

The step of forming the active layer may include other steps in addition to the steps (i) and (ii), provided that the object and effect of the present invention are not impaired.

The method for producing the light detecting element may be a method for producing a light detecting element including a plurality of active layers, or a method in which the steps (i) and (ii) are repeated a plurality of times.

The coating liquid for forming an active layer may be a solution, or may be a dispersion liquid such as a dispersion liquid, an emulsion (emulsion liquid), or a suspension (suspension). The coating liquid for forming an active layer according to the present embodiment contains a p-type semiconductor material, an n-type semiconductor material, and a solvent. Hereinafter, the components of the coating liquid for forming an active layer will be described.

(p-Type Semiconductor Material)

The p-type semiconductor material may be a low molecular weight compound or a polymer compound.

Examples of the p-type semiconductor material which is the low molecular weight compound include phthalocyanine, metallic phthalocyanine, porphyrin, metallic porphyrin, oligothiophene, tetracene, pentacene, and rubrene.

In a case where the p-type semiconductor material is a polymer compound, the polymer compound has a predetermined polystyrene-equivalent weight average molecular weight.

Here, the polystyrene-equivalent weight average molecular weight means a weight average molecular weight calculated using a standard polystyrene sample using gel permeation chromatography (GPC).

The polystyrene-equivalent weight average molecular weight of the p-type semiconductor material is preferably 20000 or more and 200000 or less, more preferably 30000 or more and 180000 or less, and further preferably 40000 or more and 150000 or less from the viewpoint of solubility in a solvent.

Examples of the p-type semiconductor material which is the polymer compound include polyvinylcarbazole and a derivative thereof, polysilane and a derivative thereof, a polysiloxane derivative having an aromatic amine structure in a side chain or main chain, polyaniline and a derivative thereof, polythiophene and a derivative thereof, polypyrrole and a derivative thereof, polyphenylene vinylene and a derivative thereof, polythienylene vinylene and a derivative thereof, and polyfluorene and a derivative thereof.

The p-type semiconductor material, which is the polymer compound, is preferably a polymer compound containing a constituent unit having a thiophene skeleton.

The p-type semiconductor material is preferably a polymer compound containing a constituent unit represented by the following Formula (I) and/or a constituent unit represented by the following Formula (II).

[Chem. 3]

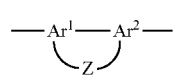
(1)

In Formula (I), $Ar^1$ and $Ar^2$ represent trivalent aromatic heterocyclic groups, and Z represents groups represented by the following Formulas (Z-1) to (Z-7).

[Chem. 4]

(11)

In Formula (II), $Ar^3$ represents a divalent aromatic heterocyclic group.

[Chem. 5]

(Z-1)

(Z-2)

(Z-3)

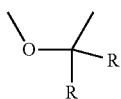
(Z-4)

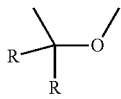
(Z-5)

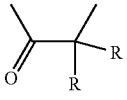
(Z-6)

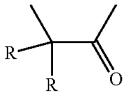
(Z-7)

In Formulas (Z-1) to (Z-7), R is a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acidimide group, a substituted oxycarbonyl group, an alkenyl group, an alkynyl group, a cyano group, or a nitro group. In a case where there are two Rs in each of the Formulas (Z-1) to (Z-7), the two Rs may be the same or different from each other.

The constituent unit represented by Formula (I) is preferably the constituent unit represented by the following Formula (I-1).

[Chem. 6]

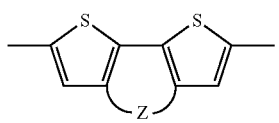
(I-1)

In Formula (I-1), Z has the same meaning as described above.

Examples of the constituent unit represented by Formula (I-1) include constituent units represented by the following Formulas (501) to (505).

[Chem. 7]

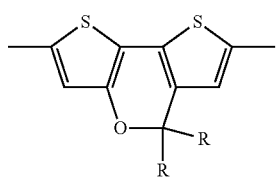
(501)

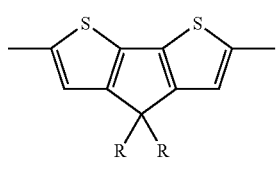
(502)

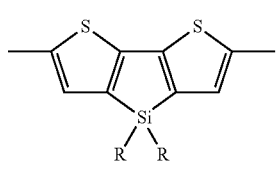
(503)

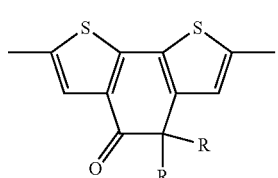
(504)

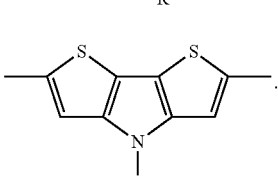
(505)

In the Formulas (501) to (505), R has the same meaning as described above. In a case where there are two Rs, the two Rs may be the same or different from each other.

The number of carbon atoms of the divalent aromatic heterocyclic group represented by $Ar^3$ is usually 2 to 60, preferably 4 to 60, and more preferably 4 to 20. The divalent aromatic heterocyclic group represented by $Ar^3$ may have a substituent. Examples of substituents that the divalent aromatic heterocyclic group represented by $Ar^3$ may have include a halogen atom, an alkyl group, an aryl group, an alkoxy group, an aryloxy group, an alkylthio group, an arylthio group, a monovalent heterocyclic group, a substituted amino group, an acyl group, an imine residue, an amide group, an acidimide group, a substituted oxycarbonyl group, an alkenyl group, an alkynyl group, a cyano group, and a nitro group.

Examples of the divalent aromatic heterocyclic group represented by $Ar^3$ include groups represented by the following Formulas (101) to (185).

[Chem. 8]

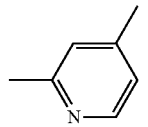
(101)

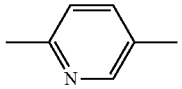
(102)

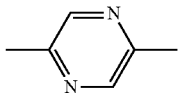
(103)

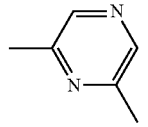
(104)

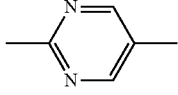
(105)

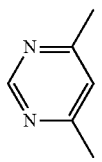
(106)

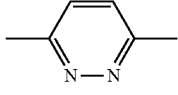
(107)

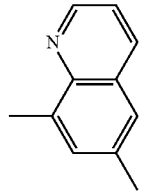
(108)

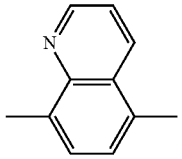
(109)

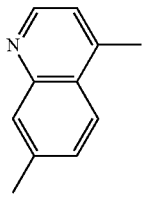
(110)

(111) 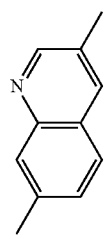
(112) 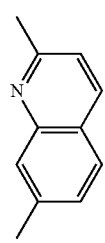
(113) 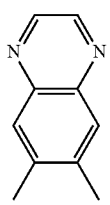
(114) 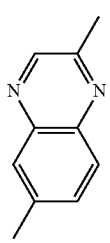
(115) 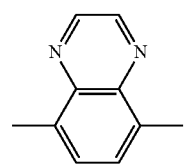
[Chem. 9]
(116) 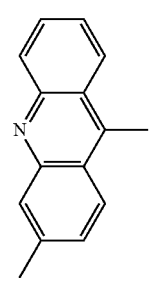
(117) 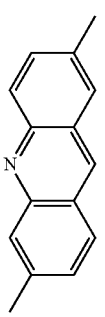
(118) 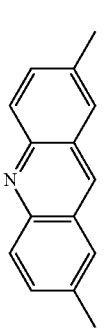
(119) 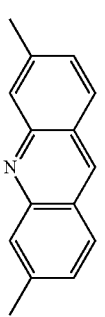
(120) 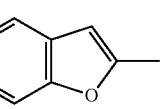
(121) 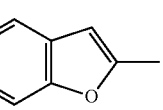
(122) 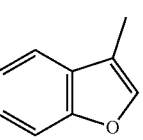
(123) 
(124) 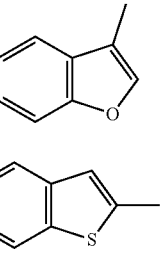

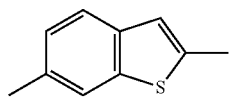 (125)
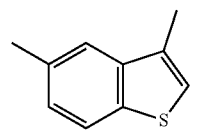 (126)
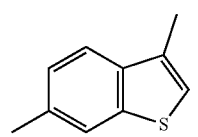 (127)
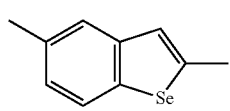 (128)
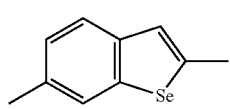 (129)
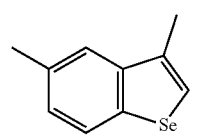 (130)
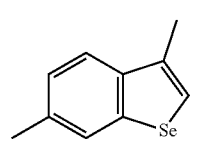 (131)
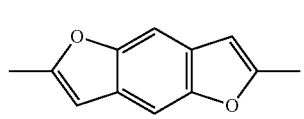 (132)
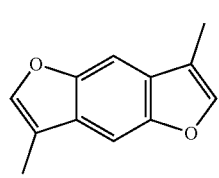 (133)
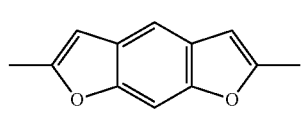 (134)
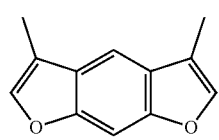 (135)
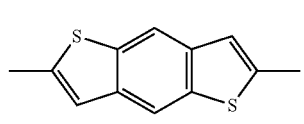 (136)
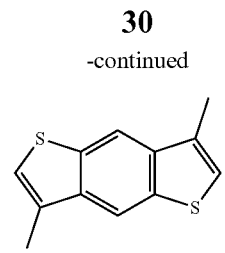 (137)
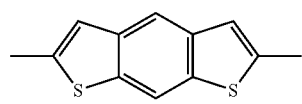 (138)
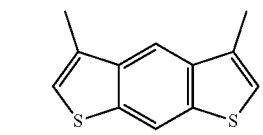 (139)
[Chem. 10]
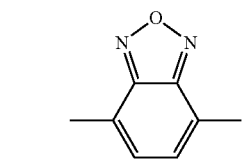 (140)
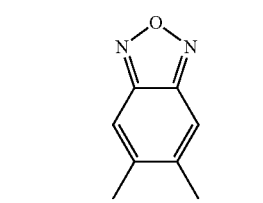 (141)
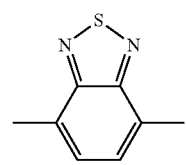 (142)
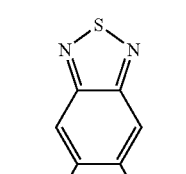 (143)
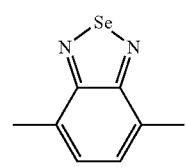 (144)

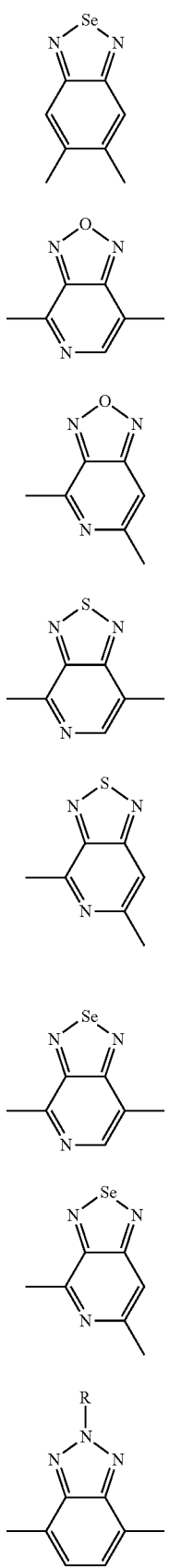
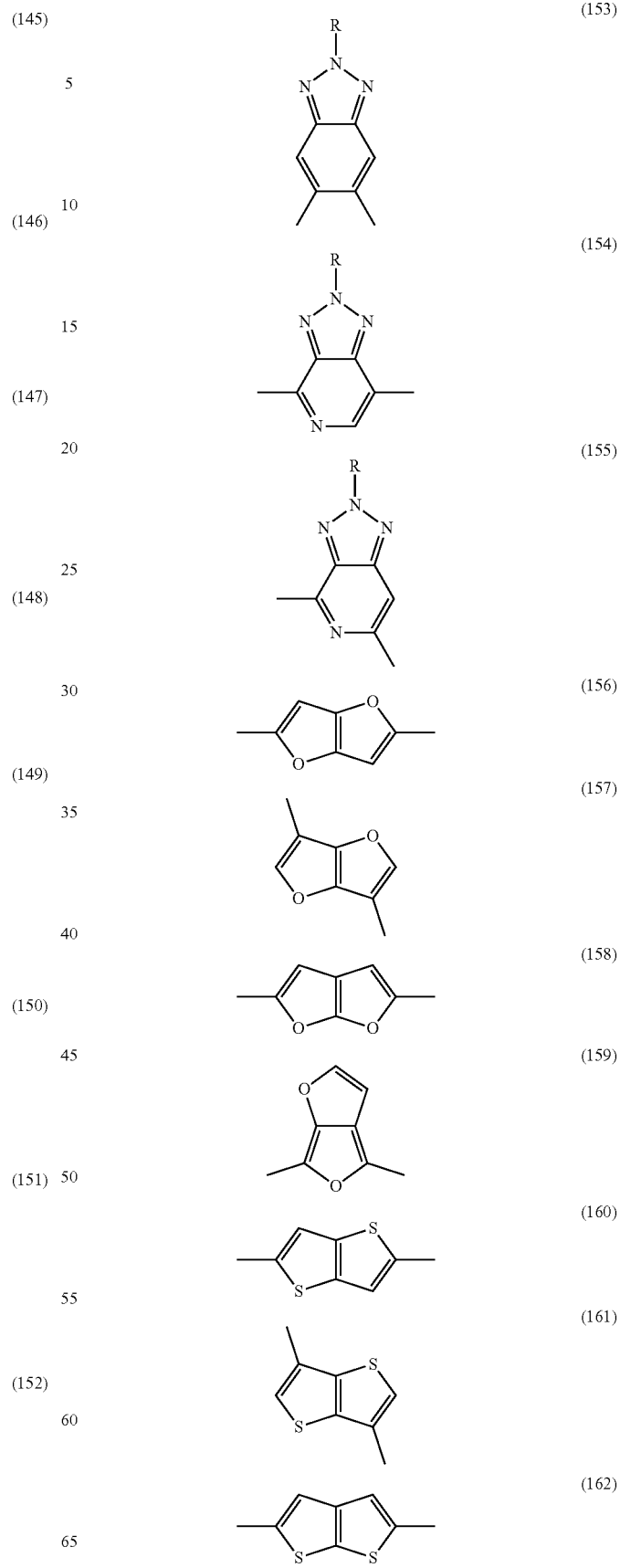

(163) 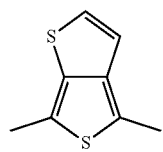
(164) 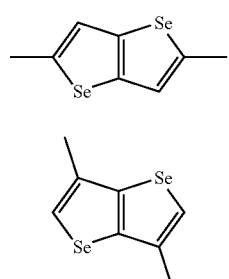
(165)
(166) 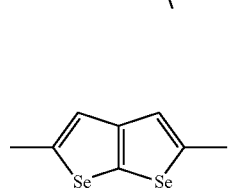
(167) 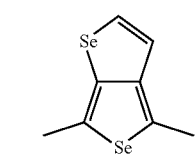
[Chem. 11]
(168) 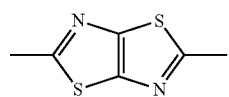
(169) 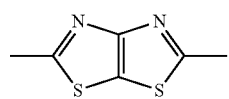
(170) 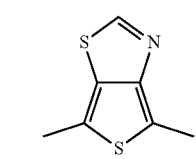
(171) 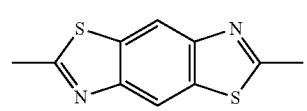
(172) 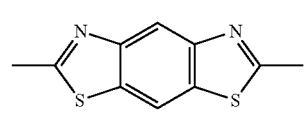
(173) 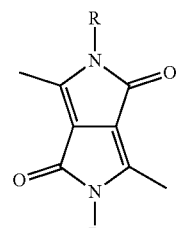
(174) 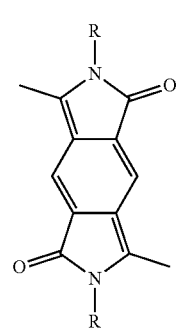
(175) 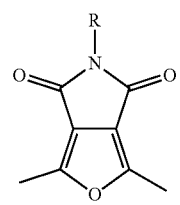
(176) 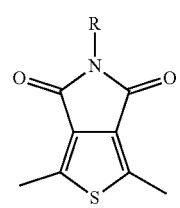
(177) 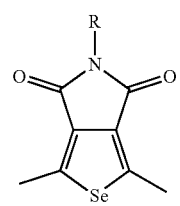
(178) 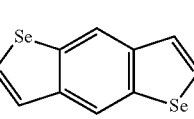
(179) 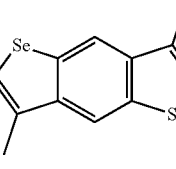
(180) 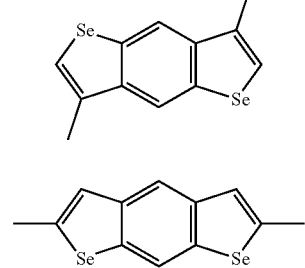

(181)

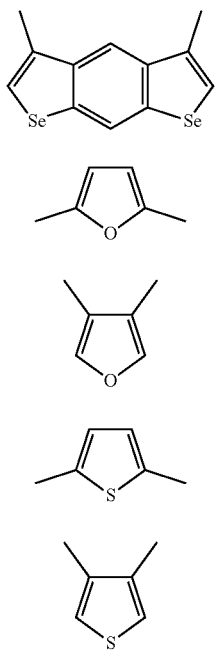

(182)

(183)

(184)

(185)

In the Formulas (101) to (185), R has the same meaning as described above. In a case where there are a plurality of Rs, the plurality of Rs may be the same or different from each other.

As the constituent unit represented by the Formula (II), constituent units represented by the following Formulas (II-1) to (II-6) are preferable.

[Chem. 12]

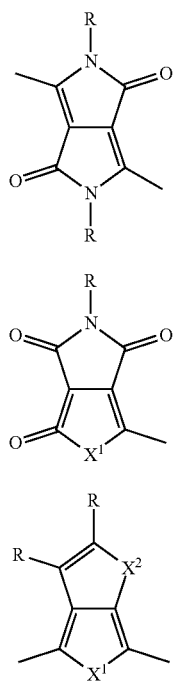

(II-1)

(II-2)

(II-3)

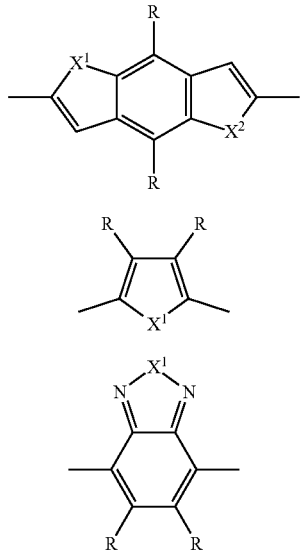

(II-4)

(II-5)

(II-6)

In Formulas (II-1) to (II-6), $X^1$ and $X^2$ each independently represent an oxygen atom or a sulfur atom, and R has the same meaning as described above. In a case where there are a plurality of Rs, the plurality of Rs may be the same or different from each other.

From the viewpoint of availability of the raw material compound, it is preferable that both $X^1$ and $X^2$ in the Formulas (II-1) to (II-6) are sulfur atoms.

The polymer compound which is the p-type semiconductor material may have two or more kinds of constituent units of Formula (I), and may have two or more kinds of constituent units of Formula (II).

In order to improve the solubility in the solvent, the polymer compound which is the p-type semiconductor material may have a constituent unit represented by the following Formula (III).

[Chem. 13]

$$—Ar^4—$$ (III)

In Formula (III), $Ar^4$ represents an arylene group.

The arylene group represented by $Ar^4$ means a remaining atomic group obtained by removing two hydrogen atoms from the aromatic hydrocarbon which may have a substituent. Aromatic hydrocarbons also include compounds in which two or more selected from the group consisting of a compound having a fused ring, an independent benzene ring, and a fused ring are bonded directly or via a divalent group such as a vinylene group.

Examples of the substituents that the aromatic hydrocarbon may have include the same substituents as those exemplified as the substituents that the heterocyclic compound may have.

The number of carbon atoms in a portion of the arylene group excluding the substituent is usually 6 to 60, and preferably 6 to 20. The number of carbon atoms of the arylene group including the substituent is usually about 6 to 100.

Examples of the arylene group include a phenylene group (for example, the following Formulas 1 to 3), a naphthalenediyl group (for example, the following Formulas 4 to 13), an anthracene-diyl group (for example, the following Formulas 14 to 19), a biphenyl-diyl group (for example, the following Formulas 20 to 25), a terphenyl-diyl group (for example, the following Formulas 26 to 28), a fused ring compound group (for example, the following Formulas 29 to 35), a fluorene-diyl group (for example, the following Formulas 36 to 38), and a benzofluorene-diyl group (for example, the following Formulas 39 to 46).

[Chem. 14]

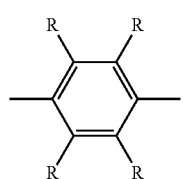

1

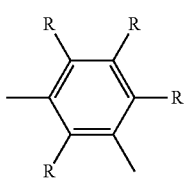

2

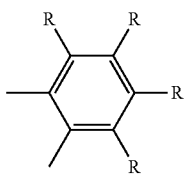

3

[Chem. 15]

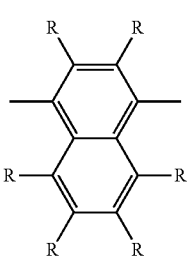

4

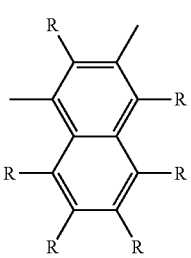

5

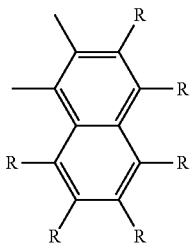

6

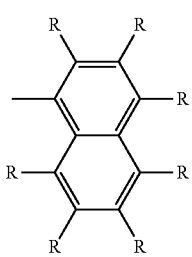

7

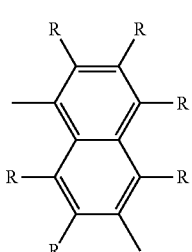

8

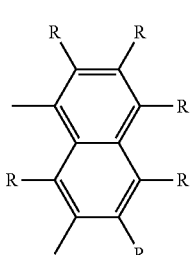

9

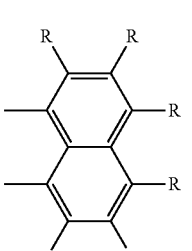

10

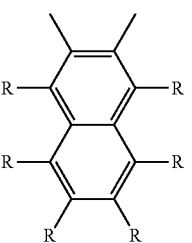

11

[Chem. 16]
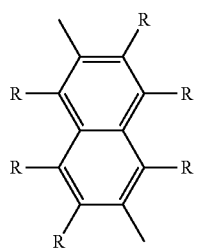 12
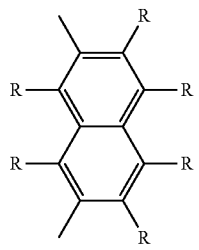 13
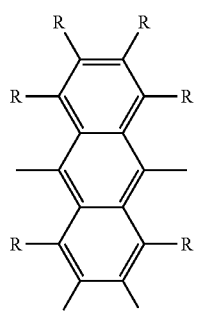 14
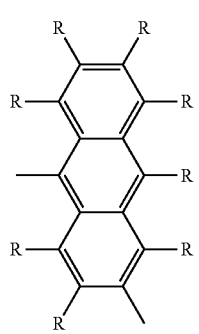 15
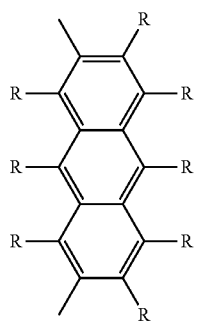 16
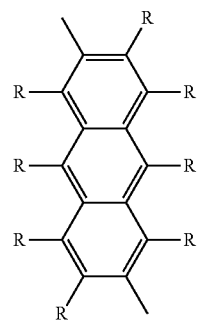 17
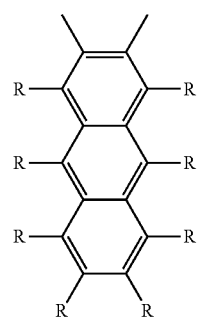 18
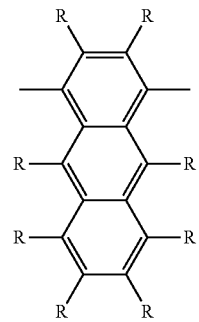 19
[Chem. 17]
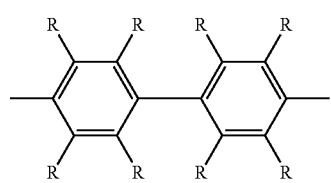 20
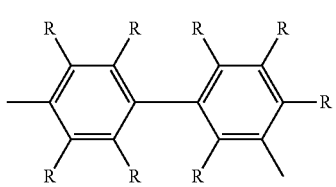 21
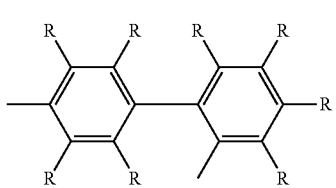 22

-continued
23
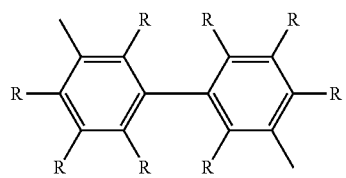
24
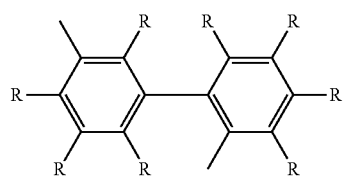
25
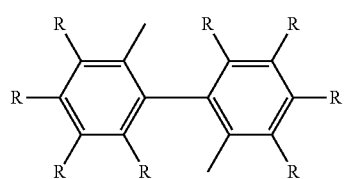
[Chem. 18]
26
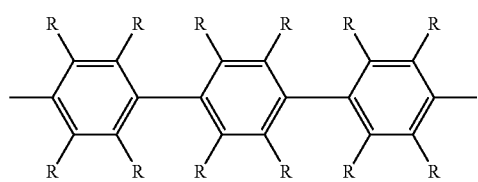
27
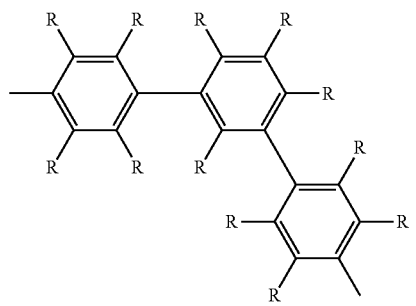
28
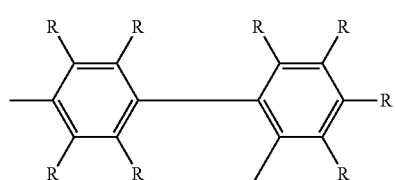
[Chem. 19]
29
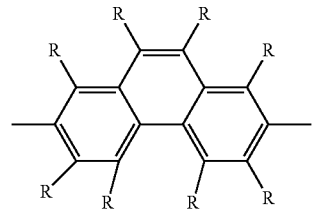
30
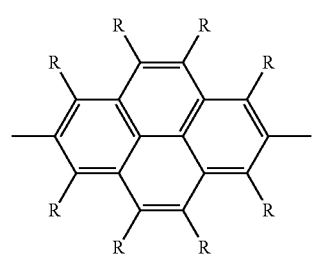
31
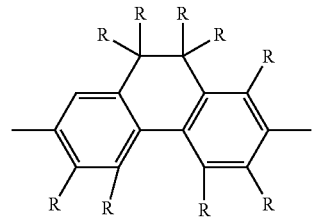
32
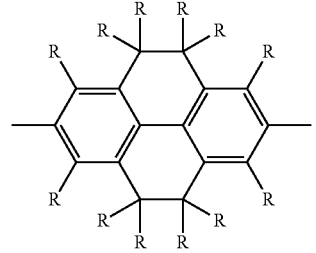
33
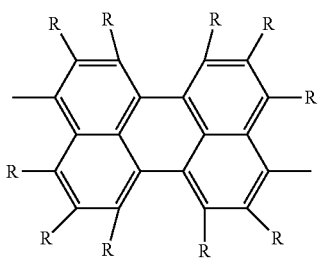
34
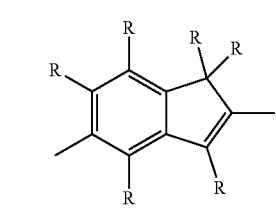

35

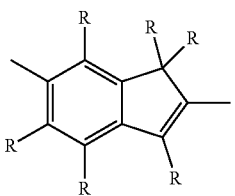

[Chem. 20]

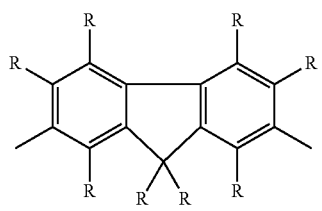
36

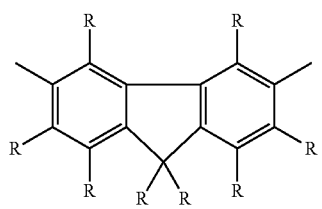
37

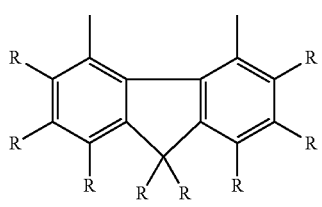
38

[Chem. 21]

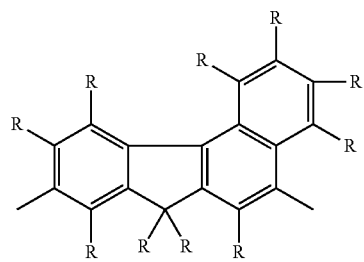
39

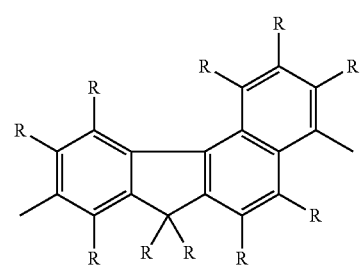
40

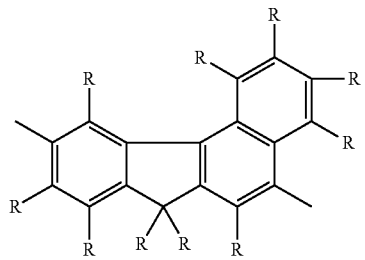
41

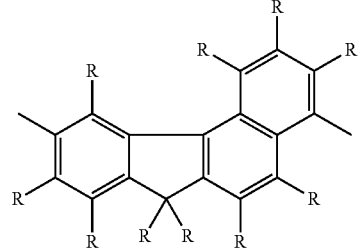
42

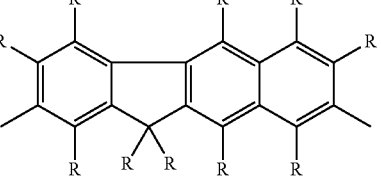
43

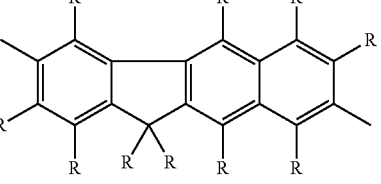
44

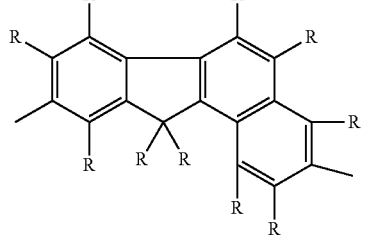
45

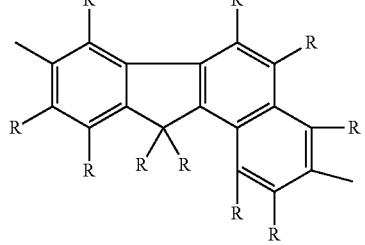
46

In Formulas 1 to 46, R has the same meaning as described above. In a case where there are a plurality of Rs, the plurality of Rs may be the same or different from each other.

The constituent unit constituting the polymer compound, which is a p-type semiconductor material, may be a constituent unit in which two or more types selected from the constituent unit represented by Formula (I), the constituent unit represented by Formula (II), and the constituent unit represented by Formula (III) are combined and connected to each other.

In a case where the polymer compound as a p-type semiconductor material has the constituent unit represented by Formula (I) and/or the constituent unit represented by Formula (II), assuming that the amount of all the constituent units contained in the polymer compound is 100 mol %, the total amount of the constituent unit represented by Formula (I) and the constituent unit represented by Formula (II) is usually 20 to 100 mol %, and in order to improve charge transport properties as a p-type semiconductor material, it is preferably 40 to 100 mol %, and more preferably 50 to 100 mol %.

Specific examples of the polymer compound as a p-type semiconductor material include polymer compounds represented by the following Formulas P-1 to P-6 (polymer compound P-1 to polymer compound P-6).

[Chem. 22]

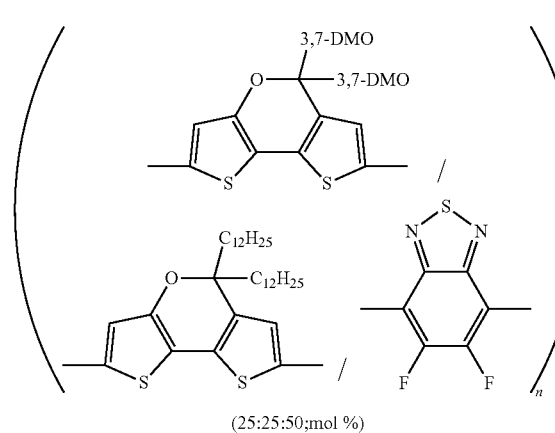

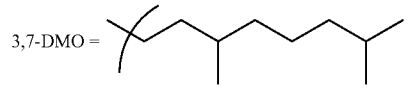

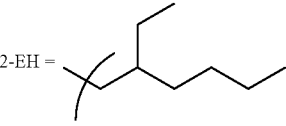

-continued

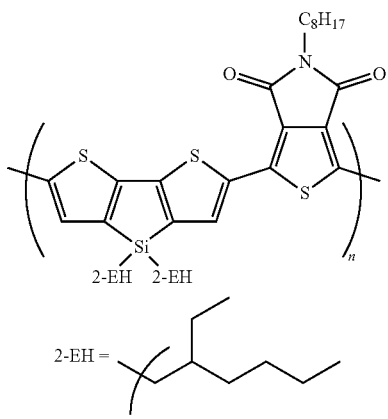

[Chem. 23]

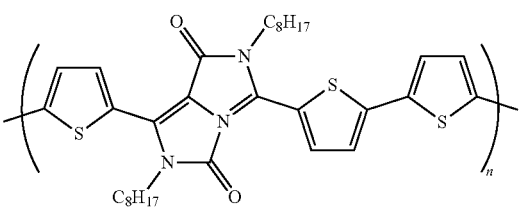

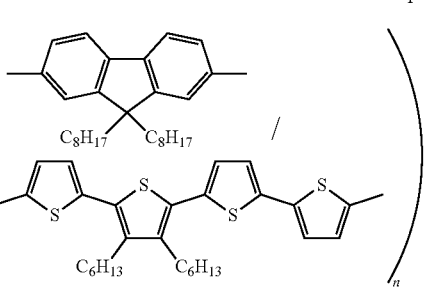

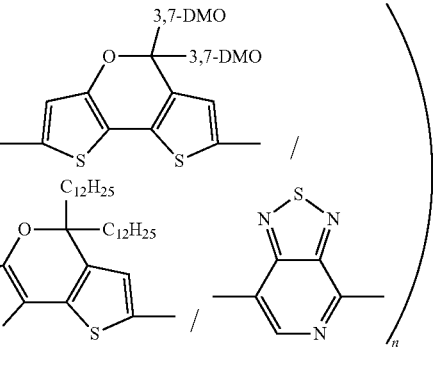

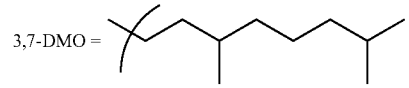

The coating liquid for forming an active layer may contain only one type of p-type semiconductor material, or may contain two or more types in optional ratio combination.

(n-Type Semiconductor Material)

The n-type semiconductor material can be appropriately selected as a material in which the value obtained by subtracting the absolute value of LUMO of the n-type semiconductor material from the work function of the surface of the active layer in contact with the negative electrode side surface is 0.0 to 0.5 eV. Examples of the absolute value of LUMO of the n-type semiconductor material include 2.0 to 10.0 eV, preferably 3.0 to 7.5 eV, and more preferably 4.0 to 5.0 eV. LUMO of the n-type semiconductor material can be evaluated, for example, by the method described in Adv. Mater., 18, 789-794 (2006).

The n-type semiconductor material is preferably a fullerene derivative. The fullerene derivative means a compound in which at least a part of fullerene ($C_{60}$ fullerene, $C_{70}$ fullerene, and $C_{84}$ fullerene) is modified.

Examples of fullerene derivatives include compounds represented by the following Formulas (N-1) to (N-4).

[Chem. 24]

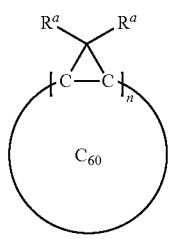

(N-1)

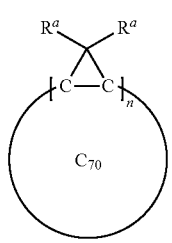

(N-2)

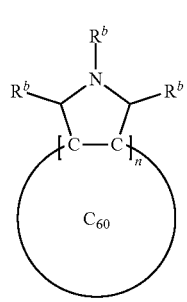

(N-3)

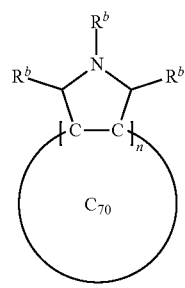

(N-4)

In Formulas (N-1) to (N-4), n represents an integer of 1 to 2, and parentheses indicate that the structure enclosed in parentheses exists in the number indicated by n. $R^a$ represents an alkyl group, an aryl group, a monovalent heterocyclic group, or a group having an ester structure. A plurality of $R^a$s may be the same or different from each other. $R^b$ represents an alkyl group or an aryl group. A plurality of $R^b$s may be the same or different from each other.

Examples of the group having an ester structure represented by $R^a$ include a group represented by the following Formula (19).

[Chem. 25]

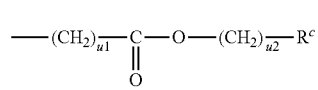

(19)

In Formula (19), u1 represents an integer from 1 to 6. u2 represents an integer from 0 to 6. Re represents an alkyl group, an aryl group, or a monovalent heterocyclic group.

Examples of $C_{60}$ fullerene derivatives include the following compounds.

[Chem. 26]

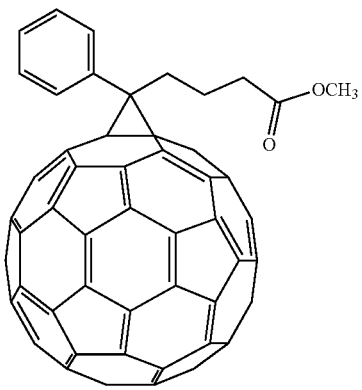

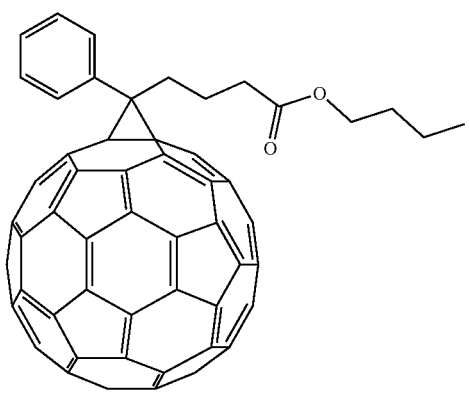
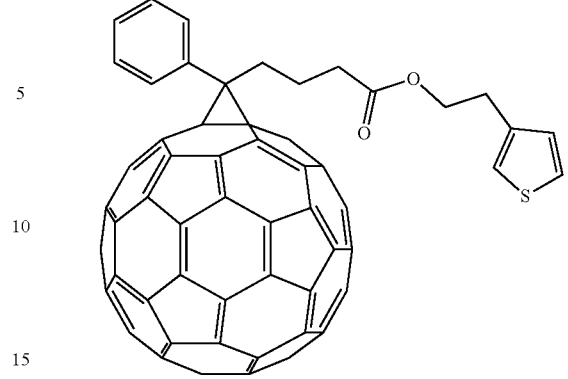
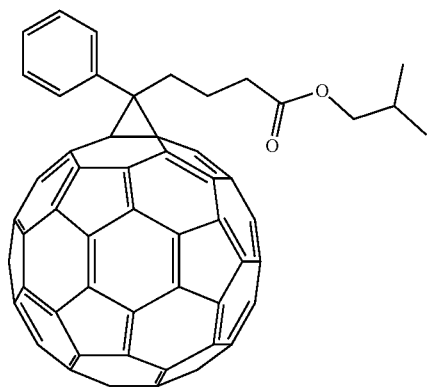
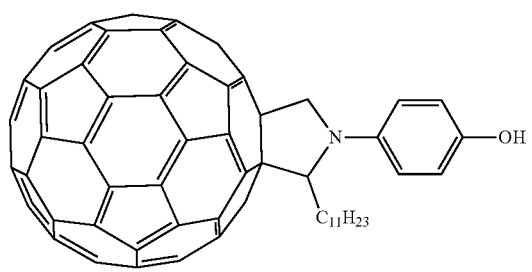
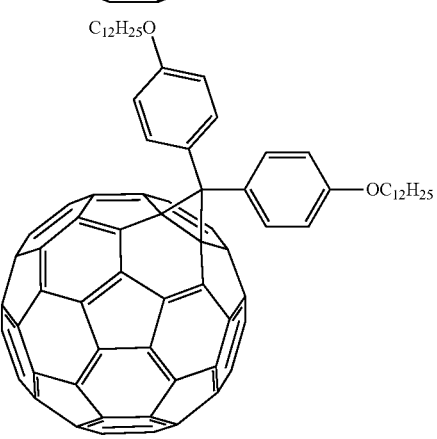
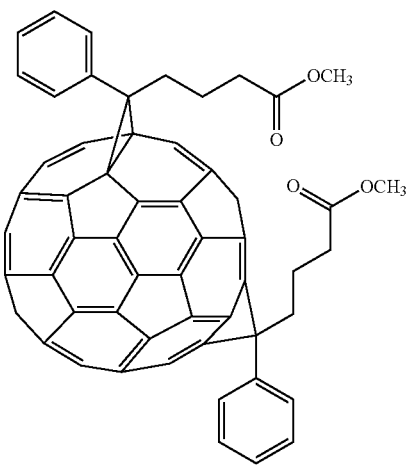
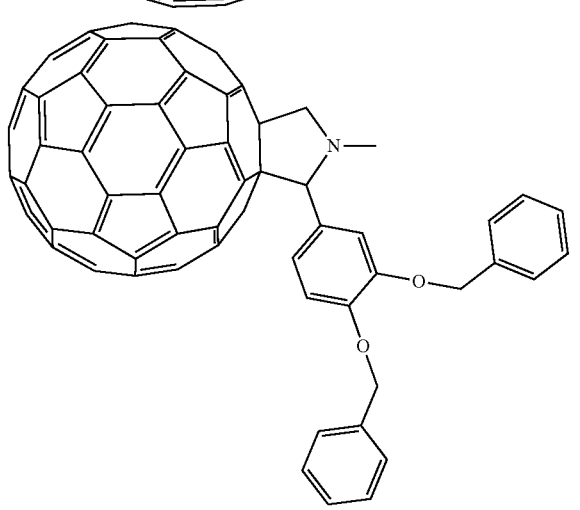
Suitable specific examples of the $C_{60}$ fullerene derivative include [6,6]-phenyl-C61 butyric acid methyl ester (C60PCBM, [6,6]-Phenyl C61 butyric acid methyl ester), bis(1-[3-(methoxycarbonyl) propyl]-1-phenyl)-[6,6]C62 (bisC60PCBM, and Bis(1-[3-(methoxycarbonyl) propyl]-1-phenyl)-[6,6]C62).
Specific examples of the $C_{70}$ fullerene derivative include compounds represented by the following formula.

[Chem. 27]

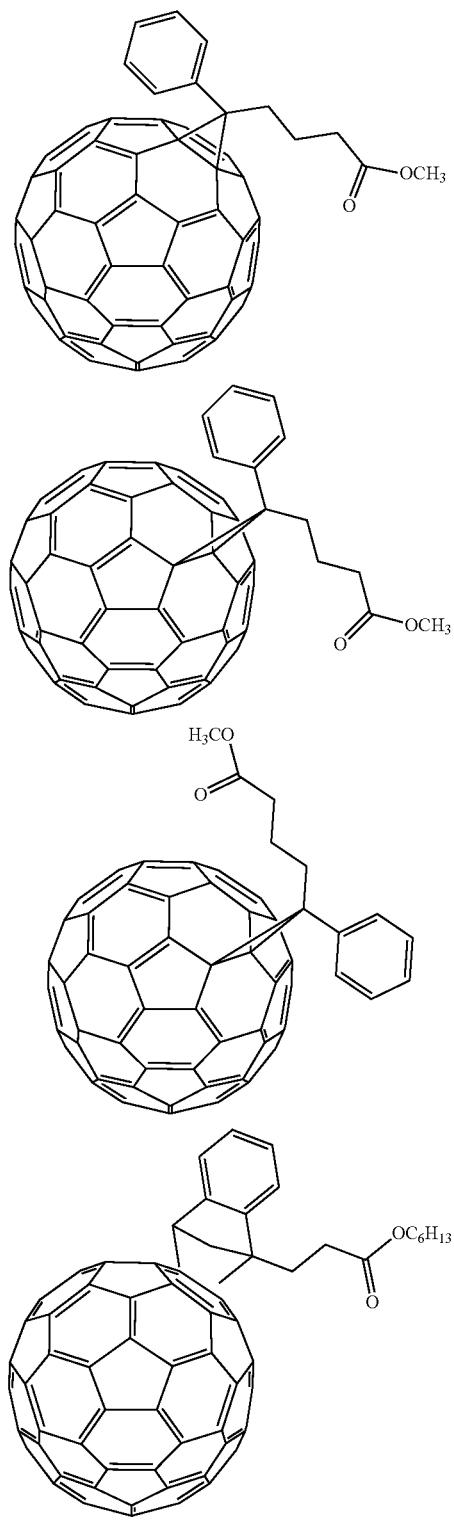

Suitable specific examples of the $C_{70}$ fullerene derivative include [6,6]-phenyl-C71 butyric acid methyl ester (C70PCBM, [6,6]-Phenyl-C71-butyric acid methyl ester), and inden C70 propionic acid hexyl ester (C70IPH, indene-C70-propionic acid hexyl ester).

Specific examples of the C84 fullerene derivative include [6,6] phenyl-C85 butyric acid methyl ester (C84PCBM, [6,6]-Phenyl C85 butyric acid methyl ester).

The coating liquid for forming an active layer may contain only one type of n-type semiconductor material, or may contain two or more types in optional ratio combination.

(Solvent)

The coating liquid for forming an active layer may contain only one type of solvent, or may contain two or more types in optional ratio combination. In a case where the coating liquid for forming an active layer contains two or more kinds of solvents, the main solvent (referred to as a first solvent), which is the main component, and other additive solvents (referred to as a second solvent) added to improve the solubility are preferably contained. The first solvent and the second solvent will be described below.

(1) First Solvent

The solvent can be selected in consideration of the solubility in the selected p-type semiconductor material and the n-type semiconductor material, and the characteristics (boiling point, and the like) for corresponding to the drying conditions when forming the active layer.

The first solvent as the main solvent is preferably aromatic hydrocarbon (hereinafter, simply referred to as an aromatic hydrocarbon) which may have a substituent (alkyl group or halogen atom). The first solvent is preferably selected in consideration of the solubility of the selected p-type semiconductor material and n-type semiconductor material.

Examples of such aromatic hydrocarbons include toluene, xylene (for example, o-xylene, m-xylene, and p-xylene), trimethylbenzene (for example, mesitylene, 1,2,4-trimethylbenzene (psoidoctene)), butylbenzene (for example, n-butylbenzene, sec-butylbenzene, and tert-butylbenzene), methylnaphthalene (for example, 1-methylnaphthalene), tetralin, indan, chlorobenzene, and dichlorobenzene (o-dichlorobenzene).

The first solvent may be formed of only one type of aromatic hydrocarbon or may be formed of two or more types of aromatic hydrocarbons. The first solvent is preferably formed of only one aromatic hydrocarbon.

The first solvent is preferably one or more selected from the group consisting of toluene, o-xylene, m-xylene, p-xylene, mesitylene, pseudocumene, n-butylbenzene, sec-butylbenzene, tert-butylbenzene, methylnaphthalene, tetralin, indan, chlorobenzene, and o-dichlorobenzene, and more preferably o-xylene, pseudocumene, chlorobenzene, or o-dichlorobenzene.

(2) Second Solvent

The second solvent is preferably a solvent selected from the viewpoint of facilitating the implementation of the producing step and further improving the characteristics of the light detecting element. Examples of the second solvent include a ketone solvent such as acetone, methyl ethyl ketone, cyclohexanone, acetophenone, and propiophenone, and an ester solvent such as ethyl acetate, butyl acetate, phenyl acetate, ethyl cell solve acetate, methyl benzoate, butyl benzoate, and benzyl benzoate.

As the second solvent, acetophenone, propiophenone, or benzyl benzoate is preferable.

(3) Combination of First Solvent and Second Solvent

Suitable combinations of the first solvent and the second solvent include, for example, a combination of o-xylene and acetophenone.

(4) Weight Ratio of First Solvent and Second Solvent

The weight ratio (first solvent: second solvent) of the first solvent, which is the main solvent, to the second solvent, which is the additional solvent, is preferably in the range of 85:15 to 99:1 from the viewpoint of further improving the solubility of the p-type semiconductor material and the n-type semiconductor material.

(5) Total Weight Percentage of First Solvent and Second Solvent

When the entire weight of the coating liquid is 100% by weight, the total weight of the first solvent and the second solvent contained in the coating liquid is preferably 90% by weight or more, more preferably 92% by weight or more, and further preferably 95% by weight or more from the viewpoint of further improving the solubility of the p-type semiconductor material and the n-type semiconductor material, and it is preferably 99% by weight or less, more preferably 98% by weight or less, and further preferably 97.5% by weight or less from the viewpoint of increasing the concentration of the p-type semiconductor material and the n-type semiconductor material in the coating liquid so as to facilitate the formation of a layer having a certain thickness or more.

(6) Other Optional Solvents

The solvent may contain any solvent other than the first solvent and the second solvent. When the total weight of all the solvents contained in the coating liquid is 100% by weight, the content of other optional solvents is preferably 5% by weight or less, more preferably 3% by weight or less, and further preferably 1% by weight or less. As other optional solvents, solvents having a boiling point higher than that of the second solvent are preferable.

(Optional Components)

In addition to the first solvent, the second solvent, the p-type semiconductor material, and the n-type semiconductor material, the coating liquid may contain optional components such as an ultraviolet absorber, an antioxidant, a sensitizer for sensitizing the function of generating electric charges by the generated light, and a light stabilizer for increasing the stability from ultraviolet rays as long as the object and effect of the present invention are not impaired.

(Concentration of p-Type Semiconductor Material and n-Type Semiconductor Material in Coating Liquid)

The total concentration of the p-type semiconductor material and the n-type semiconductor material in the coating liquid is preferably 0.01% by weight or more and 20% by weight or less, more preferably 0.01% by weight or more and 10% by weight or less, further preferably 0.01% by weight or more and 5% by weight or less, and particularly preferably 0.1% by weight or more and 5% by weight or less. The p-type semiconductor material and the n-type semiconductor material may be dissolved or dispersed in the coating liquid. The p-type semiconductor material and the n-type semiconductor material are preferably at least partially dissolved, and more preferably all are dissolved.

(Preparation of Coating Liquid)

The coating liquid can be prepared by a known method. For example, coating liquid can be prepared by a method for mixing the first solvent and the second solvent are mixed to prepare a mixed solvent and adding the p-type semiconductor material and the n-type semiconductor material to the mixed solvent, and a method for adding the p-type semiconductor material to the first solvent, adding the n-type semiconductor material to the second solvent, and then mixing the first solvent and the second solvent to which each material has been added.

The first solvent, the second solvent, the p-type semiconductor material, and the n-type semiconductor material may be heated and mixed to a temperature equal to or lower than the boiling point of the solvent.

After mixing the first solvent, the second solvent, the p-type semiconductor material, and the n-type semiconductor material, the obtained mixture may be filtered using a filter, and the obtained filtrate may be used as a coating liquid. As the filter, for example, a filter formed of a fluororesin such as polytetrafluoroethylene (PTFE) can be used.

(Step of Forming Positive Electrode)

In this step, a positive electrode is formed on the active layer. In the present embodiment, the positive electrode is formed on the active layer; however, in a case where the method for producing the photoelectric conversion element includes a step of forming a hole transport layer which is an intermediate layer between the positive electrode and the active layer, the positive electrode is formed on the hole transport layer (hole injection layer).

The method for forming a positive electrode is not particularly limited. The positive electrode can be formed on the layer on which the positive electrode should be formed by forming the electrode material as described above using a vacuum deposition method, a sputtering method, an ion plating method, a plating method, a coating method, or the like.

In a case where the material of the positive electrode is polyaniline and a derivative thereof, polythiophene and a derivative thereof, nanoparticles of the conductive substance, nanowire of the conductive substance, or nanotube of the conductive substance, a negative electrode can be formed using an emulsion (emulsion), suspension (suspension), or the like containing these materials and a solvent by a coating method.

In a case where the positive electrode is formed by the coating method, the positive electrode can be formed by using a coating liquid containing a conductive substance, a metal ink, a metal paste, a low melting point metal in a molten state, or the like. Examples of the coating method of the coating liquid containing the material of the positive electrode and the solvent include the same method as that in the step of forming the active layer as described above.

Examples of the solvent contained in the coating liquid used when forming the positive electrode by the coating method include a hydrocarbon solvent such as toluene, xylene, mesitylene, tetraline, decalin, bicyclohexyl, n-butylbenzene, sec-butylbezen, and tert-butylbenzene; a halogenized saturated hydrocarbon solvent such as carbon tetrachloride, chloroform, dichloromethane, dichloroethane, chlorobutane, bromobutane, chloropentane, bromopentane, chlorohexane, bromohexane, chlorocyclohexane, and bromocyclohexane; a halogenated unsaturated hydrocarbon solvent such as chlorobenzene, dichlorobenzene, and trichlorobenzene; an ether solvent such as tetrahydrofuran and tetrahydropyran; water; and alcohol. Specific examples of the alcohol include methanol, ethanol, isopropanol, butanol, ethylene glycol, propylene glycol, butoxyethanol, and methoxybutanol. The coating liquid may contain one kind of solvent alone, may contain two or more kinds of solvents, and may contain two or more kinds of the above-described solvents.

(Step of Forming Hole Transport Layer)

The method for forming a hole transport layer in a case of forming the hole transport layer (hole injection layer) is not particularly limited. From the viewpoint of more simplifying the step of forming the hole transport layer, it is preferable to form the hole transport layer by a coating method. The hole transport layer can be formed, for example, by applying a coating liquid containing the material and solvent of the hole transport layer as described above onto the active layer.

Examples of the solvent in the coating liquid used in the coating method include water, alcohol, ketone, and hydrocarbon. Specific examples of the alcohol include methanol, ethanol, isopropanol, butanol, ethylene glycol, propylene glycol, butoxyethanol, and methoxybutanol. Specific examples of the ketone include acetone, methyl ethyl ketone, methyl isobutyl ketone, 2-heptanone, and cyclohexanone. Specific examples of the hydrocarbons include n-pentane, cyclohexane, n-hexane, benzene, toluene, xylene, tetralin, chlorobenzene, and orthodichlorobenzene. The coating liquid may contain one kind of solvent alone, may contain two or more kinds of solvents, and may contain two or more kinds of the above-exemplified solvents. The amount of the solvent in the coating liquid is preferably 1 part by weight or more and 10000 parts by weight or less, and more preferably 10 parts by weight or more and 1000 parts by weight or less with respect to 1 part by weight of the material of the hole transport layer.

Examples of the method (coating method) for applying the coating liquid containing the material of the hole transport layer and the solvent include a spin coating method, a knife coater method, a casting method, a micro gravure coating method, a gravure coating method, a bar coating method, a roll coating method, a wire bar coating method, a dip coating method, a spray coating method, a screen printing method, a flexographic printing method, an offset printing method, an ink jet printing method, a dispenser printing method, a nozzle coating method, and a capillary coating method. Among these, the spin coating method, the flexographic printing method, the ink jet printing method, and the dispenser printing method are preferable.

It is preferable to remove the solvent from the coating film by subjecting the coating film obtained by applying the coating liquid containing the material of the hole transport layer and the solvent to a heat treatment, an air-drying treatment, a reduced pressure treatment, or the like.

(Step of Forming Positive Electrode)

In this embodiment, the positive electrode is usually formed on the active layer. In a case where the method for producing the light detecting element according to the present embodiment includes a step of forming a hole transport layer, the positive electrode is formed on the hole transport layer.

The method for forming a positive electrode is not particularly limited. The positive electrode can be formed on the layer such as the active layer and the hole transport layer, on which the positive electrode should be formed, by forming the material as described above using a vacuum deposition method, a sputtering method, an ion plating method, a plating method, a coating method, or the like.

In a case where the material of the positive electrode is polyaniline and a derivative thereof, polythiophene and a derivative thereof, nanoparticles of the conductive substance, nanowire of the conductive substance, or nanotube of the conductive substance, the positive electrode can be formed using an emulsion (emulsion), suspension (suspension), or the like containing these materials and a solvent by a coating method.

In a case where the material of the positive electrode contains a conductive substance, the positive electrode can be formed by using a coating liquid containing a conductive substance, a metal ink, a metal paste, a low melting point metal in a molten state, or the like. Examples of the coating method of the coating liquid containing the material of the positive electrode and the solvent include the same method as that in the step of forming the active layer as described above.

Examples of the solvent contained in the coating liquid used when forming the positive electrode by the coating method include a hydrocarbon solvent such as toluene, xylene, mesitylene, tetraline, decalin, bicyclohexyl, n-butylbenzene, sec-butylbenzen, and tert-butylbenzene; a halogenized saturated hydrocarbon solvent such as carbon tetrachloride, chloroform, dichloromethane, dichloroethane, chlorobutane, bromobutane, chloropentane, bromopentane, chlorohexane, bromohexane, chlorocyclohexane, and bromocyclohexane; a halogenated aromatic hydrocarbon solvent such as chlorobenzene, dichlorobenzene, and trichlorobenzene; an ether solvent such as tetrahydrofuran and tetrahydropyran; water; and alcohol. Specific examples of the alcohol include methanol, ethanol, isopropanol, butanol, ethylene glycol, propylene glycol, butoxyethanol, and methoxybutanol. The coating liquid may contain one kind of solvent alone, may contain two or more kinds of solvents, and may contain two or more kinds of the above-described solvents.

EXAMPLES

Hereinafter, examples will be described in order to explain the present invention in more detail. The present invention is not limited to the examples described below.

Example 1: C60PCBM/Electron Transport Layer 1

Producing of Photoelectric Conversion Element and Evaluation Thereof
(Producing of Photoelectric Conversion Element)

An ITO thin film (negative electrode) was formed on a glass substrate with a thickness of 150 nm by a sputtering method. A surface of this glass substrate was subjected to an ozone UV treatment.

Next, a zinc oxide/isopropanol dispersion liquid (available from Avantama, trade name N-10) was applied as a coating liquid for forming an electron transport layer on an ITO thin film of a glass substrate treated with ozone UV by a spin coating method.

The glass substrate coated with the coating liquid for forming an electron transport layer was heated at 120° C. for 10 minutes using a hot plate to form the electron transport layer 1 on the ITO thin film as a negative electrode. The thickness of the electron transport layer 1 was 30 nm. The work function of the electron transport layer 1 formed here was measured (details will be described later).

Next, a polymer compound P-1 as a p-type semiconductor and C60PCBM (available from Frontier Carbon Co., Ltd., trade name: E100, LUMO level: −4.3 eV) as an n-type semiconductor were mixed at a weight ratio of 1:2, and the mixture was added to a mixed solvent of o-xylene as the first solvent and acetophenone as the second solvent (o-xylene:acetophenone=95:5 (weight ratio)), and stirred at 80° C. for 10 hours to prepare a coating liquid for forming an active layer.

The prepared coating liquid for forming an active layer was applied onto the electron transport layer of a glass substrate by the knife coater method to form a coating film. The formed coating film was dried for 5 minutes using a hot plate heated to 100° C. to form an active layer a. The thickness of the formed active layer a was 850 nm.

Next, in a resistance heating vapor deposition apparatus, molybdenum oxide (MoOx) was deposited as a hole transport layer on the formed active layer a to a thickness of about 30 nm, and a silver (Ag) layer was further formed as a positive electrode with a thickness of about 80 nm, thereby producing a photoelectric conversion element (light detecting element).

Next, a UV curable sealant was applied on a glass substrate around the produced photoelectric conversion element, the glass substrate which is the sealing substrate is bonded, and then UV light is emitted to seal the photoelectric conversion element. The planar shape of the obtained photoelectric conversion element when viewed from the thickness direction was a square of 2 mm×2 mm.

(Evaluation of Characteristics of Photoelectric Conversion Element)

Figure 4:
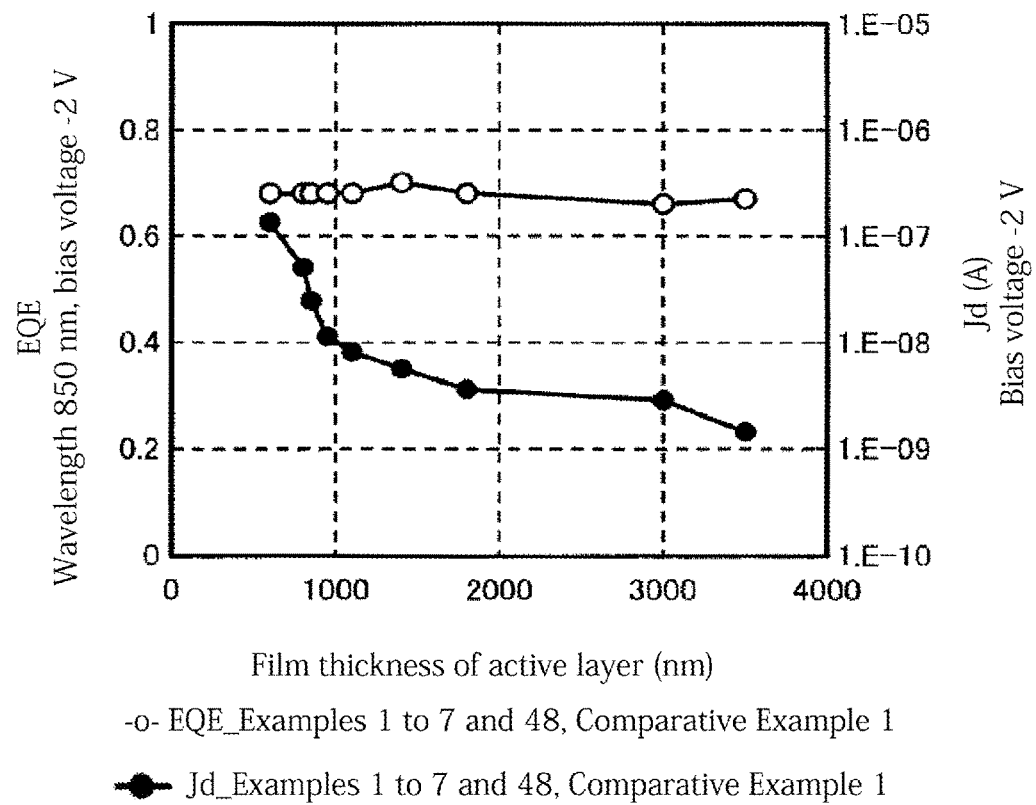
FIG. 4 is a graph illustrating a relationship of a thickness of an active layer of a light detecting element (Examples 1 to 7 and 48, Comparative Example 1) produced by using C60PCBM as an n-type semiconductor contained in an active layer, and an electron transport layer 1 as an electron transport layer, with an external quantum efficiency (EQE) and a dark current (Jd).

With a voltage of −2 V applied to the produced photoelectric conversion element, external quantum efficiency (EQE) and dark current (Jd) were measured by using a spectral sensitivity measuring device (CEP-2000, available from Bunkoukeiki Co., Ltd) and a semiconductor parameter analyzer (Agilent Technology B1500A, produced by Agilent Technologies Japan, Ltd.), respectively. The photoelectric conversion element was irradiated with light having a wavelength of 850 nm (number of photons: $1.0 \times 10^{16}$), which is the maximum absorption wavelength of the polymer compound P-1, a current value of the generated current was measured so as to obtain a measurement value of EQE by a known method. The measurement results of EQE and Jd are indicated in Table 1 and FIG. 4.

(Evaluation of Unoccupied Minimum Orbital Level (LUMO) of n-Type Semiconductor Material Contained in Active Layer)

A LUMO level of the n-type semiconductor material was estimated from cyclic voltammetry (CV) measurement values. The CV measurements were performed under the same conditions as described in Advanced Materials, Vol. 18, 2006, pp. 789-794.

CV measuring device: Electrochemical Analyzer Model 600B, available from BAS

Support Electrolyte: Dehydrated acetonitrile solution containing tetrabutylammonium hexafluorophosphate (TBAPF6, available from Aldrich) at concentration of 0.1 M.

Work electrode: Platinum foil/n-type semiconductor film (drop solution dissolved in chloroform)
Counter electrode: Platinum foil
Reference electrode: Ag/AgCl electrode
Standard potential: Ferrocene
The LUMO of the obtained C60PCBM was −4.3 eV.

(Evaluation of Work Function of Surface in Contact with Active Layer)

The work function (WF) of the electron transport layer 1 was evaluated using a Kelvin probe device using a glass substrate coated with an electron transport layer formed as described above. As the Kelvin probe device, FAC-2 of RIKEN KEIKI Co., Ltd. was used. Gold (WF is 5.1 eV) was used as a reference sample for calibration. The work function of the obtained electron transport layer 1 was 4.4 eV.

Examples 2 to 7 and 48, Comparative Example 1:
C60PCBM/Electron Transport Layer 1

A photoelectric conversion element was produced and measurement values of EQE were obtained by the method described in Example 1 except that the thickness of the active layer was 600, 800, 950, 1100, 1400, 1800, 3000, and 3500 nm. The measurement results of EQE and Jd are indicated in Table 1 and FIG. 4.

Examples 8 and 9, Comparative Example 3:
C60PCBM/Electron Transport Layer 2

Figure 5:
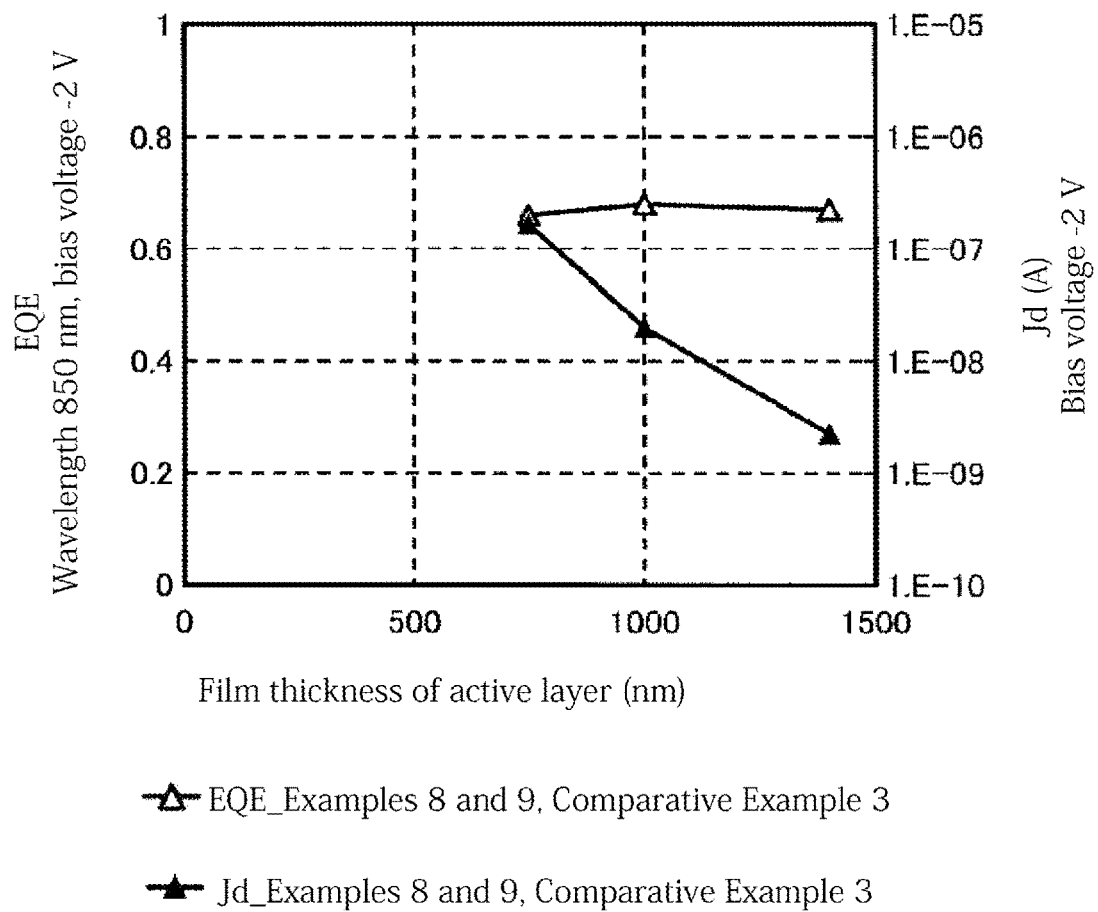
FIG. 5 is a graph illustrating a relationship of a thickness of an active layer of a light detecting element (Examples 8 and 9, Comparative Example 3) produced by using C60PCBM as an n-type semiconductor contained in an active layer, and an electron transport layer 2 as an electron transport layer, with EQE and Jd.

A photoelectric conversion element was prepared and measurement values of EQE were obtained by the method described in Example 1, except for forming an electron transport layer 2 with a thickness of 30 nm using zinc oxide/water dispersion liquid (available from Infinity PV, trade name Doped ZnO ink (water)) and setting the thickness of the active layer to 750, 1000, and 1400 nm. The measurement results of EQE and Jd are indicated in Table 1 and FIG. 5. The WF of electron transport layer 2 was 4.6 eV.

Examples 10 to 13, Comparative Example 4:
C60PCBM/Electron Transport Layer 3

Figure 6:
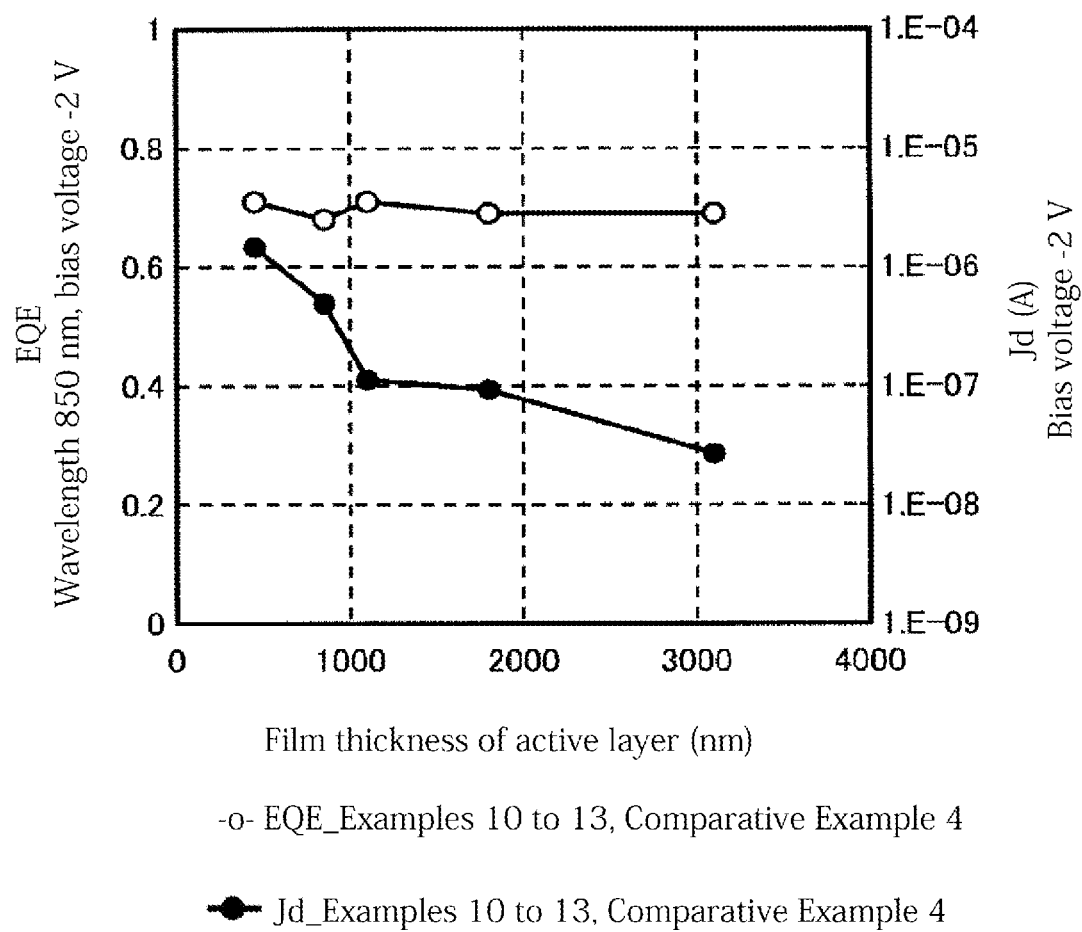
FIG. 6 is a graph illustrating a relationship of a thickness of an active layer of a light detecting element (Examples 10 to 13, Comparative Example 4) produced by using C60PCBM as an n-type semiconductor contained in an active layer and an electron transport layer 3 as an electron transport layer, with EQE and Jd.

A photoelectric conversion element was prepared and measurement values of EQE were obtained by the method described in Example 1 except that an electron transport layer 3 having a thickness of 30 nm was formed using an aluminum-doped zinc oxide/isopropanol dispersion liquid (available from Avantama, trade name N-10X), and the thickness of the active layer was set to 450, 850, 1100, 1800, and 3100 nm. The measurement results of EQE and Jd are indicated in Table 1 and FIG. 6. The WF of electron transport layer 3 was 4.4 eV.

Examples 14 to 16, Comparative Example 5:
C60PCBM/Electron Transport Layer 4

Figure 7:
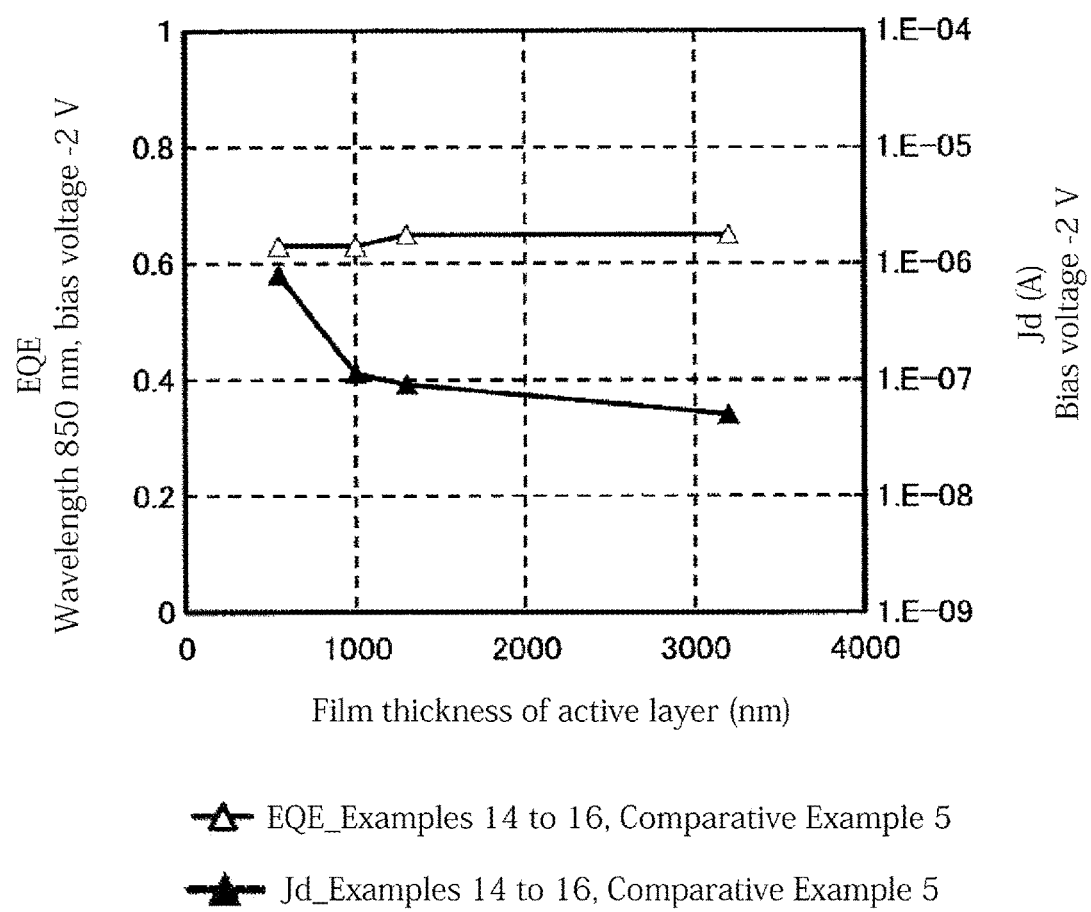
FIG. 7 is a graph illustrating a relationship of a thickness of an active layer of a light detecting element (Examples 14 to 16, Comparative Example 5) produced by using C60PCBM as an n-type semiconductor contained in an active layer and an electron transport layer 4 as an electron transport layer, with EQE and Jd.

A photoelectric conversion element was prepared and measurement values of EQE were obtained by the method described in Example 1 except that an electron transport layer 4 having a thickness of 30 nm was formed using a titanium (IV) isopropoxide/isopropanol solution (available from Aldrich) and the thickness of the active layer was set to 550, 1000, 1300, and 3200 nm. The measurement results of EQE and Jd are indicated in Table 1 and FIG. 7. The WF of electron transport layer 4 was 4.7 eV.

Examples 17 to 20: C60PCBM/Electron Transport Layer 5

Figure 8:
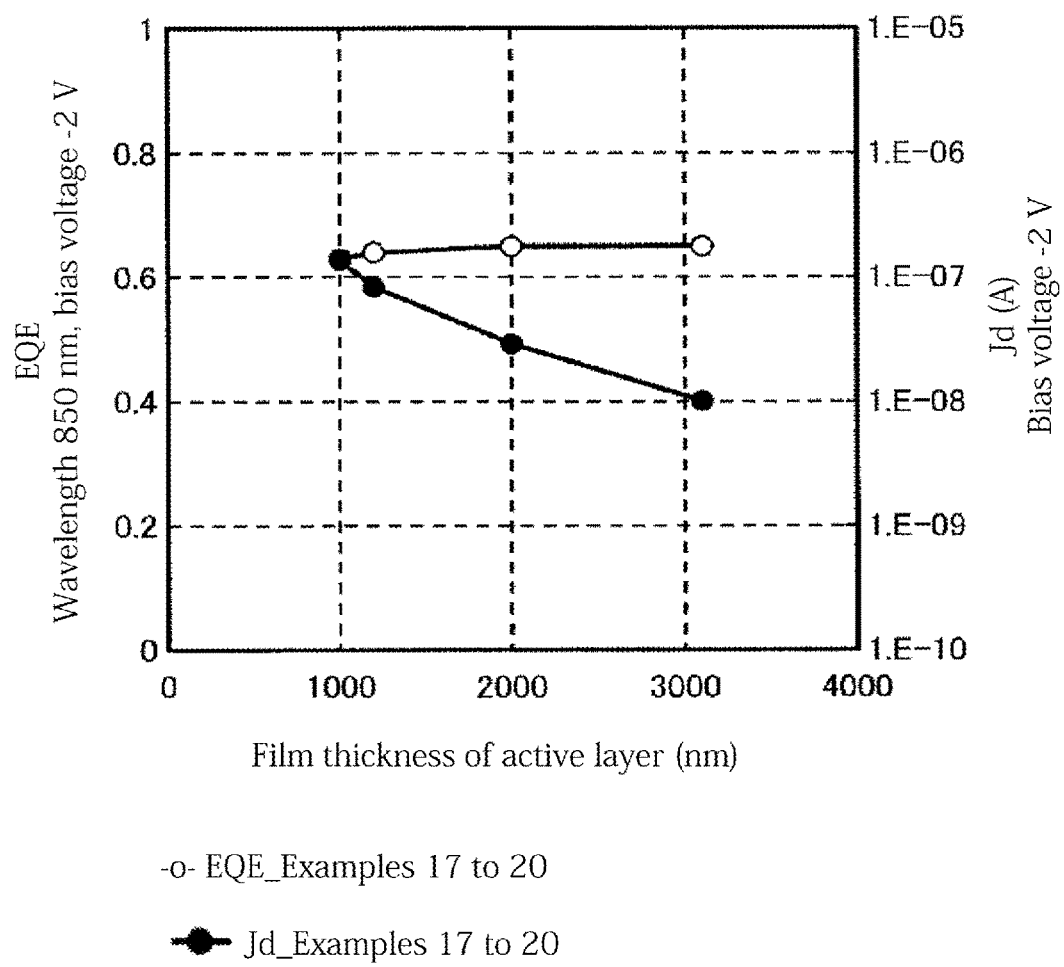
FIG. 8 is a graph illustrating a relationship of a thickness of an active layer of a light detecting element (Examples 17 to 20) produced by using C60PCBM as an n-type semiconductor contained in an active layer and an electron transport layer 5 as an electron transport layer, with EQE and Jd.

A 30 nm-thick film was formed using a solution of zinc oxide/isopropanol dispersion liquid (available from TAYCA Corporation, trade name: HTD-711Z) diluted 1/10 times with 3-pentanol. An electron transport layer 5 was obtained by subjecting the formed film to a UV ozone treatment for 2 minutes. A photoelectric conversion element was prepared and measurement values of EQE were obtained in the same manner as in Example 1 (including ozone UV treatment on the surface of the glass substrate) except that the electron transport layer 5 was used as the electron transport layer and the thickness of the active layer was set to 1000, 1200, 2000, and 3100 nm. The measurement results of EQE and Jd are indicated in Table 1 and FIG. 8. The WF of electron transport layer 5 was 4.6 eV.

Examples 21 and 22: C60PCBM/Electron Transport Layer 6

Figure 9:
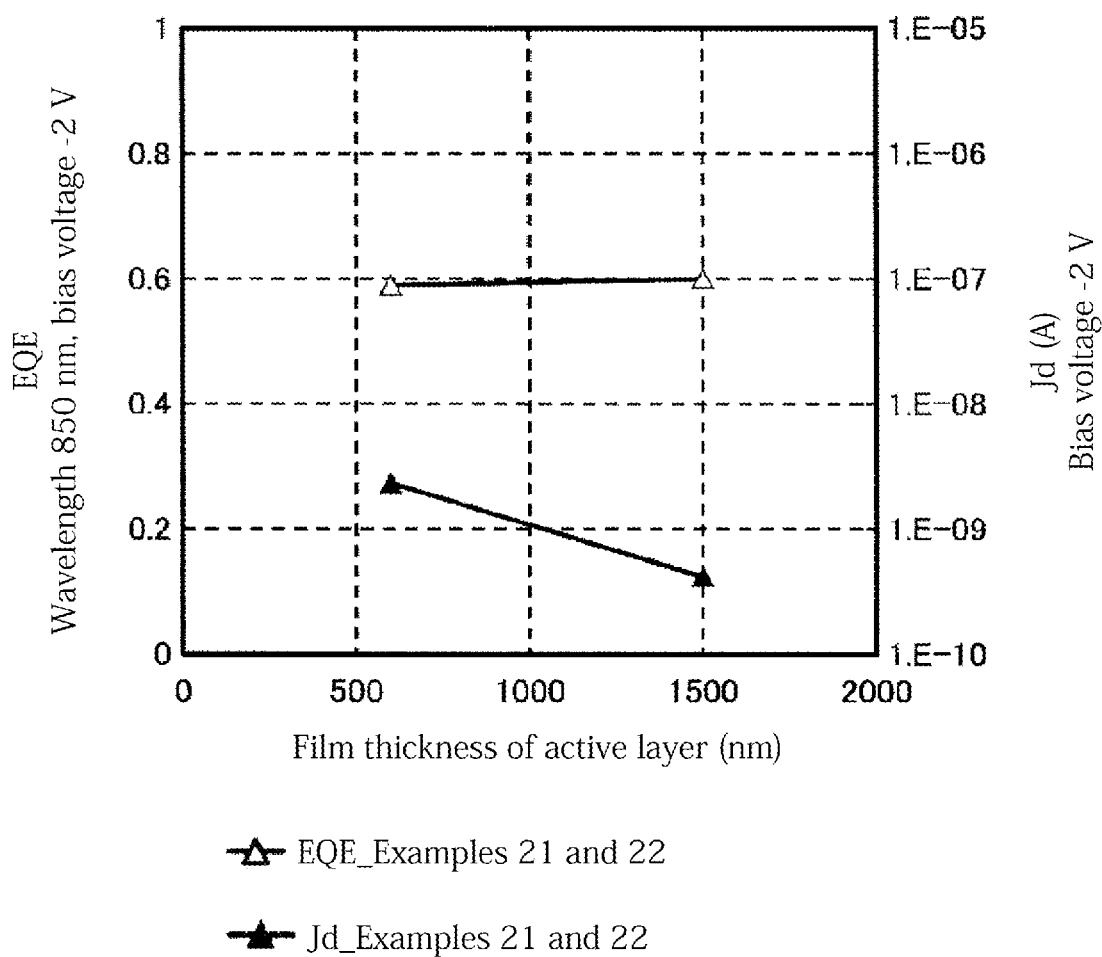
FIG. 9 is a graph illustrating a relationship of a thickness of an active layer of a light detecting element (Examples 21 and 22) produced by using C60PCBM as an n-type semiconductor contained in an active layer and an electron transport layer 6 as an electron transport layer, with EQE and Jd.

An ITO thin film (negative electrode) was formed on a glass substrate, and the surface of this glass substrate was subjected to an oxygen plasma treatment (150 W for 15 minutes), then a solution obtained by diluting an aqueous solution of polyethyleneimine ethoxylate (PEIE) (available from Aldrich, trade name polyethylene, 80% ethoxylated solution, weight average molecular weight 110000) 1/100 times with water was used as a coating liquid for forming an electron transport layer to form an electron transport layer 6 having a thickness of 5 nm. A photoelectric conversion element was prepared and measurement values of EQE were obtained in the same manner as in Example 1 except that the electron transport layer 6 was used as the electron transport layer and the thickness of the active layer was set to 600 and 1500 nm. The measurement results of EQE and Jd are indicated in Table 1 and FIG. 9. The WF of electron transport layer 6 was 4.7 eV.

Examples 23 to 25, Comparative Example 6: C60PCBM/No Electron Transport Layer

Figure 10:
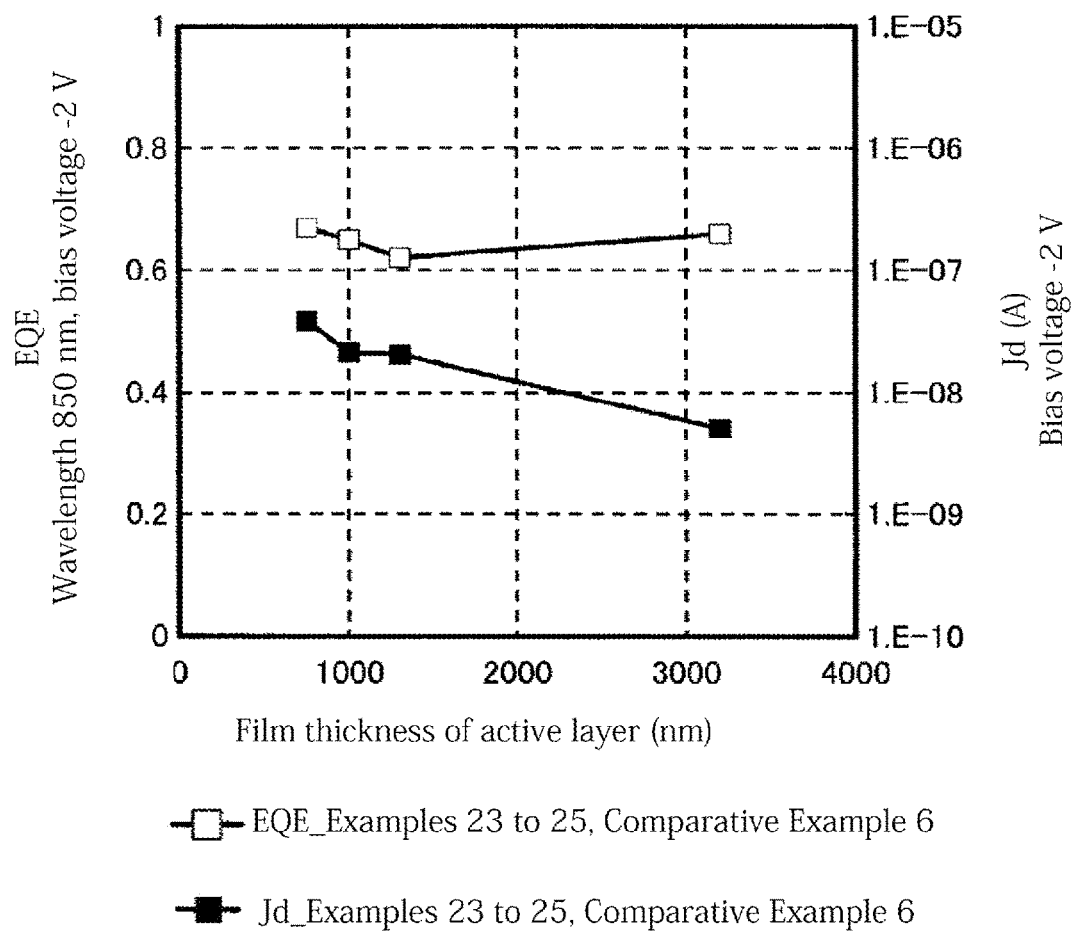
FIG. 10 is a graph illustrating a relationship of a thickness of an active layer of a light detecting element (Examples 23 to 25, Comparative Example 6) produced by using C60PCBM as an n-type semiconductor contained in an active layer without an electron transport layer, with EQE and Jd.

A photoelectric conversion element was prepared and measurement values of EQE were obtained in the same manner as in Example 1 except that an ITO thin film (negative electrode) is formed on a glass substrate, and an active layer is directly formed on the surface of the glass substrate without a treatment such as a UV ozone treatment and formation of the electron transport layer, and the thickness of the active layer was set to 750, 1000, 1300, 2000, and 3200 nm. The measurement results of EQE and Jd are indicated in Table 1 and FIG. 10. The WF on the surface of the ITO thin film was 4.8 eV.

Comparative Examples 7 to 10: C60PCBM/Electron Transport Layer 7

An ITO thin film (negative electrode) was formed on a glass substrate, and the surface of this glass substrate was subjected to an ozone UV treatment, then a solution obtained by diluting an aqueous solution of polyethyleneimine ethoxylate (PEIE) (available from Aldrich, trade name polyethylene, 80% ethoxylated solution, weight average molecular weight 110000) 1/100 times with water was used as a coating liquid for forming an electron transport layer to obtain an electron transport layer 7 having a thickness of 5 nm. A photoelectric conversion element was prepared and measurement values of EQE were obtained in the same manner as in Example 1 except that the electron transport layer 7 was used as the electron transport layer and the thickness of the active layer was set to 550, 800, 1000, and 1200 nm. The measurement results of EQE and Jd are indicated in Table 1 and FIG. 11. The WF of electron transport layer 7 was 4.2 eV.

Comparative Examples 11 to 13: C60PCBM/Electron Transport Layer 8

Figure 12:
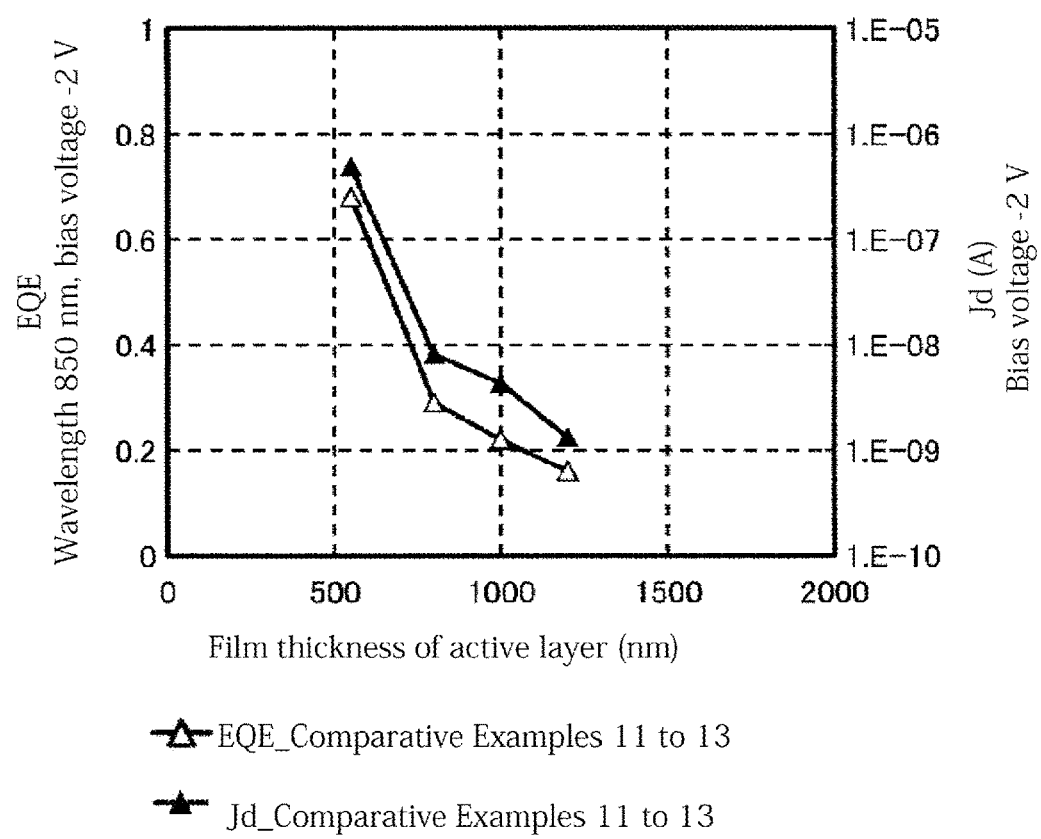
FIG. 12 is a graph illustrating a relationship of a thickness of an active layer of a light detecting element (Comparative Examples 11 to 13) produced by using C60PCBM as an n-type semiconductor contained in an active layer and an electron transport layer 8 as an electron transport layer, with EQE and Jd.

An electron transport layer 8 having a thickness of 30 nm was obtained using a solution of zinc oxide/isopropanol dispersion liquid (available from TAYCA Corporation, trade name: HTD-711Z) diluted 1/10 times with 3-pentanol as a coating liquid for forming an electron transport layer. A photoelectric conversion element was prepared and measurement values of EQE were obtained in the same manner as in Example 1 except that the electron transport layer 8 was used as the electron transport layer and the thickness of the active layer was set to 650, 750, 1100, and 1400 nm. The measurement results of EQE and Jd are indicated in Table 1 and FIG. 12. In the table, LUMO is indicated as an absolute value. The WF of electron transport layer 8 was 4.2 eV.

TABLE 1-1

Table 1
Production conditions of photoelectric conversion elements and quantum efficiency (EQE) and a dark current (Jd) obtained as a result

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Comparative Example 1 | C60PCBM | 4.3 | Electron transport layer 1 | 4.4 | 0.1 | 600 | 0.68 | $1.35 \times 10^{-07}$ |
| Example 48 | | | | | | 800 | 0.68 | $5.06 \times 10^{-08}$ |
| Example 1 | | | | | | 850 | 0.68 | $2.47 \times 10^{-08}$ |
| Example 2 | | | | | | 950 | 0.68 | $1.14 \times 10^{-08}$ |
| Example 3 | | | | | | 1100 | 0.68 | $8.19 \times 10^{-09}$ |
| Example 4 | | | | | | 1400 | 0.7 | $5.67 \times 10^{-09}$ |
| Example 5 | | | | | | 1800 | 0.68 | $3.64 \times 10^{-09}$ |
| Example 6 | | | | | | 3000 | 0.66 | $2.89 \times 10^{-09}$ |
| Example 7 | | | | | | 3500 | 0.67 | $1.46 \times 10^{-09}$ |
| Comparative Example 3 | | | Electron transport layer 2 | 4.6 | 0.3 | 750 | 0.66 | $1.66 \times 10^{-07}$ |
| Example 8 | | | | | | 1000 | 0.68 | $1.98 \times 10^{-08}$ |
| Example 9 | | | | | | 1400 | 0.67 | $2.24 \times 10^{-09}$ |
| Comparative Example 4 | | | Electron transport layer 3 | 4.4 | 0.1 | 450 | 0.71 | $1.47 \times 10^{-06}$ |
| Example 10 | | | | | | 850 | 0.68 | $4.93 \times 10^{-07}$ |
| Example 11 | | | | | | 1100 | 0.71 | $1.13 \times 10^{-07}$ |
| Example 12 | | | | | | 1800 | 0.69 | $9.30 \times 10^{-08}$ |
| Example 13 | | | | | | 3100 | 0.69 | $2.69 \times 10^{-08}$ |
| Comparative Example 5 | | | Electron transport layer 4 | 4.7 | 0.4 | 550 | 0.63 | $7.94 \times 10^{-07}$ |
| Example 14 | | | | | | 1000 | 0.63 | $1.13 \times 10^{-07}$ |
| Example 15 | | | | | | 1300 | 0.65 | $9.15 \times 10^{-08}$ |
| Example 16 | | | | | | 3200 | 0.65 | $5.05 \times 10^{-08}$ |

TABLE 1-2

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Example 17 | C60PCBM | 4.3 | Electron transport layer 5 | 4.6 | 0.3 | 1000 | 0.63 | $1.37 \times 10^{-07}$ |
| Example 18 | | | | | | 1200 | 0.64 | $8.26 \times 10^{-08}$ |
| Example 19 | | | | | | 2000 | 0.65 | $2.92 \times 10^{-08}$ |
| Example 20 | | | | | | 3100 | 0.65 | $1.01 \times 10^{-08}$ |
| Example 21 | | | Electron transport layer 6 | 4.7 | 0.4 | 600 | 0.59 | $2.33 \times 10^{-09}$ |
| Example 22 | | | | | | 1500 | 0.6 | $4.15 \times 10^{-10}$ |
| Comparative Example 6 | | | No electron transport layer | 4.8 | 0.5 | 750 | 0.67 | $3.85 \times 10^{-08}$ |
| Example 23 | | | | | | 1000 | 0.65 | $2.13 \times 10^{-08}$ |
| Example 24 | | | | | | 1300 | 0.62 | $2.06 \times 10^{-08}$ |
| Example 25 | | | | | | 3200 | 0.66 | $5.07 \times 10^{-09}$ |
| Comparative Example 7 | | | Electron transport layer 7 | 4.2 | −0.1 | 550 | 0.68 | $4.89 \times 10^{-07}$ |
| Comparative Example 8 | | | | | | 800 | 0.29 | $8.01 \times 10^{-09}$ |
| Comparative Example 9 | | | | | | 1000 | 0.22 | $4.29 \times 10^{-09}$ |
| Comparative Example 10 | | | | | | 1200 | 0.16 | $1.32 \times 10^{-09}$ |
| Comparative Example 11 | | | Electron transport layer 8 | 4.2 | −0.1 | 650 | 0.6 | $2.05 \times 10^{-07}$ |
| Comparative Example 12 | | | | | | 1100 | 0.24 | $1.63 \times 10^{-08}$ |
| Comparative Example 13 | | | | | | 1400 | 0.15 | $6.99 \times 10^{-09}$ |

Examples 26 and 27, Comparative Example 14: Bis-C60PCBM/Electron Transport Layer 7

Figure 13:
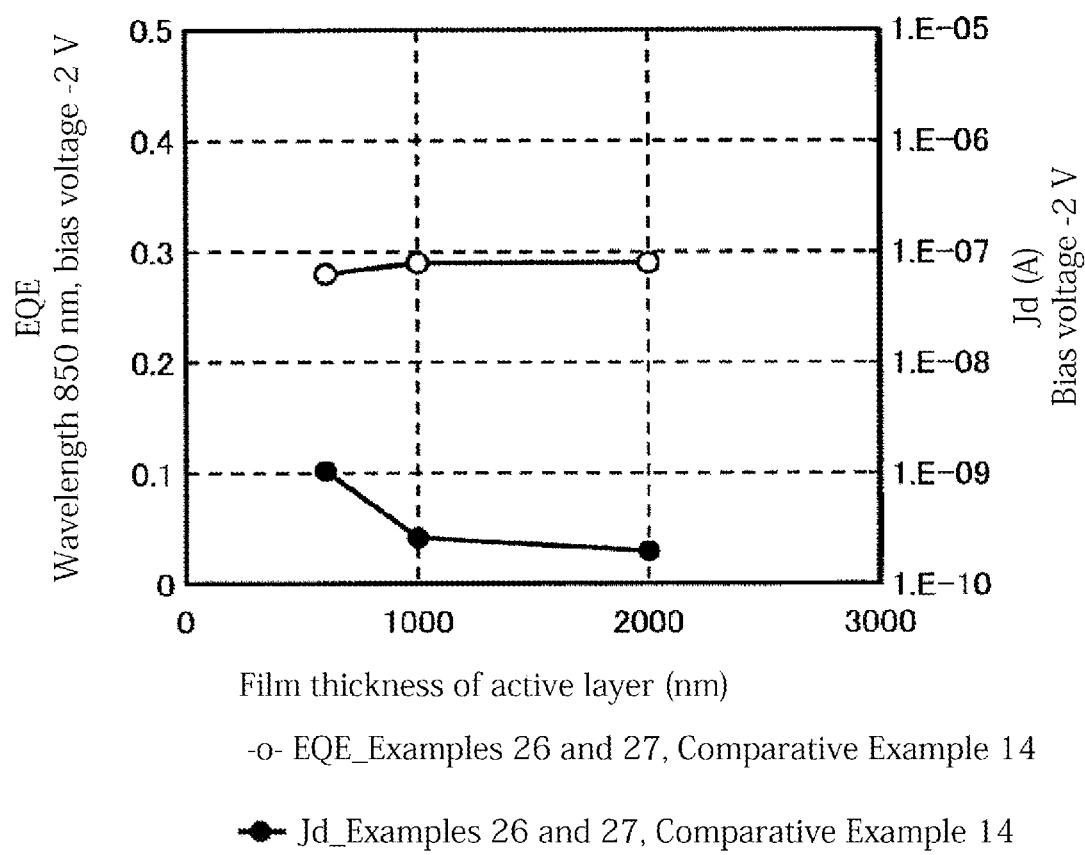
FIG. 13 is a graph illustrating a relationship of a thickness of an active layer of a light detecting element (Examples 26 and 27 and Comparative Example 14) produced by using bis-C60PCBM as an n-type semiconductor contained in an active layer and an electron transport layer 7 as an electron transport layer, with EQE and Jd.

A photoelectric conversion element was prepared and measurement values of EQE were obtained in the same manner as in Example 1 except that Bis-C60PCBM (available from Solenne, trade name: bis [C60] PCBM, LUMO level: −4.2 eV) was used as the n-type semiconductor contained in the active layer, the electron transport layer 7 was used as the electron transport layer, and the thickness of the active layer was set to 600, 1000, and 2000 nm. The measurement results of EQE and Jd are indicated in Table 2 and FIG. 13.

Examples 28 and 29, Comparative Example 15: Bis-C60PCBM/Electron Transport Layer 8

Figure 14:
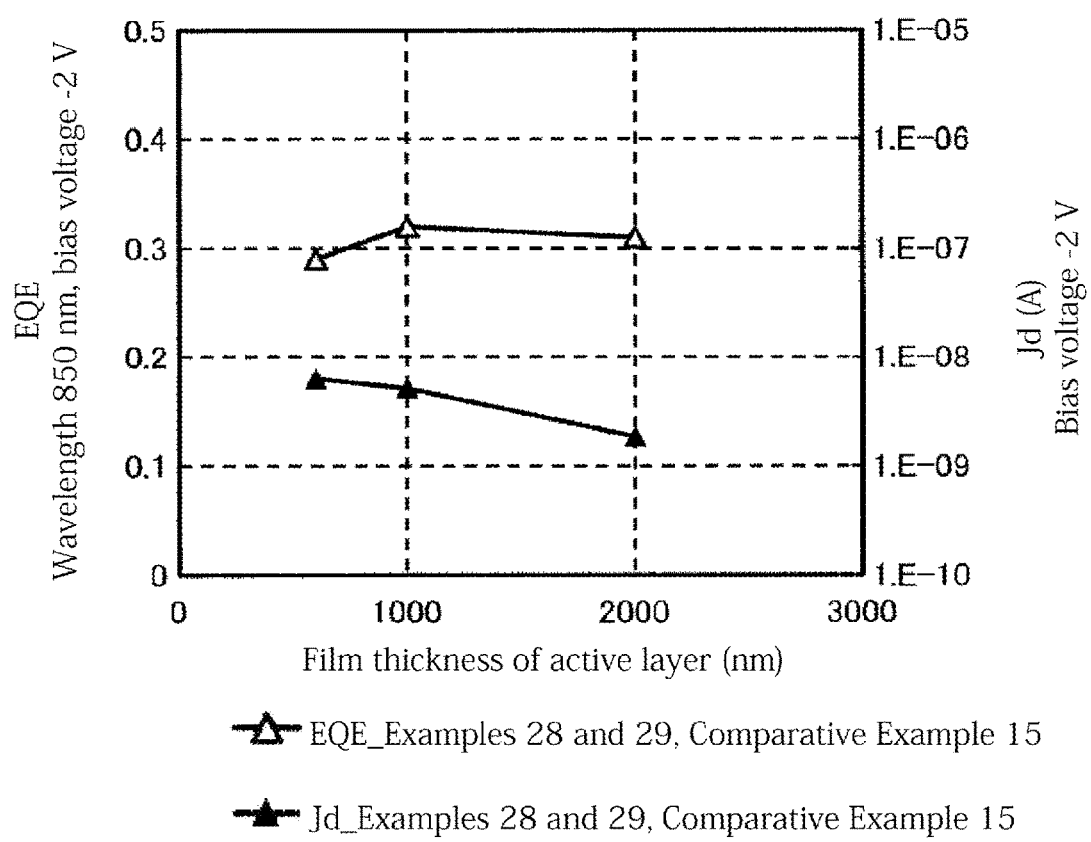
FIG. 14 is a graph illustrating a relationship of a thickness of an active layer of a light detecting element (Examples 28 and 29 and Comparative Example 15) produced by using bis-C60PCBM as an n-type semiconductor contained in an active layer and an electron transport layer 8 as an electron transport layer contained in an active layer, with EQE and Jd.

A photoelectric conversion element was prepared and measurement values of EQE were obtained in the same manner as in Example 1 except that bis-C60PCBM was used as the n-type semiconductor contained in the active layer, the electron transport layer 8 was used as the electron transport layer, and the thickness of the active layer was set to 600, 1000, and 2000 nm. The measurement results of EQE and Jd are indicated in Table 2 and FIG. 14.

Examples 30 and 31, Comparative Example 16: Bis-C60PCBM/Electron Transport Layer 1

Figure 15:
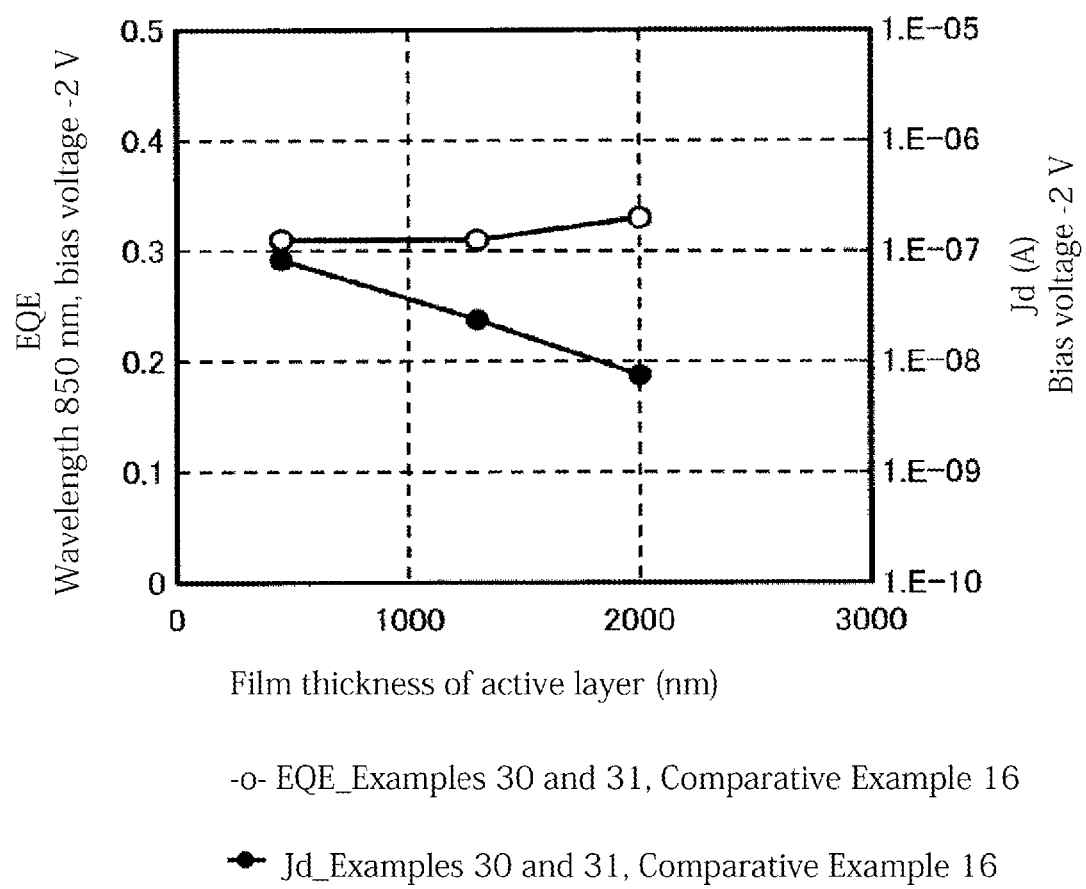
FIG. 15 is a graph illustrating a relationship of a thickness of an active layer of a light detecting element (Examples 30 and 31 and Comparative Example 16) produced by using bis-C60PCBM as an n-type semiconductor contained in an active layer and an electron transport layer 1 as an electron transport layer, with EQE and Jd.

A photoelectric conversion element was prepared and measurement values of EQE were obtained in the same manner as in Example 1 except that bis-C60PCBM was used as the n-type semiconductor contained in the active layer, the electron transport layer 1 was used as the electron transport layer, and the thickness of the active layer was set to 450, 1300, and 2000 nm. The measurement results of EQE and Jd are indicated in Table 2 and FIG. 15.

Examples 32 to 34, Comparative Example 17: Bis-C60PCBM/Electron Transport Layer 2

Figure 16:
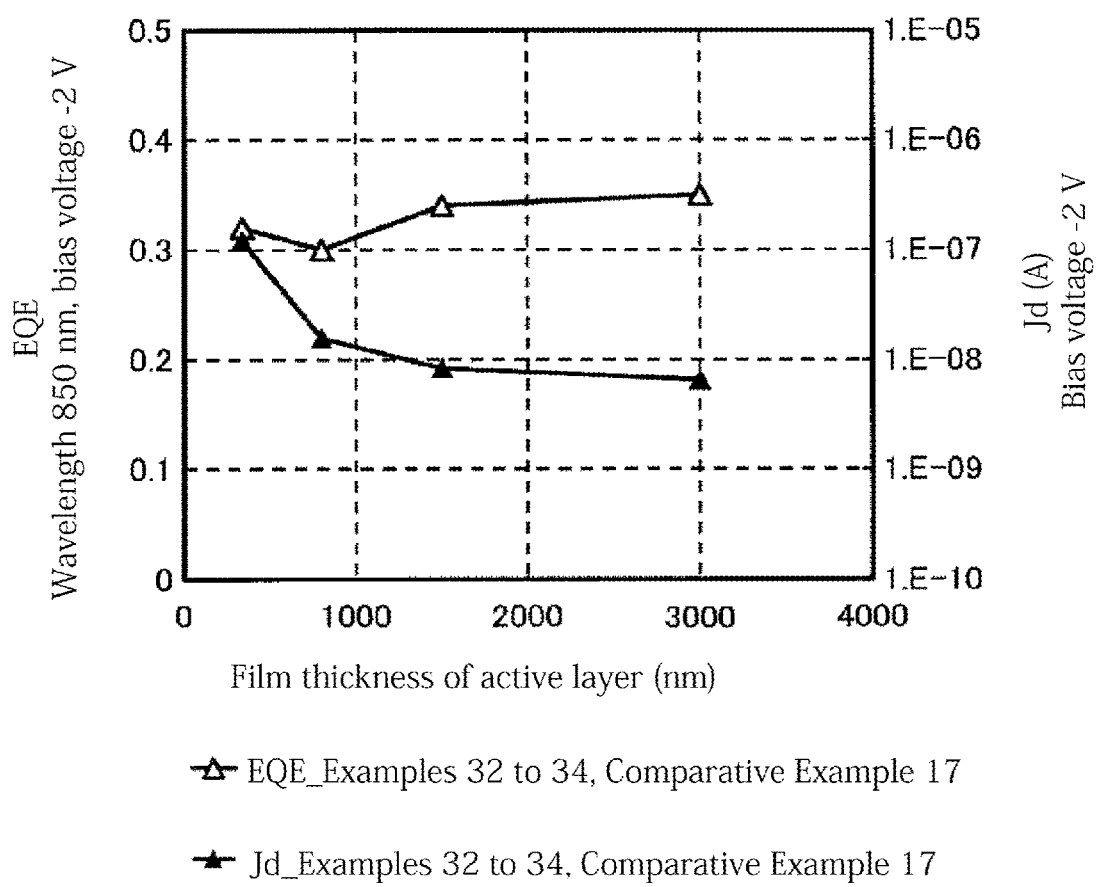
FIG. 16 is a graph illustrating a relationship of a thickness of an active layer of a light detecting element (Examples 32 to 34 and Comparative Example 17) produced by using bis-C60PCBM as an n-type semiconductor contained in an active layer and an electron transport layer 2 as an electron transport layer, with EQE and Jd.

A photoelectric conversion element was prepared and measurement values of EQE were obtained in the same manner as in Example 1 except that bis-C60PCBM was used as the n-type semiconductor contained in the active layer, the electron transport layer 2 was used as the electron transport layer, and the thickness of the active layer was set to 340, 800, 1500, and 3000 nm. The measurement results of EQE and Jd are indicated in Table 2 and FIG. 16.

Examples 35 and 36: C70IPH/Electron Transport Layer 1

Figure 17:
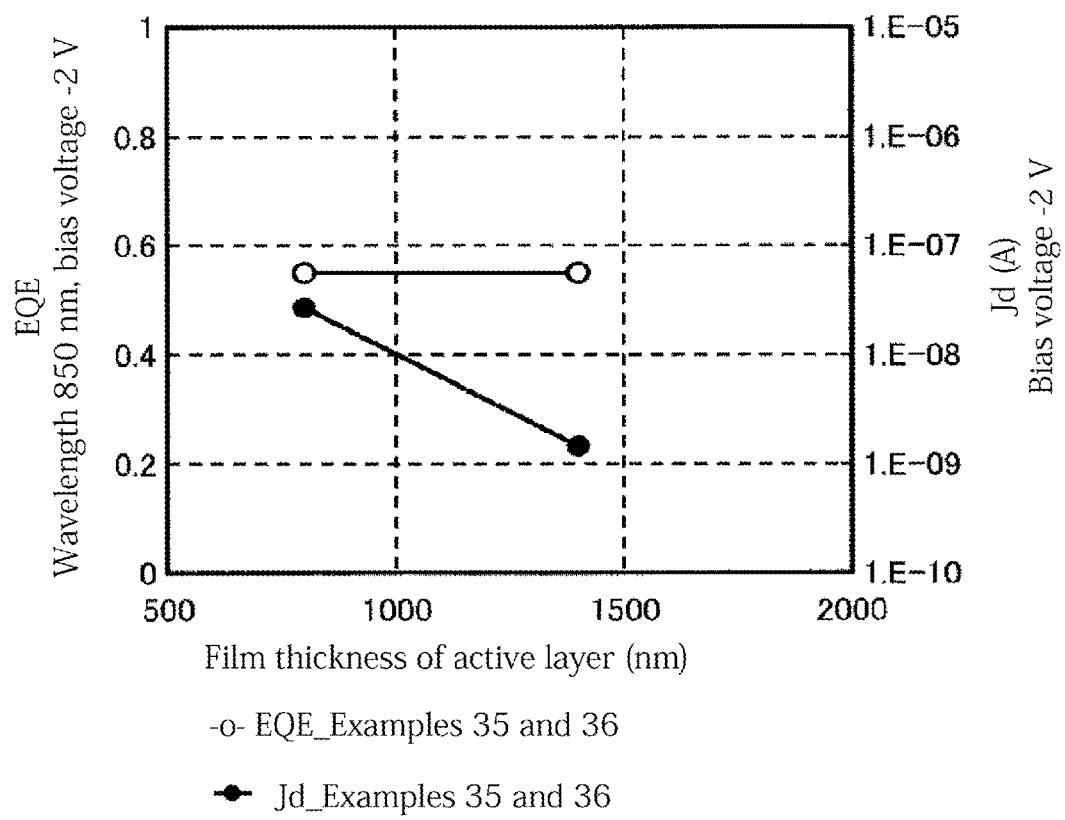
FIG. 17 is a graph illustrating a relationship of a thickness of an active layer of a light detecting element (Examples 35 and 36) produced by using C70IPH as an n-type semiconductor contained in an active layer and an electron transport layer 1 as an electron transport layer, with EQE and Jd.

A photoelectric conversion element was prepared and measurement values of EQE were obtained in the same manner as in Example 1 except that C70IPH (available from Solenne, trade name: [C70] IPH, LUMO level: −4.3 eV) was used as the n-type semiconductor contained in the active layer, the electron transport layer 1 was used as the electron transport layer, and the thickness of the active layer was set to 800 and 1400 nm. The measurement results of EQE and Jd are indicated in Table 2 and FIG. 17.

Examples 37 and 38: C70IPH/Electron Transport Layer 2

Figure 18:
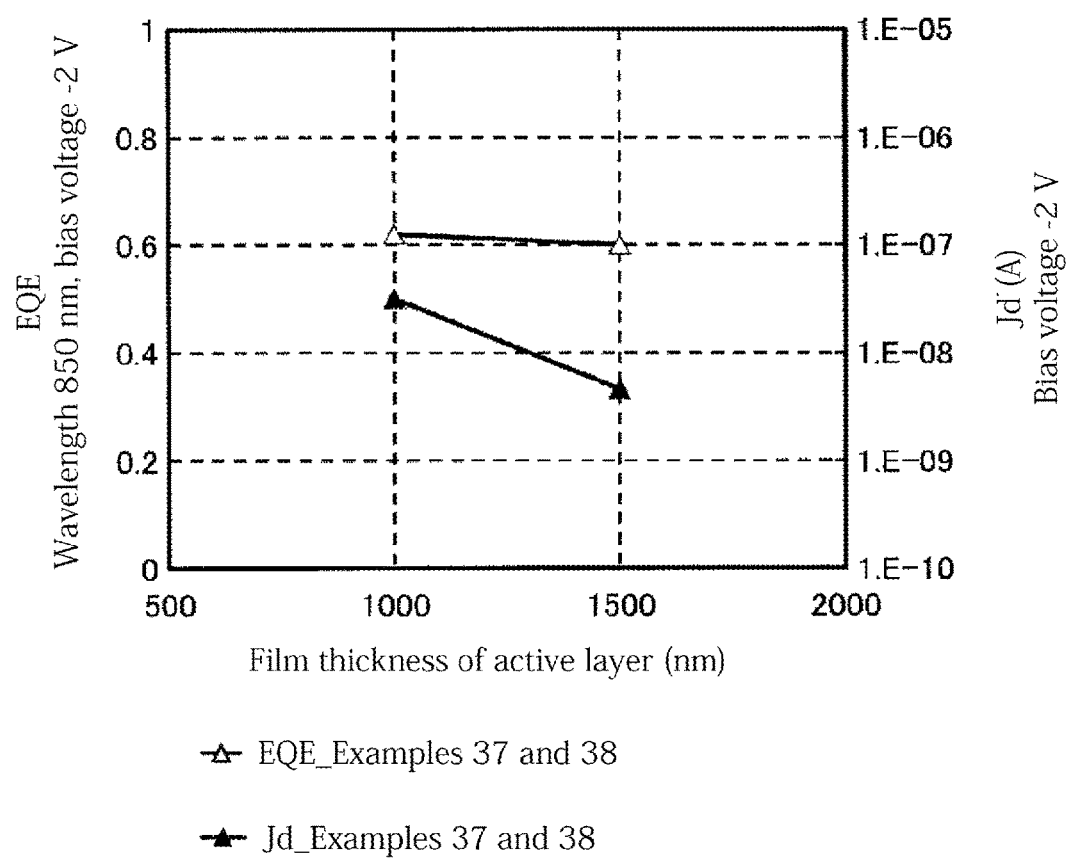
FIG. 18 is a graph illustrating a relationship of a thickness of an active layer of a light detecting element (Examples 37 and 38) produced by using C70IPH as an n-type semiconductor contained in an active layer and an electron transport layer 2 as an electron transport layer, with EQE and Jd.

A photoelectric conversion element was prepared and measurement values of EQE were obtained in the same manner as in Example 1 except that C70IPH was used as the n-type semiconductor contained in the active layer, the electron transport layer 2 was used as the electron transport layer, and the thickness of the active layer was set to 1000 and 1500 nm. The measurement results of EQE and Jd are indicated in Table 2 and FIG. 18.

Examples 39 to 41: C70IPH/No Electron Transport Layer

Figure 19:
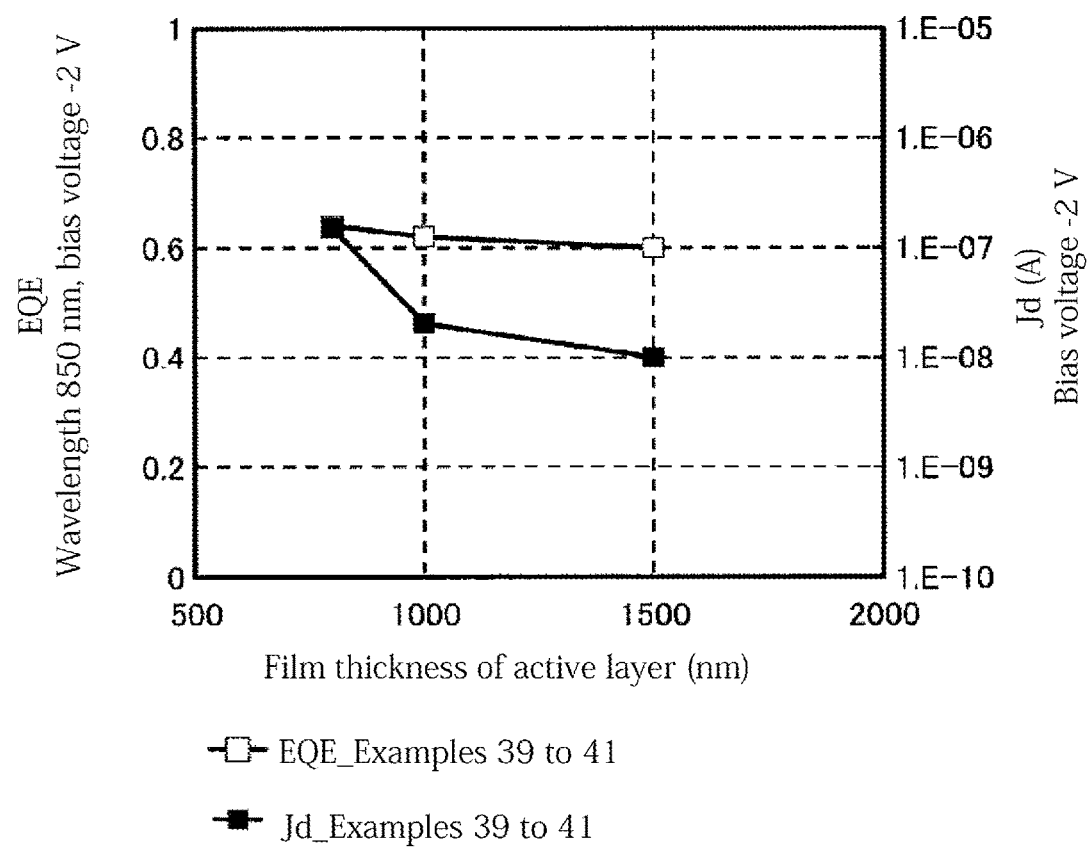
FIG. 19 is a graph illustrating a relationship of a thickness of an active layer of a light detecting element (Examples 39 to 41) produced by using C70IPH as an n-type semiconductor contained in an active layer without an electron transport layer, with EQE and Jd.

A photoelectric conversion element was prepared and measurement values of EQE were obtained in the same manner as in Example 1 except that C70IPH was used as the n-type semiconductor contained in the active layer, a glass substrate on which an ITO thin film (negative electrode) was formed was prepared, an active layer was directly formed on the surface of the ITO thin film on the surface of the glass substrate without a treatment such as a UV ozone treatment and an electron transport layer, and the thickness of the active layer was set to 800, 1000, and 1500 nm. The measurement results of EQE and Jd are indicated in Table 2 and FIG. 19.

Comparative Examples 18 to 20: C70IPH/Electron Transport Layer 7

Figure 20:
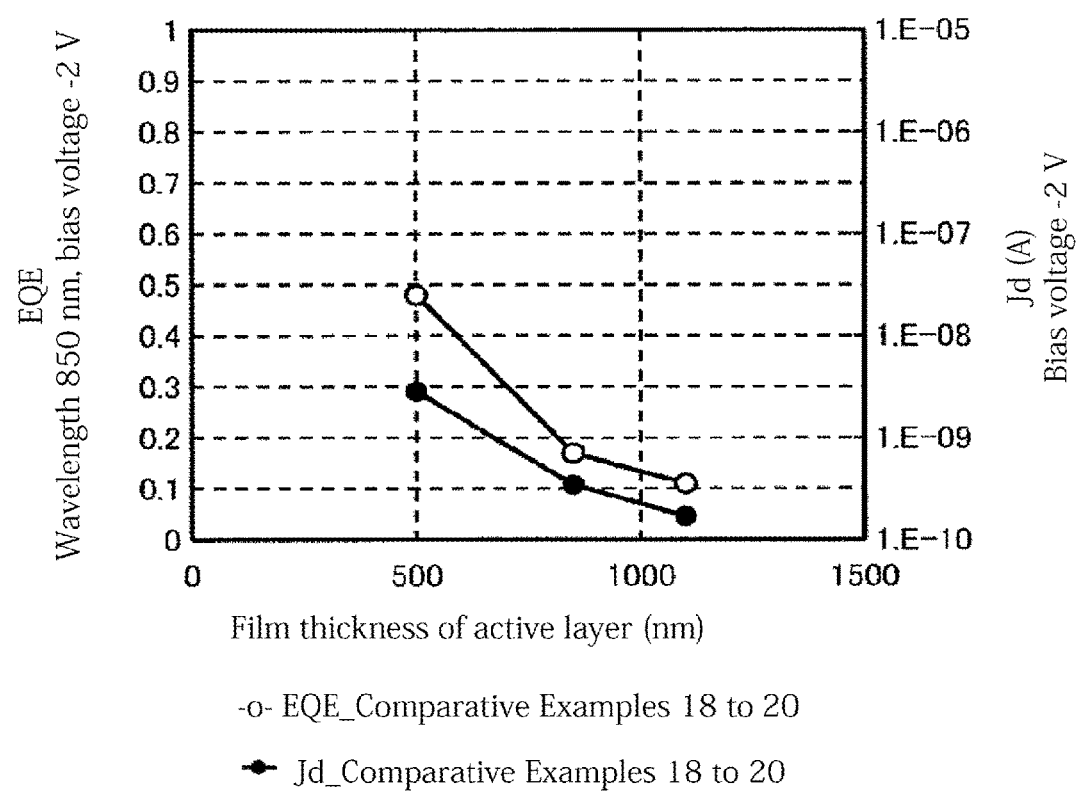
FIG. 20 is a graph illustrating a relationship of a thickness of an active layer of a light detecting element (Comparative Examples 18 to 20) produced by using C70IPH as an n-type semiconductor contained in an active layer and an electron transport layer 7 as an electron transport layer, with EQE and Jd.

A photoelectric conversion element was prepared and measurement values of EQE were obtained in the same manner as in Example 1 except that C70IPH was used as the n-type semiconductor contained in the active layer, the electron transport layer 7 was used as the electron transport layer, and the thickness of the active layer was set to 500, 850, and 1100 nm. The measurement results of EQE and Jd are indicated in Table 2 and FIG. 20.

Comparative Examples 21 to 23: C70IPH/Electron Transport Layer 8

Figure 21:
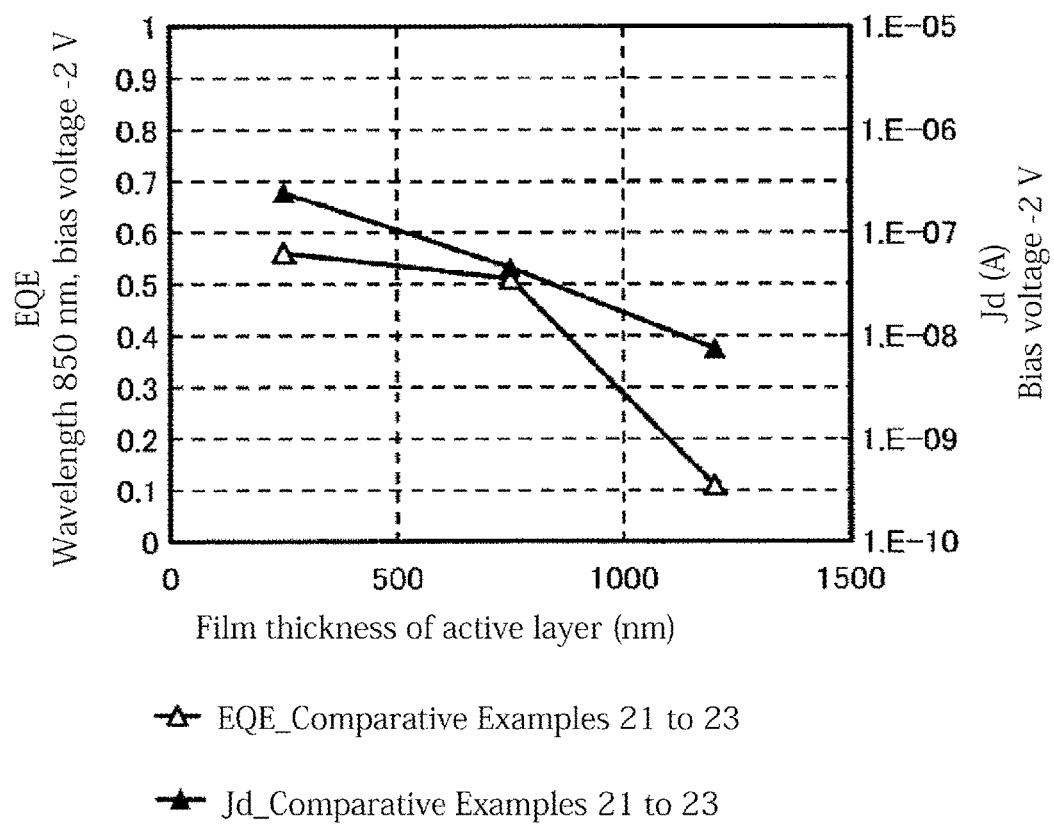
FIG. 21 is a graph illustrating a relationship of a thickness of an active layer of a light detecting element (Comparative Examples 21 to 23) produced by using C70IPH as an n-type semiconductor contained in an active layer and an electron transport layer 8 as an electron transport layer, with EQE and Jd.

A photoelectric conversion element was prepared and measurement values of EQE were obtained in the same manner as in Example 1 except that C70IPH was used as the n-type semiconductor contained in the active layer, the electron transport layer 8 was used as the electron transport layer, and the thickness of the active layer was set to 250, 750, and 1200 nm. The measurement results of EQE and Jd are indicated in Table 2 and FIG. 21.

Examples 42 and 43, Comparative Example 24: C70PCBM/Electron Transport Layer 1

Figure 22:
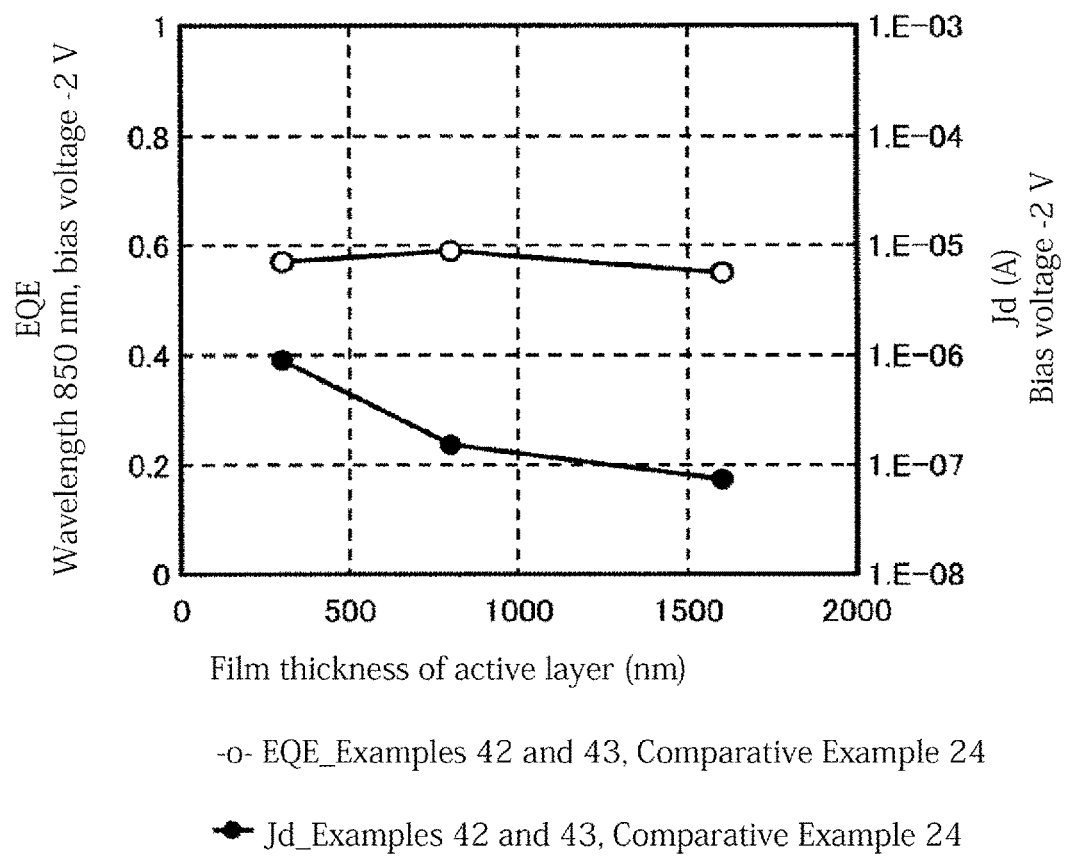
FIG. 22 is a graph illustrating a relationship of a thickness of an active layer of a light detecting element (Examples 42 and 43, Comparative Example 24) produced by using C70PCBM as an n-type semiconductor contained in an active layer and an electron transport layer 1 as an electron transport, with EQE and Jd.

A photoelectric conversion element was prepared and measurement values of EQE were obtained in the same manner as in Example 1 except that C70PCBM (available from American Dye Source, trade name: ADS71BFA, LUMO level: −4.3 eV) was used as the n-type semiconductor contained in the active layer, the electron transport layer 1 was used as the electron transport layer, and the thickness of the active layer was set to 300, 800, 1600 nm. The measurement results of EQE and Jd are indicated in Table 2 and FIG. 22.

Examples 44 and 45, Comparative Example 25: C70PCBM/Electron Transport Layer 2

Figure 23:
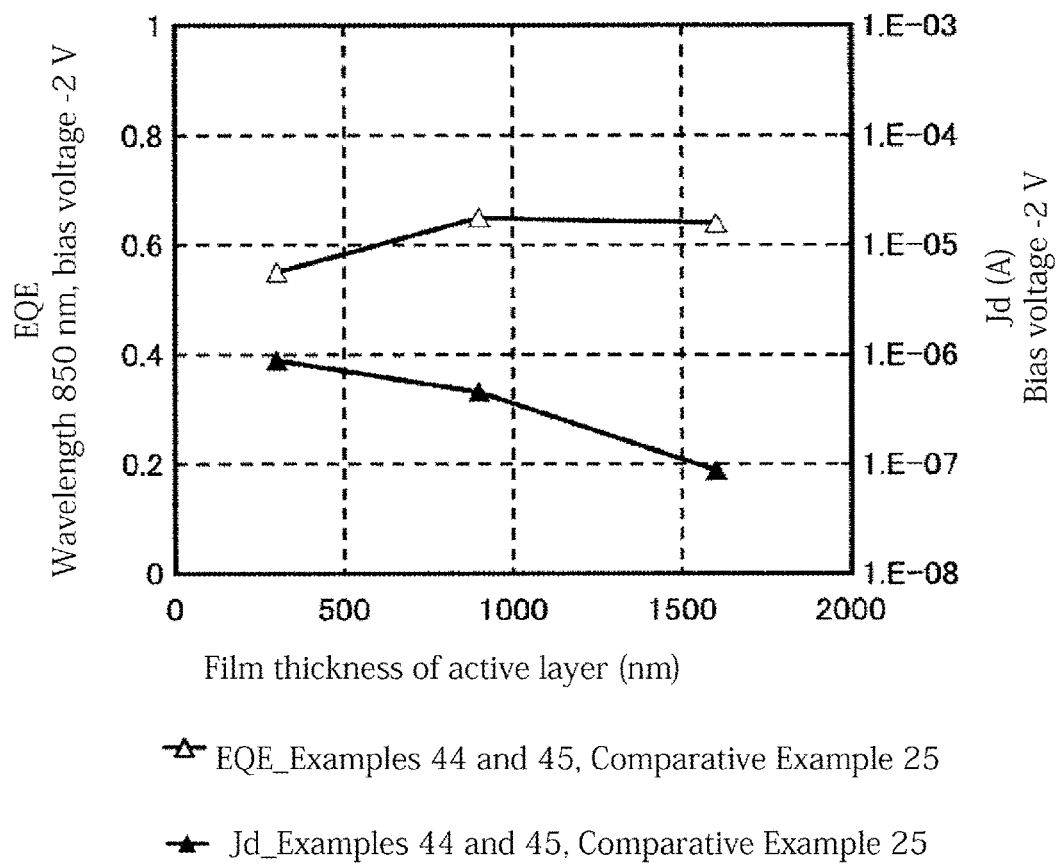
FIG. 23 is a graph illustrating a relationship of a thickness of an active layer of a light detecting element (Examples 44 and 45, Comparative Example 25) produced by using C70PCBM as an n-type semiconductor contained in an active layer and an electron transport layer 2 as an electron transport layer, with EQE and Jd.

A photoelectric conversion element was prepared and measurement values of EQE were obtained in the same manner as in Example 1 except that C70PCBM was used as the n-type semiconductor contained in the active layer, the electron transport layer 2 was used as the electron transport layer, and the thickness of the active layer was set to 300, 900, and 1600 nm. The measurement results of EQE and Jd are indicated in Table 2 and FIG. 23.

Examples 46 and 47, Comparative Example 26: C70PCBM/No Electron Transport Layer

Figure 24:
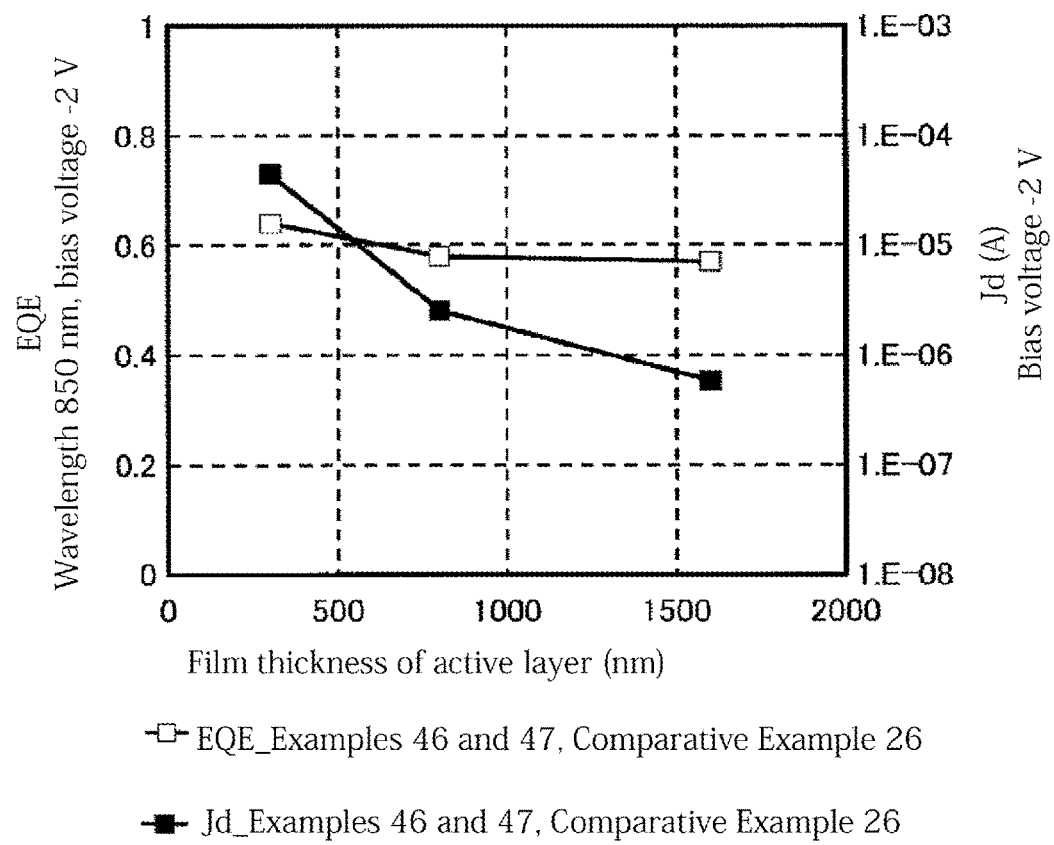
FIG. 24 is a graph illustrating a relationship of a thickness of an active layer of a light detecting element (Examples 46 and 47, Comparative Example 26), produced by using C70IPH as an n-type semiconductor contained in an active layer without an electron transport layer, with EQE and Jd.

A photoelectric conversion element was prepared and measurement values of EQE were obtained in the same manner as in Example 1 except that C70PCBM was used as the n-type semiconductor contained in the active layer, a glass substrate on which an ITO thin film (negative electrode) was formed was prepared, an active layer was directly formed on the surface of the ITO thin film on the surface of the glass substrate without a treatment such as a UV ozone treatment and an electron transport layer, and the thickness of the active layer was set to 300, 800, and 1600 nm. The measurement results of EQE and Jd are indicated in Table 2 and FIG. 24.

Comparative Examples 27 to 29: C70PCBM/Electron Transport Layer 7

Figure 25:
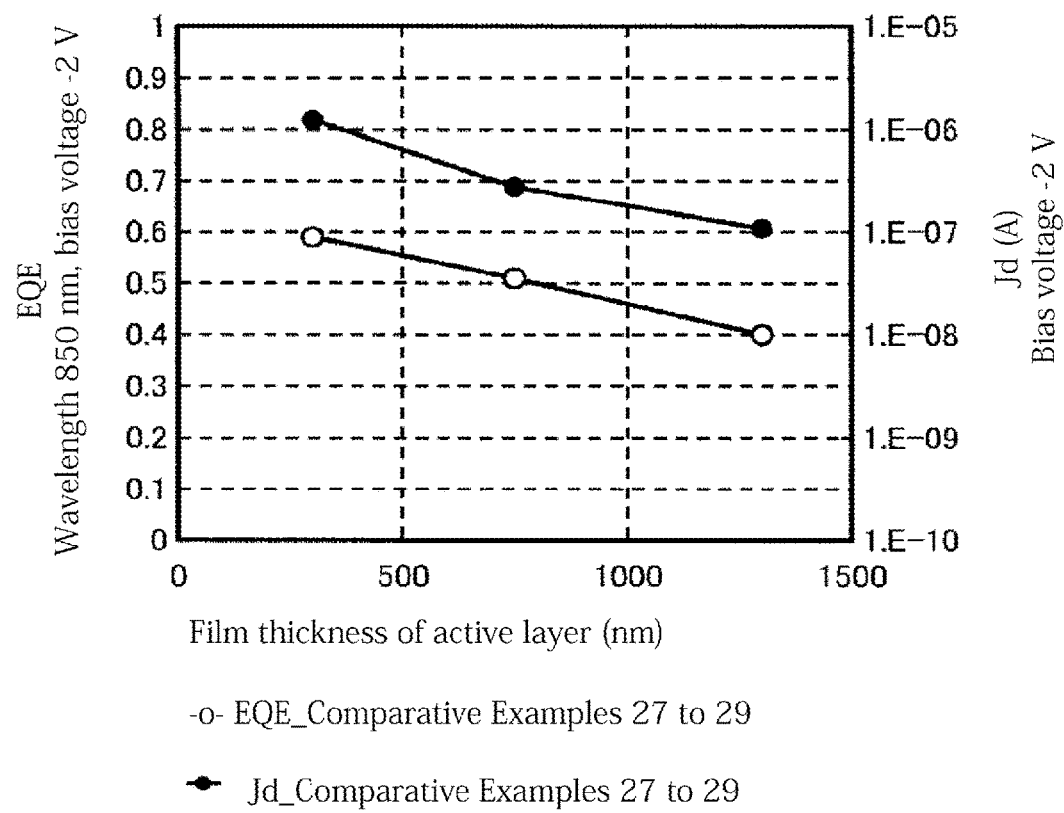
FIG. 25 is a graph illustrating a relationship of a thickness of an active layer of a light detecting element (Comparative Examples 27 to 29) produced by using C70PCBM as an n-type semiconductor contained in an active layer and an electron transport layer 7 as an electron transport layer, with EQE and Jd.

A photoelectric conversion element was prepared and measurement values of EQE were obtained in the same manner as in Example 1 except that C70PCBM was used as the n-type semiconductor contained in the active layer, the electron transport layer 7 was used as the electron transport layer, and the thickness of the active layer was set to 300, 750, and 1300 nm. The measurement results of EQE and Jd are indicated in Table 2 and FIG. 25.

Comparative Examples 2 and 30 to 32: Electron Transport Layer 8

Figure 26:
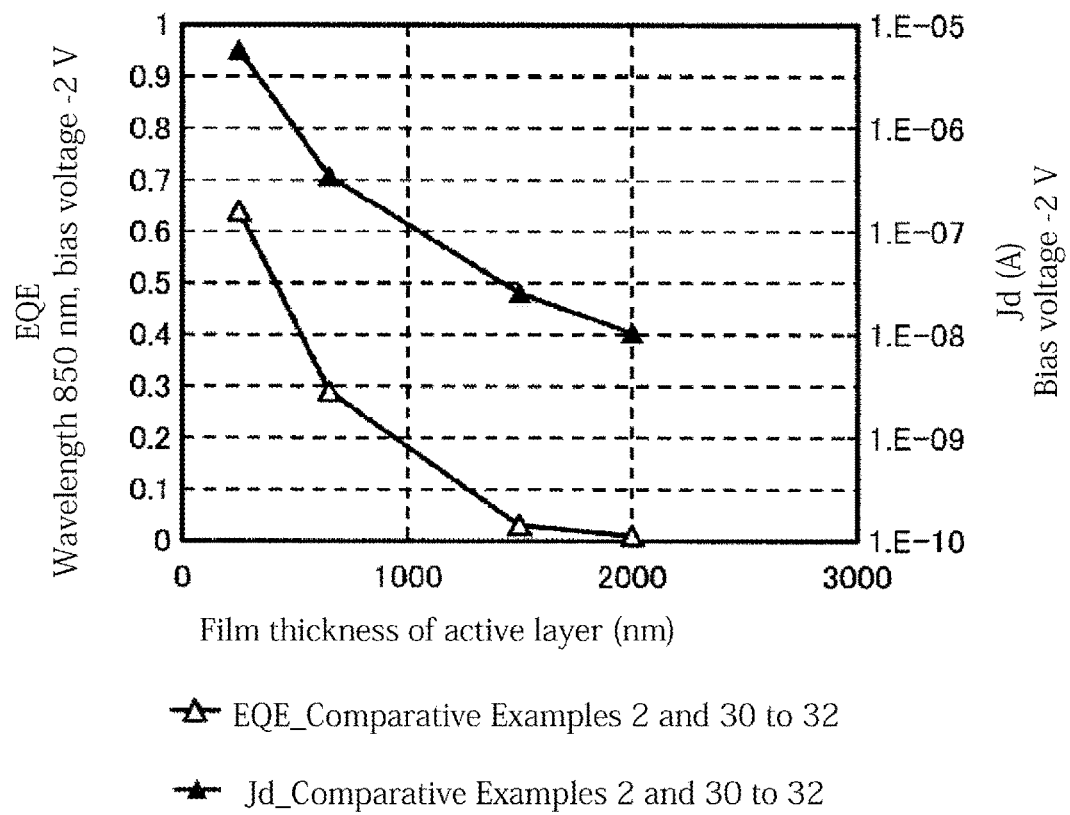
FIG. 26 is a graph illustrating a relationship of a thickness of an active layer of a light detecting element (Comparative Examples 2 and 30 to 32) produced by using C70PCBM as an n-type semiconductor contained in an active layer and an electron transport layer 8 as an electron transport layer, with EQE and Jd.

A photoelectric conversion element was prepared and measurement values of EQE were obtained in the same manner as in Example 1 except that C70PCBM was used as the n-type semiconductor contained in the active layer, the electron transport layer 8 was used as the electron transport layer, and the thickness of the active layer was set to 250, 650, 1500, and 2000 nm. The measurement results of EQE and Jd are indicated in Table 2 and FIG. 26. In the table, LUMO is indicated as an absolute value.

TABLE 2-1

Table 2
Production conditions of photoelectric conversion elements and external quantum efficiency (EQE) and a dark current (Jd) obtained as a result

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Comparative Example 14 | bis C60PCBM | 4.2 | Electron transport layer 7 | 4.2 | 0.0 | 600 | 0.28 | $1.04 \times 10^{-09}$ |
| Example 26 | | | | | | 1000 | 0.29 | $2.61 \times 10^{-10}$ |
| Example 27 | | | | | | 2000 | 0.29 | $1.97 \times 10^{-10}$ |

TABLE 2-1-continued

Table 2
Production conditions of photoelectric conversion elements and
external quantum efficiency (EQE) and a dark current (Jd) obtained as a result

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Comparative Example 15 | | | Electron transport layer 8 | 4.2 | 0.0 | 600 | 0.29 | $6.29 \times 10^{-09}$ |
| Example 28 | | | | | | 1000 | 0.32 | $5.13 \times 10^{-09}$ |
| Example 29 | | | | | | 2000 | 0.31 | $1.85 \times 10^{-09}$ |
| Comparative Example 16 | | | Electron transport layer 1 | 4.4 | 0.2 | 450 | 0.31 | $8.27 \times 10^{-08}$ |
| Example 30 | | | | | | 1300 | 0.31 | $2.39 \times 10^{-08}$ |
| Example 31 | | | | | | 2000 | 0.33 | $7.54 \times 10^{-09}$ |
| Comparative Example 17 | | | Electron transport layer 2 | 4.6 | 0.4 | 340 | 0.32 | $1.20 \times 10^{-07}$ |
| Example 32 | | | | | | 800 | 0.3 | $1.57 \times 10^{-08}$ |
| Example 33 | | | | | | 1500 | 0.34 | $8.36 \times 10^{-09}$ |
| Example 34 | | | | | | 3000 | 0.35 | $6.50 \times 10^{-09}$ |

TABLE 2-2

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Example 35 | C70IPH | 4.3 | Electron transport layer 1 | 4.4 | 0.1 | 800 | 0.55 | $2.71 \times 10^{-08}$ |
| Example 36 | | | | | | 1400 | 0.55 | $1.46 \times 10^{-09}$ |
| Example 37 | | | Electron transport layer 2 | 4.6 | 0.3 | 1000 | 0.62 | $3.18 \times 10^{-08}$ |
| Example 38 | | | | | | 1500 | 0.6 | $4.62 \times 10^{-09}$ |
| Example 39 | | | No Electron transport layer | 4.8 | 0.5 | 800 | 0.64 | $1.51 \times 10^{-07}$ |
| Example 40 | | | | | | 1000 | 0.62 | $2.05 \times 10^{-08}$ |
| Example 41 | | | | | | 1500 | 0.6 | $1.01 \times 10^{-08}$ |
| Comparative Example 18 | | | Electron transport layer 7 | 4.2 | −0.1 | 500 | 0.48 | $2.86 \times 10^{-09}$ |
| Comparative Example 19 | | | | | | 850 | 0.17 | $3.45 \times 10^{-10}$ |
| Comparative Example 20 | | | | | | 1100 | 0.11 | $1.69 \times 10^{-10}$ |
| Comparative Example 21 | | | Electron transport layer 8 | 4.2 | −0.1 | 250 | 0.56 | $2.45 \times 10^{-07}$ |
| Comparative Example 22 | | | | | | 750 | 0.51 | $4.56 \times 10^{-08}$ |
| Comparative Example 23 | | | | | | 1200 | 0.11 | $7.51 \times 10^{-09}$ |

TABLE 2-3

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Comparative Example 24 | C70PCBM | 4.3 | Electron transport layer 1 | 4.4 | 0.1 | 300 | 0.57 | $8.98 \times 10^{-07}$ |
| Example 42 | | | | | | 800 | 0.59 | $1.55 \times 10^{-07}$ |
| Example 43 | | | | | | 1600 | 0.55 | $7.45 \times 10^{-08}$ |
| Comparative Example 25 | | | Electron transport layer 2 | 4.6 | 0.3 | 300 | 0.55 | $8.86 \times 10^{-07}$ |
| Example 44 | | | | | | 900 | 0.65 | $4.56 \times 10^{-07}$ |
| Example 45 | | | | | | 1600 | 0.64 | $8.79 \times 10^{-08}$ |
| Comparative Example 26 | | | No Electron transport layer | 4.8 | 0.5 | 300 | 0.64 | $4.46 \times 10^{-05}$ |
| Example 46 | | | | | | 800 | 0.58 | $2.56 \times 10^{-06}$ |
| Example 47 | | | | | | 1600 | 0.57 | $5.89 \times 10^{-07}$ |
| Comparative Example 27 | | | Electron transport layer 7 | 4.2 | −0.1 | 300 | 0.59 | $1.24 \times 10^{-06}$ |

TABLE 2-3-continued

| | n-type semiconductor material | LUMO (eV) | Electron transport layer | Work function (eV) | Value obtained by subtracting LUMO* from work function (eV) | Thickness of active layer (nm) | EQE_wavelength 850 nm, Applied voltage −2 V | Dark current Jd_Applied voltage −2 V (A) |
|---|---|---|---|---|---|---|---|---|
| Comparative Example 28 | | | | | | 750 | 0.51 | $2.77 \times 10^{-07}$ |
| Comparative Example 29 | | | | | | 1300 | 0.4 | $1.08 \times 10^{-07}$ |
| Comparative Example 30 | | | Electron transport layer 8 | 4.2 | −0.1 | 250 | 0.64 | $5.67 \times 10^{-06}$ |
| Comparative Example 31 | | | | | | 650 | 0.29 | $3.45 \times 10^{-07}$ |
| Comparative Example 32 | | | | | | 1500 | 0.03 | $2.51 \times 10^{-08}$ |
| Comparative Example 2 | | | | | | 2000 | 0.01 | $1.04 \times 10^{-08}$ |

Various formation conditions of the electron transport layer (coating liquid for forming an electron transport layer, thickness of the electron transport layer, surface treatment) and the work functions obtained as a result, which were used in examples and comparative examples were summarized in Table 3.

TABLE 3

Various forming conditions of electron transport layer and work function obtained as a result

| Electron transport layer | Coating liquid for forming an electron transport layer | Thickness of electron transport layer (nm) | Surface treatment | Work function (eV) |
|---|---|---|---|---|
| Electron transport layer 1 | Zinc oxide/isopropanol dispersion liquid (available from Avantama, trade name N-10) | 30 | Ozone UV treatment before forming electron transport layer | 4.4 |
| Electron transport layer 2 | Zinc oxide/water dispersion liquid (available from Infinity PV, trade name Doped Zno ink (water)) | 30 | Ozone UV treatment before forming electron transport layer | 4.6 |
| Electron transport layer 3 | Aluminum-doped zinc oxide/isopropanol dispersion liquid (available from Avantama, trade name N-10X) | 30 | Ozone UV treatment before forming electron transport layer | 4.4 |
| Electron transport layer 4 | Titanium (IV) isopropoxide/isopropanol solution (available from Aldrich) | 30 | Ozone UV treatment before forming electron transport layer | 4.7 |
| Electron transport layer 5 | Solution of zinc oxide/isopropanol dispersion liquid (available from TAYCA Corporation, trade name: HTD-711Z) diluted 1/10 times with 3-pentanol | 30 | Ozone UV treatment before forming electron transport layer and Ozone UV treatment after forming electron transport layer (for 2 minutes) | 4.6 |
| Electron transport layer 6 | Solution obtained by diluting an aqueous solution of polyethyleneimine ethoxylate (PEIE) (available from Aldrich, trade name polyethyleneimine, 80% ethoxylated solution, weight average molecular weight 110000) 1/100 times with water | 5 | Oxygen plasma treatment before forming electron transport layer (150 W, for 15 minutes) | 4.7 |
| Electron transport layer 7 | Solution obtained by diluting an aqueous solution of polyethyleneimine ethoxylate (PEIE) (available from Aldrich, trade name polyethyleneimine, 80% ethoxylated solution, weight average molecular weight 110000) 1/100 times with water | 5 | Ozone UV treatment before forming electron transport layer | 4.2 |
| Electron transport layer 8 | Solution of zinc oxide/isopropanol dispersion liquid (available from TAYCA Corporation, trade name: HTD-711Z) diluted 1/10 times with 3-pentanol | 30 | Ozone UV treatment before forming electron transport layer | 4.2 |
| No Electron transport layer | No | — | No surface treatment | 4.8 |

\<Evaluation\>

Figure 11:
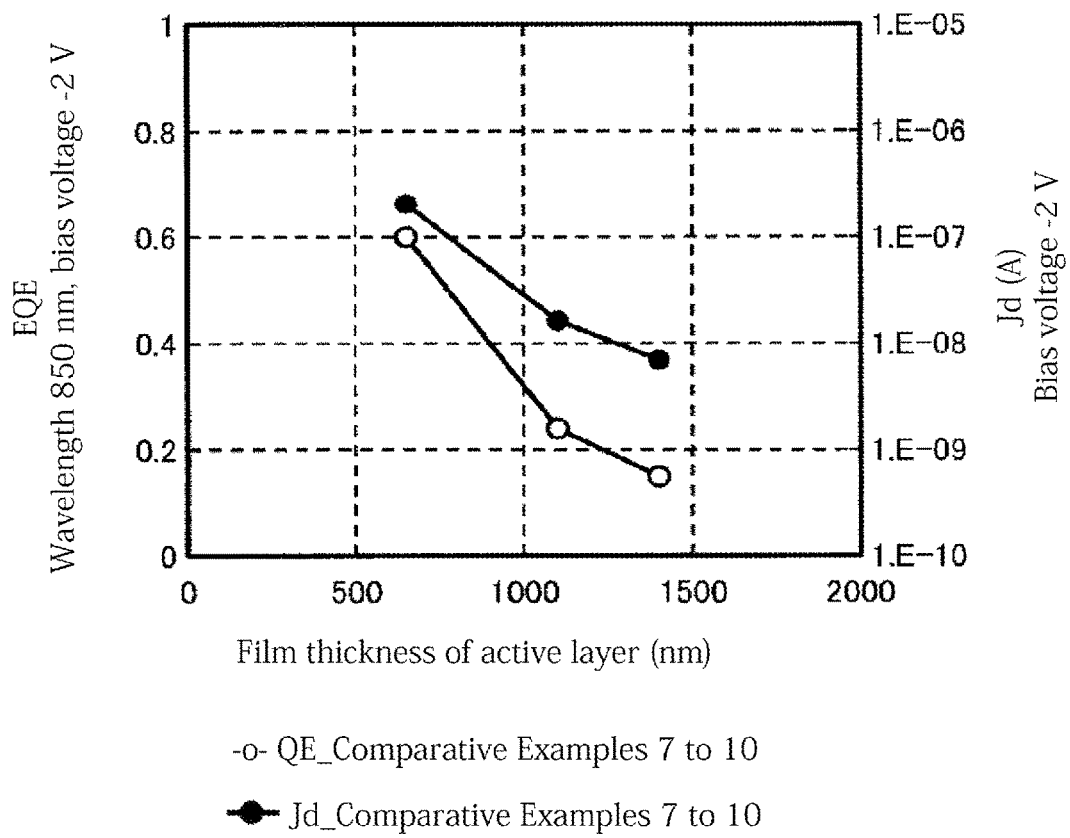
FIG. 11 is a graph illustrating a relationship of a thickness of an active layer of a light detecting element (Comparative Examples 7 to 10) produced by using C60PCBM as an n-type semiconductor contained in an active layer and an electron transport layer 7 as an electron transport layer, with EQE and Jd.

FIGS. 4 to 26 illustrate the EQE and dark current (Jd) for the thickness of the active layer. In FIG. 11 (Comparative Examples 7 to 10), FIG. 12 (Comparative Examples 11 to 13), FIG. 21 (Comparative Examples 21 to 23), FIG. 25 (Comparative Examples 27 to 29), and FIG. 26 (Comparative Examples 2 and 30 to 32), as the thickness of the active layer was increased as in the related art, the dark current and the EQE were decreased. However, in the photoelectric conversion element in which the value obtained by subtracting the absolute value of the LUMO level of the n-type semiconductor from the work function of the negative electrode type surface is 0 or more, the EQE value was maintained at a high value while the dark current became sufficiently low as the thickness of the active layer was increased, and the EQE value was maintained even when the thickness of the active layer was 800 nm or more. That is, it was described in Examples and Comparative Examples that high sensitivity characteristics can be obtained by using the technique of the present invention.

DESCRIPTION OF REFERENCE SIGNS

1 Image detector
2 Display device
10 Photoelectric conversion element
11, 210 Support substrate
12 Negative electrode
13 Electron transport layer
14 Active layer
15 Hole transport layer
16 Positive electrode
17, 240 Sealing substrate
20 CMOS transistor substrate
30 Interlayer insulating film
32 Interlayer wiring portion
40 Sealing layer
50 Color filter
100 Fingerprint detector
200 Display panel unit
200a Display region
220 Organic EL element
230 Touch sensor panel

The invention claimed is:

1. A light detecting element comprising:
   a positive electrode;
   a negative electrode; and
   an active layer provided between the positive electrode and the negative electrode and containing an electron-donating compound and an electron-accepting compound,
   wherein a thickness of the active layer is 800 nm or more, and
   a value obtained by subtracting an absolute value of LUMO of the electron-accepting compound from a work function of a surface of the active layer facing the negative electrode is 0.0 to 0.3 eV.

2. The light detecting element according to claim 1, wherein the electron-accepting compound has an absolute value of LUMO of 2.0 to 10.0 eV.

3. The light detecting element according to claim 1, wherein the electron-accepting compound is a fullerene derivative.

4. The light detecting element according to claim 3, wherein the fullerene derivative is C60PCBM, bisC60PCBM, C70IPH, or C70PCBM.

5. The light detecting element according to claim 1, wherein the work function of the surface of the active layer facing the negative electrode 2.0 to 10.0 eV.

6. The light detecting element according to claim 1, wherein an electron transport layer is included between the negative electrode and the active layer, and the surface of the active layer facing the negative electrode is a surface of the electron transport layer.

7. The light detecting element according to claim 6, wherein the electron transport layer comprises a metal oxide, a metal hydroxide, or a metal alkoxide.

8. The light detecting element according to claim 7, wherein the electron transport layer comprises the metal oxide containing zinc or titanium, the metal hydroxide containing zinc or titanium, or the metal alkoxide containing zinc or titanium.

9. The light detecting element according to claim 6, wherein the electron transport layer contains a compound having an alkylene structure.

10. The light detecting element according to claim 9, wherein the compound having an alkylene structure is polyalkyleneimine or a derivative thereof.

11. The light detecting element according to claim 10, wherein the polyalkyleneimine or the derivative thereof is polyethyleneimine or a derivative thereof.

12. The light detecting element according to claim 1, wherein the negative electrode and the active layer are in direct contact with each other, and the surface of the active layer facing the negative electrode is a surface of the negative electrode.

13. An image sensor including the light detecting element according to claim 1.

14. A fingerprint authenticating device including a fingerprint detector including the light detecting element according to claim 1.

* * * * *